(12) United States Patent  
Yamazaki et al.

(10) Patent No.: US 8,980,733 B2
(45) Date of Patent: Mar. 17, 2015

(54) SEMICONDUCTOR DEVICE AND MANUFACTURING METHOD THEREOF

(75) Inventors: Shunpei Yamazaki, Tokyo (JP); Yukie Suzuki, Kanagawa (JP); Yasuyuki Arai, Kanagawa (JP); Yoshitaka Moriya, Kanagawa (JP); Kazuko Ikeda, Kanagawa (JP); Yoshifumi Tanada, Kanagawa (JP); Shuhei Takahashi, Aichi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1141 days.

(21) Appl. No.: 12/904,181

(22) Filed: Oct. 14, 2010

(65) Prior Publication Data
US 2011/0027980 A1    Feb. 3, 2011

Related U.S. Application Data

(62) Division of application No. 11/790,072, filed on Apr. 23, 2007, now Pat. No. 7,821,002.

(30) Foreign Application Priority Data

Apr. 28, 2006  (JP) .................................. 2006-126670
Sep. 20, 2006  (JP) .................................. 2006-254205

(51) Int. Cl.
*H01L 21/02*  (2006.01)
*H01L 29/423*  (2006.01)
(Continued)

(52) U.S. Cl.
CPC .... *H01L 29/42368* (2013.01); *H01L 21/28273* (2013.01); *H01L 21/28282* (2013.01);
(Continued)

(58) Field of Classification Search
CPC ........ H01L 21/768; H01L 21/00; H01L 21/02
USPC ......... 438/591, 149, 153, 154, 197, 311, 479, 438/517
See application file for complete search history.

(56) References Cited

U.S. PATENT DOCUMENTS 4,242,156 A   12/1980  Peel
5,470,762 A   11/1995  Codama et al.
(Continued)

FOREIGN PATENT DOCUMENTS

CN      001487348 A    4/2004
DE      197 36 204 A1  2/1998
(Continued)

OTHER PUBLICATIONS

Korean Office Action (Application No. 2007-0041136; KR09629/9949) Dated Aug. 27, 2013.
(Continued)

*Primary Examiner* — Chuong A Luu
(74) *Attorney, Agent, or Firm* — Nixon Peabody LLP; Jeffrey L. Costellia

(57) ABSTRACT

The semiconductor device has a semiconductor layer, a gate electrode which covers an end portion of the semiconductor layer, and an insulating layer for insulating the semiconductor layer and the gate electrode. The film thickness of the insulating layer which insulates a region where an end portion of the semiconductor layer and the gate electrode overlap each other is thicker than the film thickness of the insulating layer which covers the central portion of the semiconductor layer.

6 Claims, 42 Drawing Sheets

(51) Int. Cl.
   *H01L 21/28*    (2006.01)
   *H01L 27/12*    (2006.01)
   *H01L 29/66*    (2006.01)
   *H01L 29/786*   (2006.01)
   *H01L 29/788*   (2006.01)
   *H01L 21/84*    (2006.01)
   *H01L 27/13*    (2006.01)

(52) U.S. Cl.
   CPC ........... *H01L 27/12* (2013.01); *H01L 27/1214* (2013.01); *H01L 29/42384* (2013.01); *H01L 29/66757* (2013.01); *H01L 29/66825* (2013.01); *H01L 29/66833* (2013.01); *H01L 29/78609* (2013.01); *H01L 29/78618* (2013.01); *H01L 29/7881* (2013.01); *H01L 21/84* (2013.01); *H01L 27/1203* (2013.01); *H01L 27/13* (2013.01)
   USPC ........... 438/591; 438/149; 438/153; 438/154; 438/197; 438/479; 438/517

(56) References Cited

U.S. PATENT DOCUMENTS

| | | | |
|---|---|---|---|
| 5,656,825 | A | 8/1997 | Kusumoto et al. |
| 5,693,959 | A | 12/1997 | Inoue et al. |
| 5,728,259 | A | 3/1998 | Suzawa et al. |
| 5,747,828 | A | 5/1998 | Hata et al. |
| 5,757,030 | A | 5/1998 | Codama et al. |
| 5,801,081 | A | 9/1998 | Warashina et al. |
| 5,835,172 | A | 11/1998 | Yeo et al. |
| 5,940,690 | A | 8/1999 | Kusumoto et al. |
| 6,010,922 | A | 1/2000 | Hata et al. |
| 6,013,929 | A | 1/2000 | Ohtani |
| 6,124,153 | A | 9/2000 | Lee et al. |
| 6,426,245 | B1 | 7/2002 | Kawasaki et al. |
| 6,498,369 | B1 | 12/2002 | Yamazaki et al. |
| 6,579,589 | B1* | 6/2003 | Obermeier et al. .......... 428/64.1 |
| 6,744,008 | B1 | 6/2004 | Kasahara et al. |
| 6,882,016 | B2 | 4/2005 | Takenaka |
| 7,038,283 | B2 | 5/2006 | Yanai et al. |
| 7,157,358 | B2 | 1/2007 | Hall et al. |
| 7,164,171 | B2 | 1/2007 | Yamazaki et al. |
| 7,226,874 | B2 | 6/2007 | Matsuyama et al. |
| 7,399,662 | B2 | 7/2008 | Yanai et al. |
| 2002/0055209 | A1 | 5/2002 | Kusumoto et al. |
| 2003/0045118 | A1* | 3/2003 | Wu et al. ...................... 438/733 |
| 2004/0113214 | A1* | 6/2004 | Takenaka ...................... 257/411 |
| 2004/0164353 | A1 | 8/2004 | Iwamatsu et al. |
| 2004/0206956 | A1* | 10/2004 | Yanai et al. .................... 257/59 |
| 2005/0012151 | A1 | 1/2005 | Yamaguchi et al. |
| 2005/0062129 | A1 | 3/2005 | Komatsubara |
| 2005/0116305 | A1 | 6/2005 | Hwang et al. |
| 2005/0282308 | A1 | 12/2005 | Uhlig et al. |
| 2006/0049449 | A1 | 3/2006 | Iino et al. |
| 2007/0024800 | A1 | 2/2007 | Ohmi et al. |
| 2008/0032511 | A1* | 2/2008 | Kabe et al. ...................... 438/771 |
| 2009/0053903 | A1 | 2/2009 | Kobayashi et al. |
| 2010/0184289 | A1 | 7/2010 | Ohmi et al. |

FOREIGN PATENT DOCUMENTS

| | | |
|---|---|---|
| EP | 0 738 012 A2 | 10/1996 |
| EP | 1 045 447 A2 | 10/2000 |
| EP | 1 505 641 A1 | 2/2005 |
| EP | 1651018 A | 4/2006 |
| EP | 1 786 030 A1 | 5/2007 |
| JP | 06-132303 A | 5/1994 |
| JP | 07-335906 | 12/1995 |
| JP | 08-125195 | 5/1996 |
| JP | 08-153699 | 6/1996 |
| JP | 2003-045892 A | 2/2003 |
| JP | 2003-188387 | 7/2003 |
| JP | 2005-167207 | 6/2005 |
| JP | 2005-183774 | 7/2005 |
| KR | 10-0204322 B | 7/1999 |
| WO | WO-03/096403 A1 | 11/2003 |
| WO | WO-2006/025363 A1 | 3/2006 |

OTHER PUBLICATIONS

Herbst.D et al., "Island-Edge Effects of Transistor Fabricated in Large-Area Laser Micro-Zone Crystallized Si on Insulator", IEEE Electron Device Letters, Aug. 1, 1983, vol. EDL-4, No. 8, pp. 280-282.

European Search Report (Application No. 10010619.4; EP09629/9949D1) Dated Jun. 29, 2011.

Search Report (Application No. 07007815.9; EP9629/9949; Dated: Jul. 23, 2007).

Korean Office Action (Application No. 2013-0127820; KR09629/9949D1) Dated Nov. 20, 2013.

Chinese Office Action (Application No. 201210162478.5) Dated Aug. 21, 2014.

* cited by examiner

FIG. 19A "0" writing
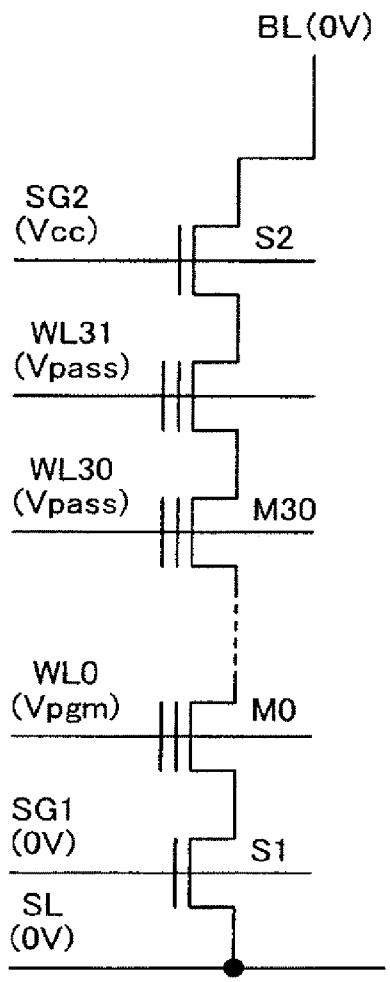
FIG. 19B "1" writing
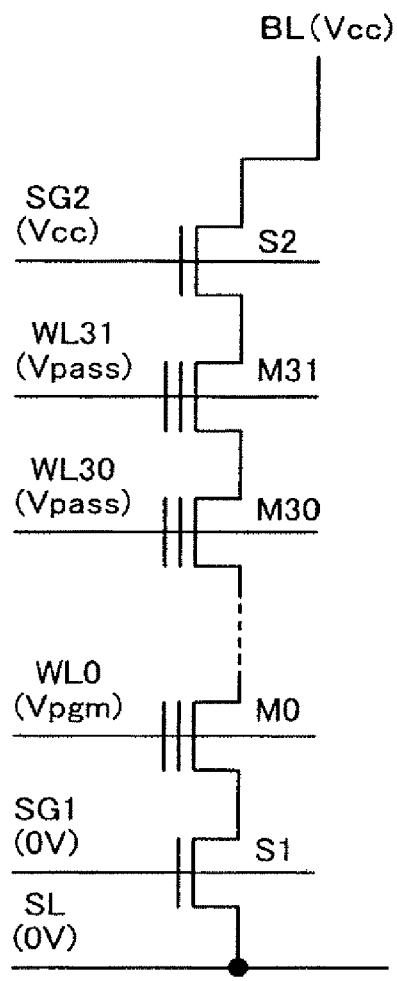

FIG. 20A erasing
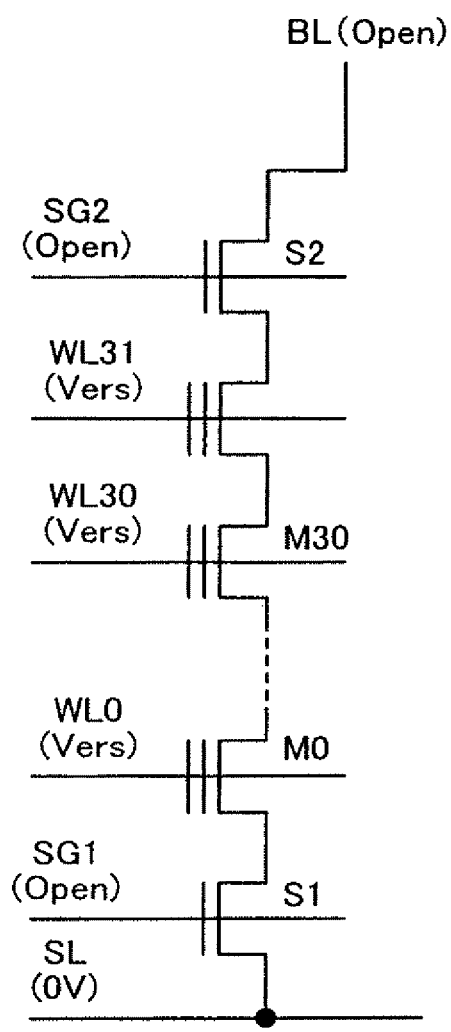
FIG. 20B reading
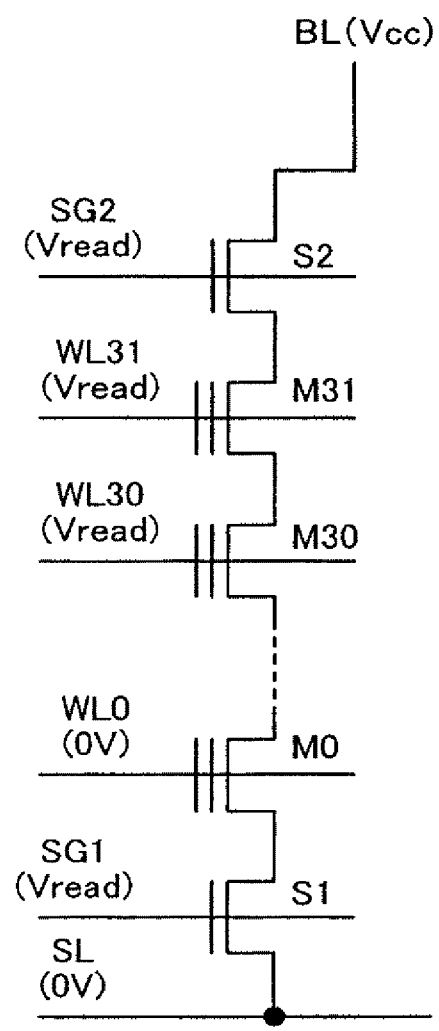

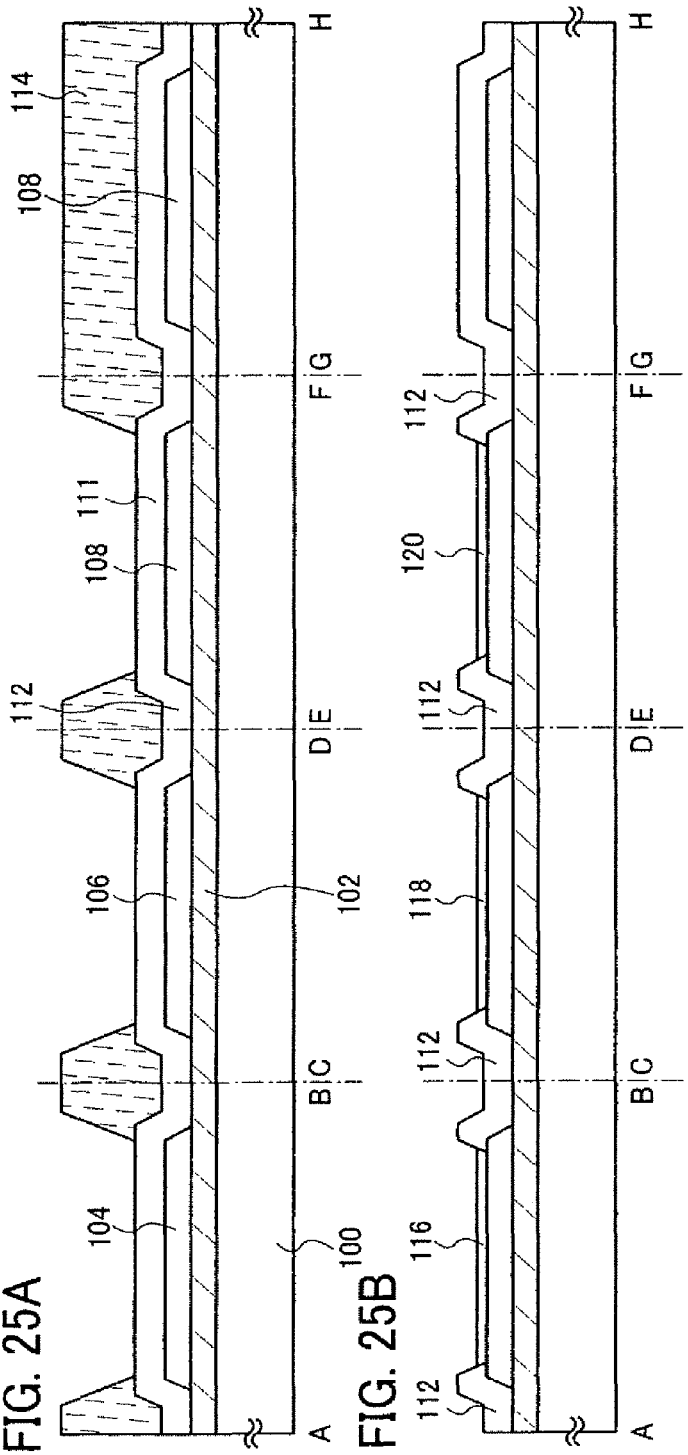

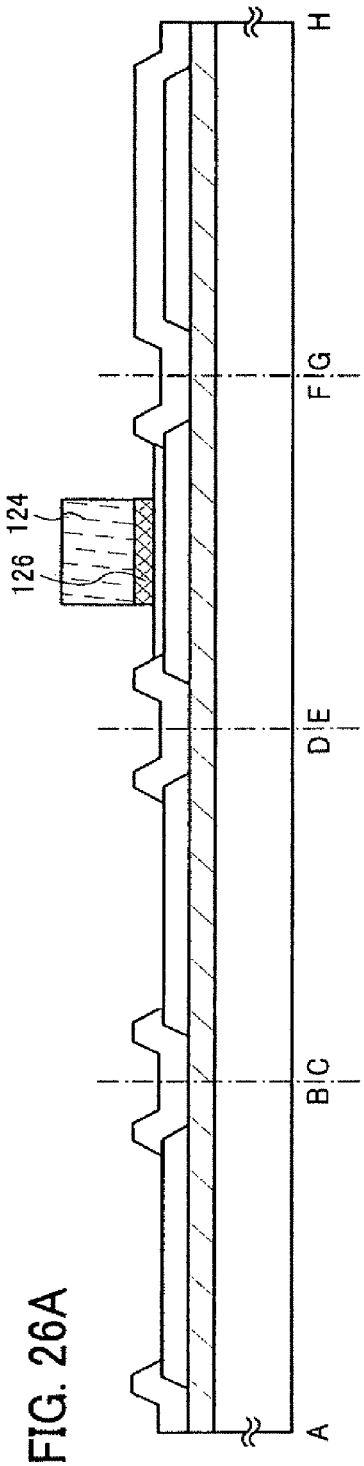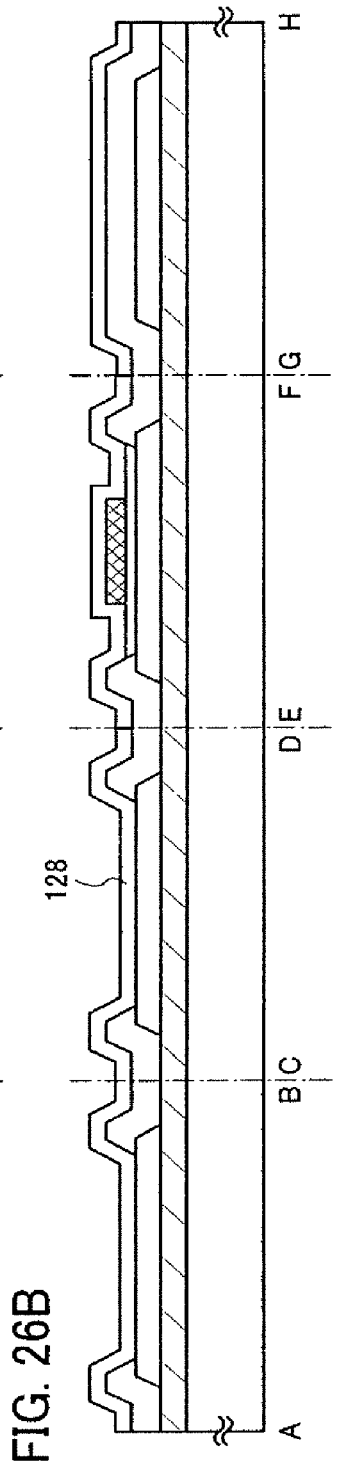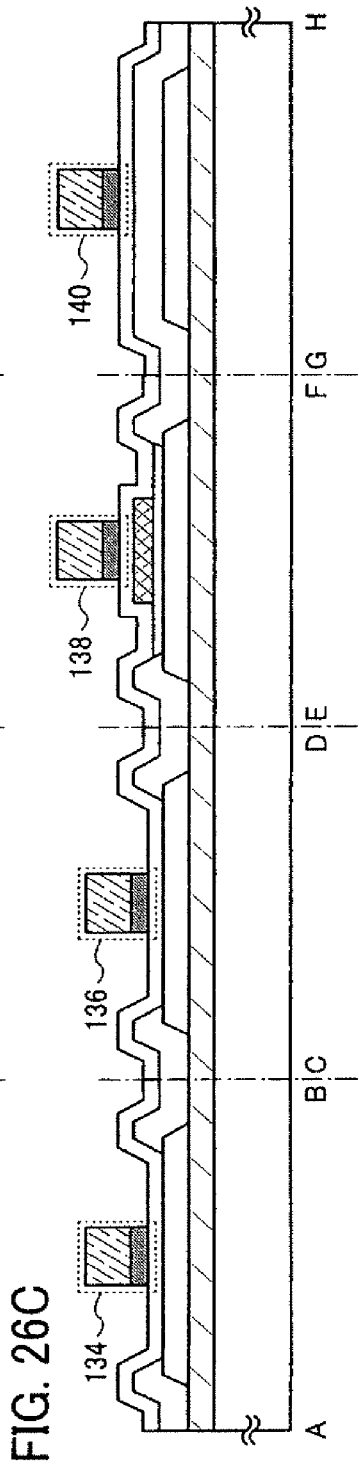

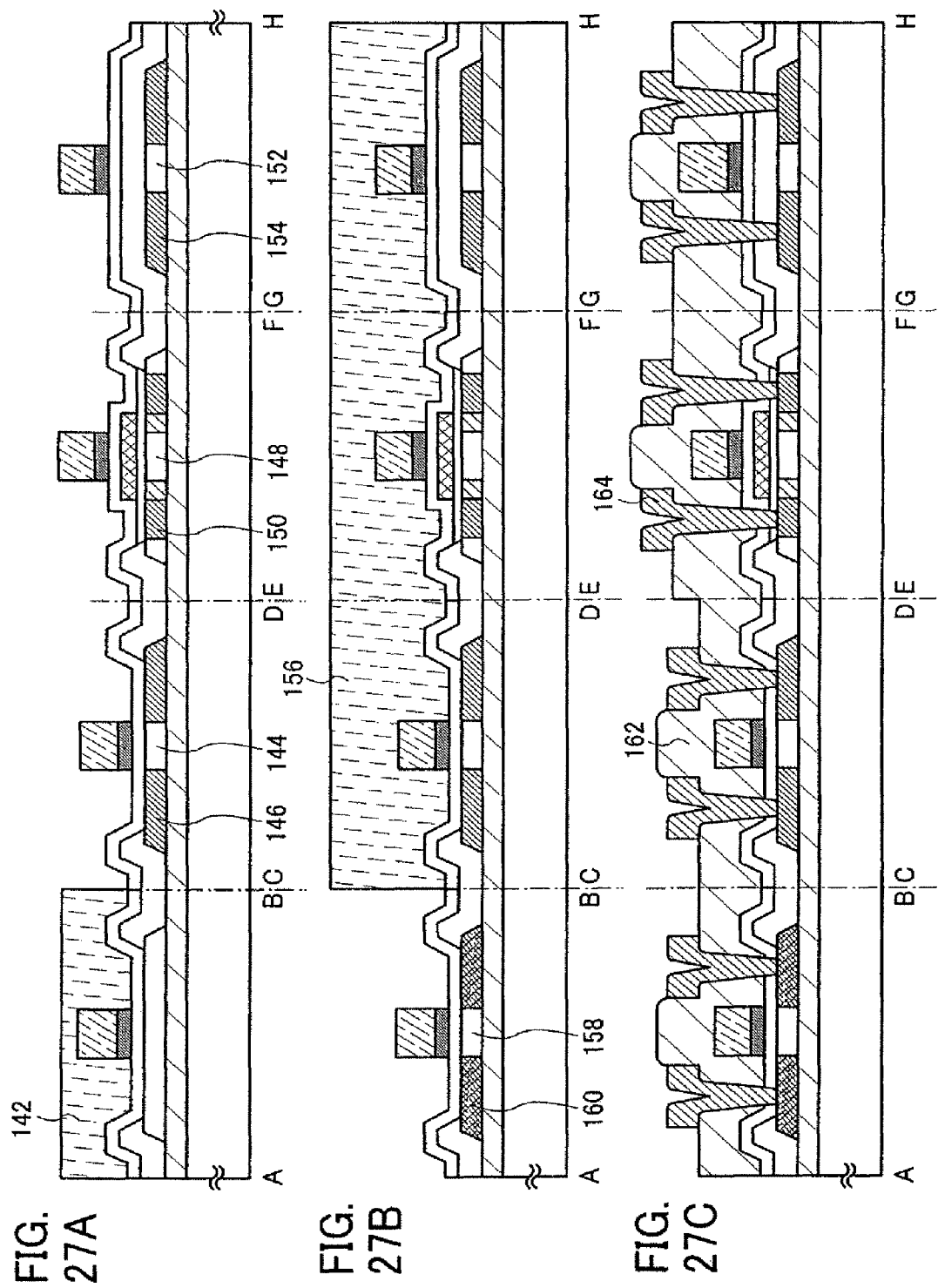

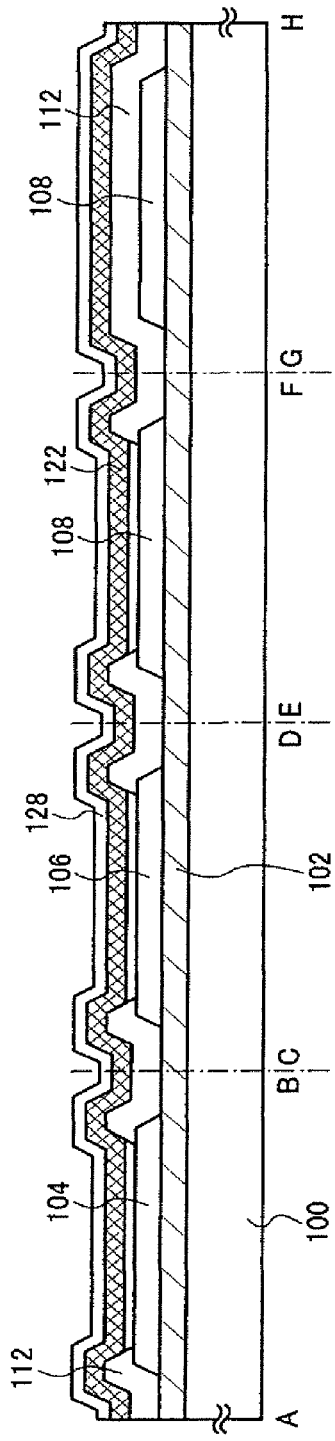
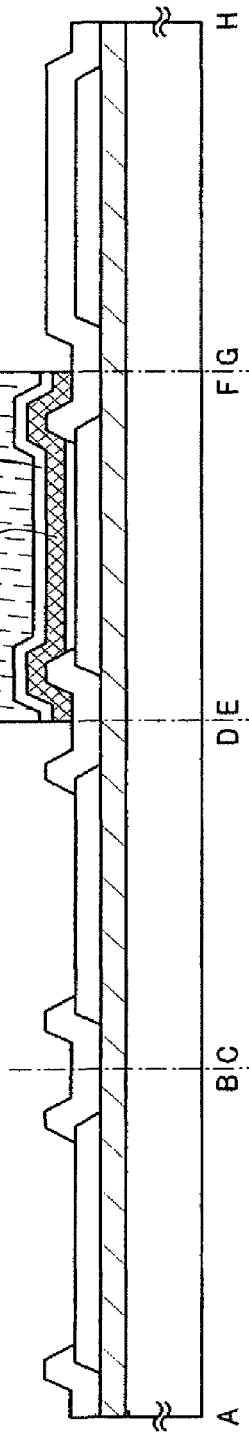
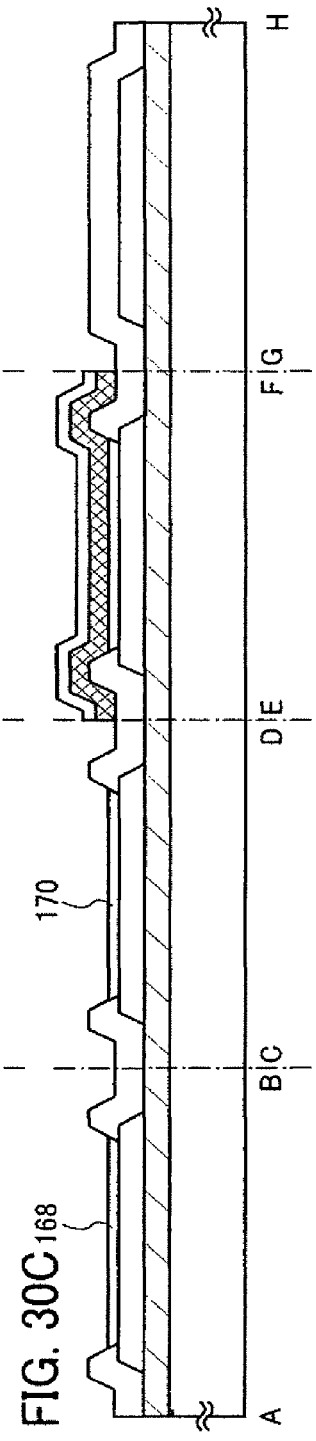
FIG. 30A
FIG. 30B
FIG. 30C

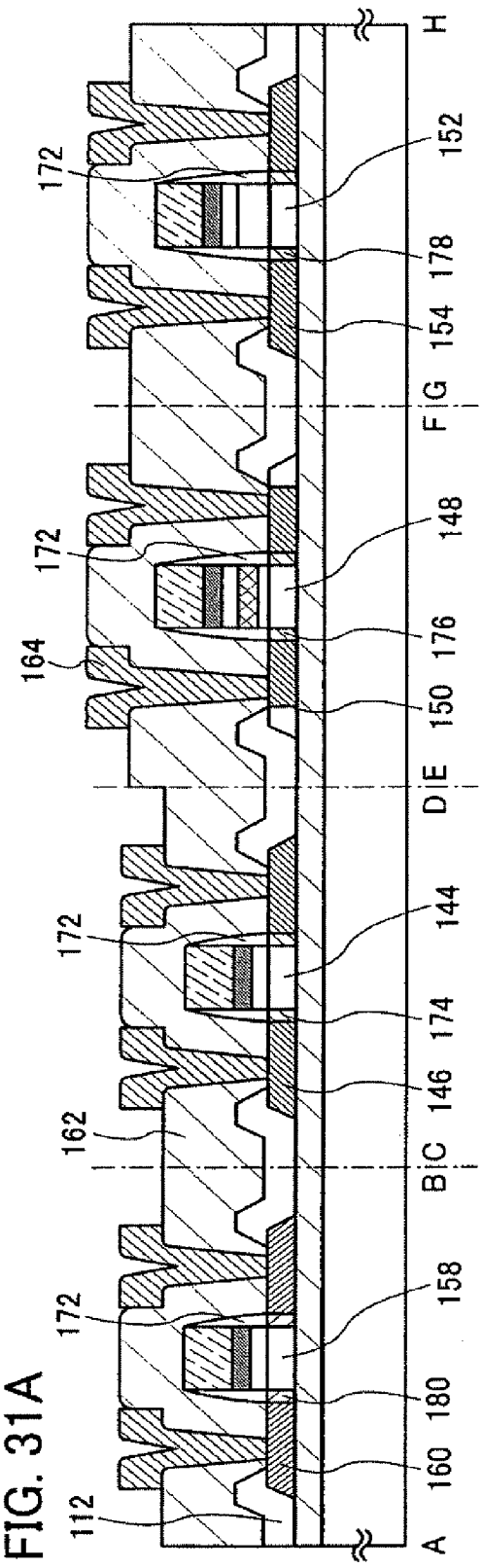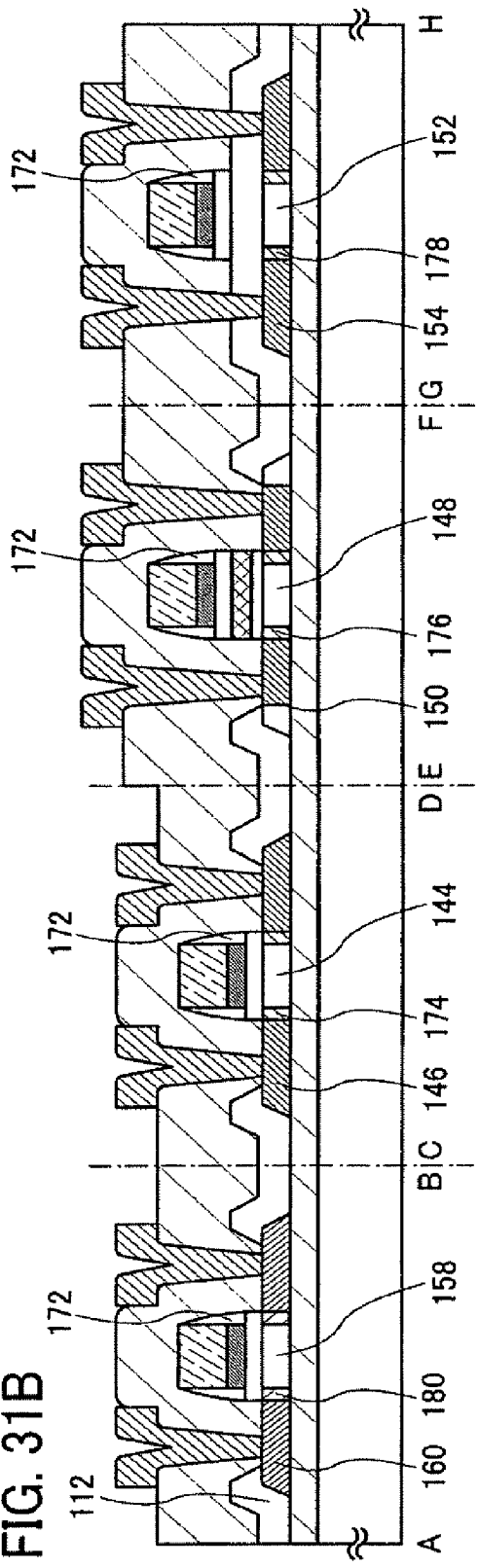

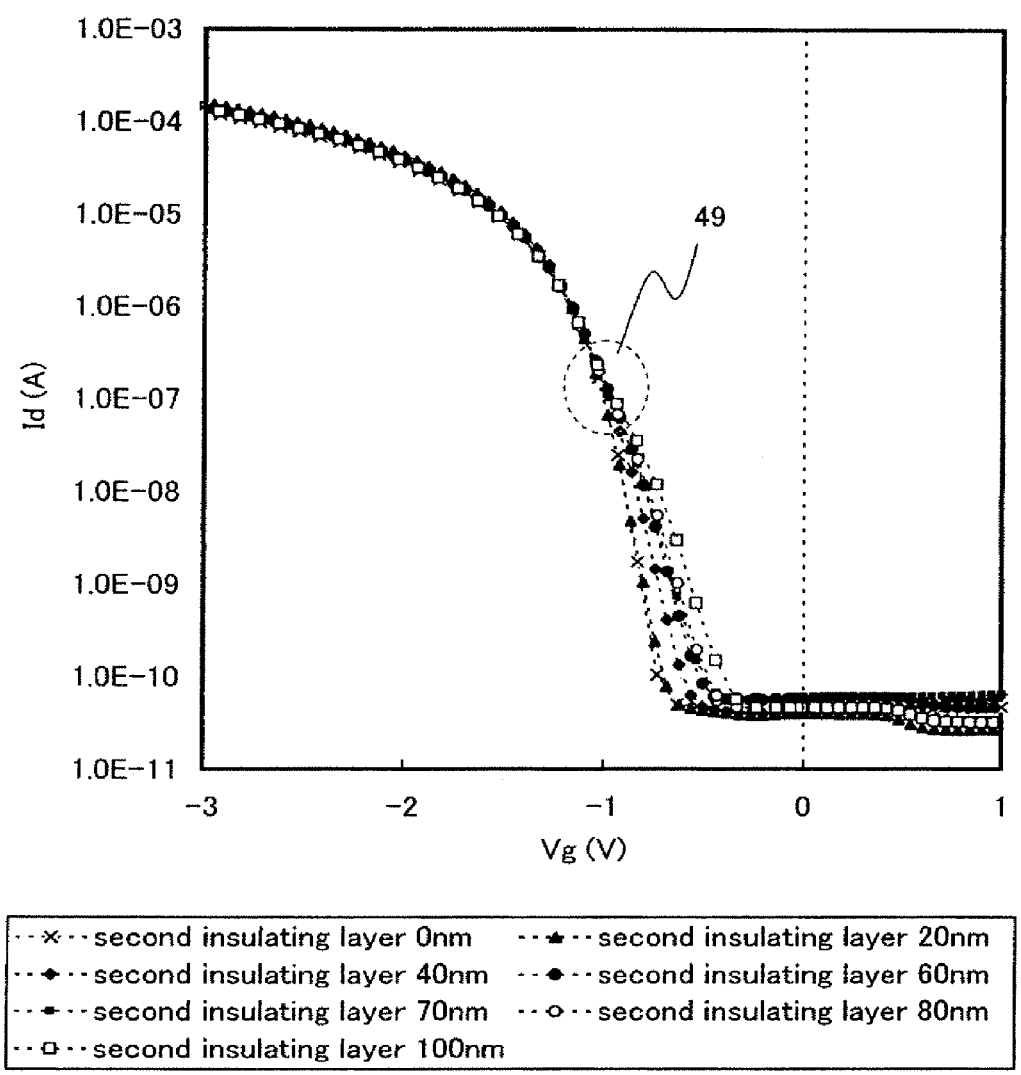

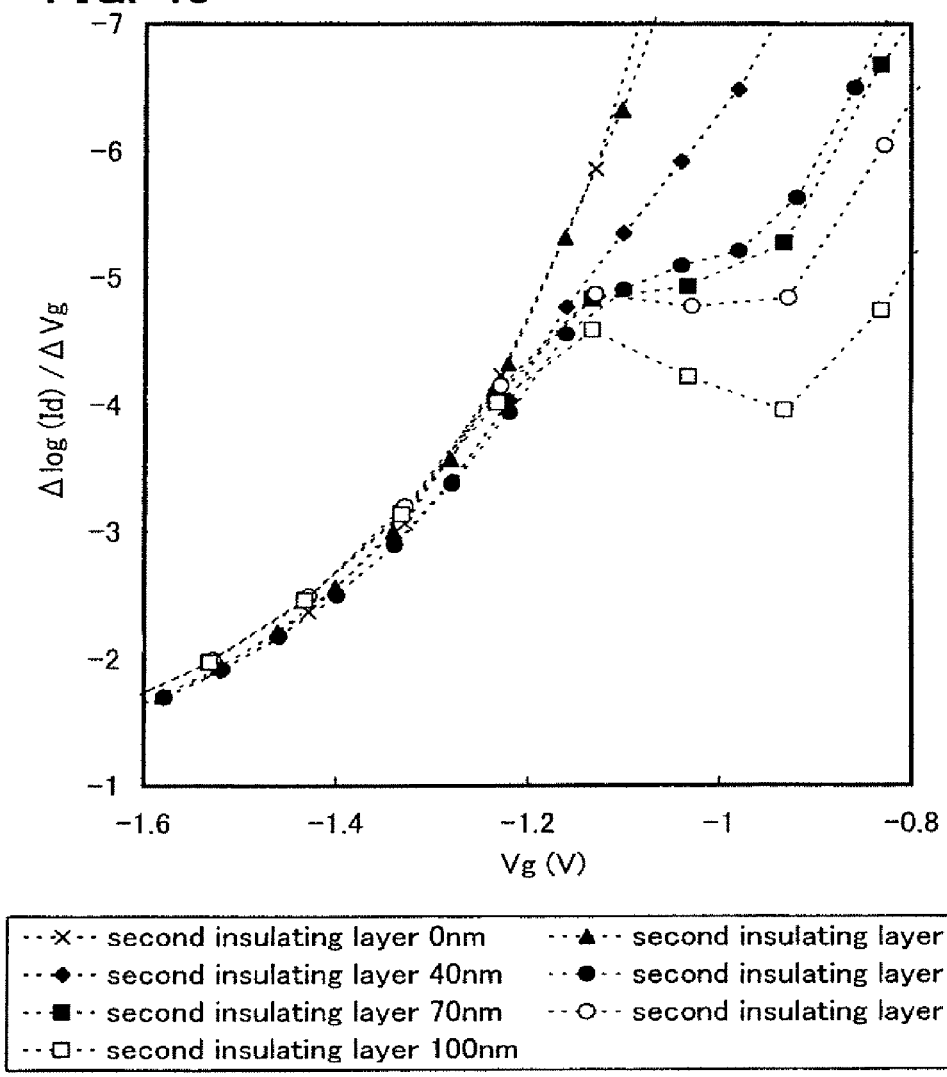

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. More specifically, the present invention relates to a semiconductor device in which a semiconductor layer is separated for different semiconductor elements, and a manufacturing method thereof.

2. Description of the Related Art

As a typical example of a semiconductor element in which a semiconductor layer is separated, a top view and cross-sectional views of a common thin film transistor are shown in FIGS. 24A to 24D. FIG. 24A is a top view of the thin film transistor, FIG. 24B is a cross-sectional view taken along a line A1-B1 in FIG. 24A, FIG. 24C is a cross-sectional view taken along a line A2-B2 in FIG. 24A, and FIG. 24D is an enlarged view of an end portion 25 of a semiconductor layer 32 in FIG. 24C. As shown in FIGS. 24B to 24D, in the thin film transistor, an insulating layer 31 functioning as a base film is formed over a substrate 30; the semiconductor layer 32, which includes a channel formation region 32a and impurity regions 32b and 32c each functioning as a source region or drain region, is formed over the insulating layer 31; an insulating layer 33 functioning as a gate insulating film is formed over the semiconductor layer 32 and the insulating layer 31; and a conductive layer 34 functioning as a gate electrode is formed over the insulating layer 33.

In a manufacturing process of the thin film transistor shown in FIGS. 24A to 24D, in the case where the insulating layer 33 functioning as a gate insulating film is formed over the semiconductor layer 32 which is selectively etched, coverage of the insulating layer 33 decreases in the end portion 25 of the semiconductor layer 32. In a portion where the film thickness of the insulating layer 33 is thin, the electric field intensity of a gate voltage increases and stress for the gate voltage increases, which adversely affects the withstand voltage and reliability of the thin film transistor.

In addition, stress of the substrate and each thin film concentrates on the end portion 25 of the semiconductor layer 32, which causes a problem in that the element characteristics fluctuate.

As a method for improving the decrease in coverage of the gate insulating film caused by unevenness of the end portion of the semiconductor layer 32, a method in which an end portion of an active layer is tapered is used (Patent Document 1: Japanese Published Patent Application No. 2005-167207)

On the other hand, in a thin film transistor that constitutes a circuit which needs to operate at a high speed, it is preferable that the channel length be short and the film thickness of the gate insulating film be thin. Therefore, the film thickness of the gate insulating film is as thin as several tens of nanometers.

SUMMARY OF THE INVENTION

However, even when an end portion of a semiconductor layer is tapered, the concentration of an electric field and stress is still a problem. This problem is especially significant when the film thickness of a gate insulating film is as thin as several tens of nanometers.

The present invention is a technique for solving this problem, and it is an object of the present invention to improve the reliability of a semiconductor element by decreasing effects of a portion where the film thickness of a gate insulating film is thin, that is, an uneven portion, on the semiconductor element characteristics. In addition, it is another object of the present invention to provide a manufacturing method through which a semiconductor device having such a semiconductor element is obtained.

One feature of the present invention is a semiconductor device including a semiconductor layer, a gate electrode covering an end portion of the semiconductor layer, and an insulating layer for insulating the semiconductor layer and the gate electrode, where the film thickness of the insulating layer for insulating a region where the end portion of the semiconductor layer and the gate electrode overlap each other is thicker than the film thickness of the insulating layer covering a central portion of the semiconductor layer.

Another feature of the present invention is a semiconductor device including an insulating layer functioning as a base film formed over a substrate, a semiconductor layer formed over the insulating layer, and an insulating layer functioning as a gate insulating film covering the insulating layer which functions as a base film and the semiconductor layer, where a side surface of an end portion of the semiconductor layer is inclined at a first angle with respect to the surface of the substrate, the insulating layer functioning as a base film is inclined at a second angle with respect to the surface of the substrate, and the second angle is smaller than the first angle. In other words, the angle of inclination of the side surface of the semiconductor layer and the angle of inclination of the insulating layer functioning as a base film get smaller so that the slope gradually decreases.

It is preferable that the first angle be greater than or equal to 10 degrees and less than or equal to 40 degrees, and the second angle be greater than or equal to 5 degrees and less than or equal to 15 degrees.

Another feature of the present invention is a semiconductor device including a semiconductor layer, a gate electrode covering an end portion of the semiconductor layer, and an insulating layer for insulating the semiconductor layer and the gate electrode, where the insulating layer for insulating the semiconductor layer and the gate electrode is formed so as to be thicker at the end portion of the semiconductor layer than at a central portion of the semiconductor layer.

In the semiconductor device of the present invention, a plurality of semiconductor layers are formed and the plurality of semiconductor layers are separated from one another.

In a semiconductor device including a semiconductor layer, a gate electrode covering an end portion of the semiconductor layer, and an insulating layer for insulating the semiconductor layer and the gate electrode, the film thickness of the insulating layer for insulating a region where the end portion of the semiconductor layer and the gate electrode overlap each other is made thicker than the film thickness of the insulating layer covering a central portion of the semiconductor layer, whereby short-circuiting of the end portion of the semiconductor layer and the gate electrode can be prevented. This structure is particularly effective when the film thickness of an insulating film functioning as a gate insulating film is as thin as several nanometers to several tens of nanometers and thinner than the film thickness of a semiconductor layer.

In addition, when the insulating layer formed over the semiconductor layer is removed by etching, sometimes a depression is formed in a portion of the insulating layer where a side surface of the end portion of the semiconductor layer and the insulating layer functioning as a base film come into contact with each other. However, by forming an insulating layer which has a thick thickness in a region which covers the end portion of the semiconductor layer, the depression can be filled with the insulating layer. In this manner, when an insulating layer functioning as a gate insulating film and the like are formed, a coverage defect and the like can be reduced. As a result of these, the reliability of a semiconductor element to be formed later can be improved.

BRIEF DESCRIPTION OF THE DRAWINGS

In the accompanying drawings:

FIGS. 19A and 19B are diagrams for describing a writing operation of a NAND-type nonvolatile memory;

FIGS. 20A and 20B are diagrams for describing erasing and reading operations of a NAND-type nonvolatile memory;

FIGS. 25A to 25C are cross-sectional views for describing a manufacturing process of a semiconductor device of the present invention;

FIGS. 26A to 26C are cross-sectional views for describing a manufacturing process of a semiconductor device of the present invention;

FIGS. 27A to 27C are cross-sectional views for describing a manufacturing process of a semiconductor device of the present invention;

FIGS. 30A to 30C are cross-sectional views for describing an example of a manufacturing process of a semiconductor device of the present invention;

FIGS. 31A and 31B are cross-sectional views for describing an example of a manufacturing process of a semiconductor device of the present invention;

FIG. 39 is a graph showing current-voltage characteristics of thin film transistors obtained by calculations;

FIG. 40 is a graph showing inclinations of current-voltage characteristics shown in FIG. 39;

DETAILED DESCRIPTION OF THE INVENTION

Figure 1A:
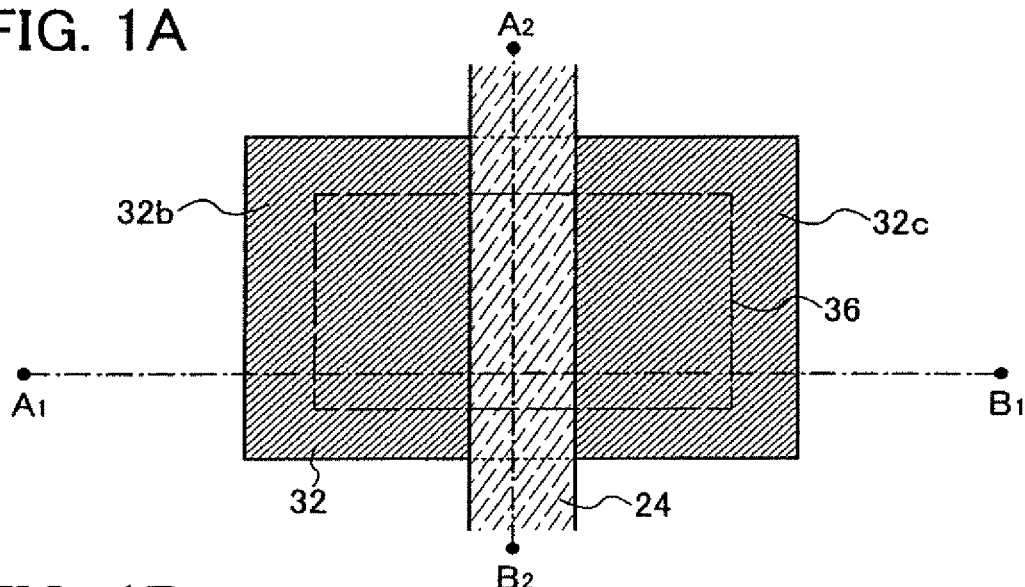
FIGS. 1A to 1C are a top view and cross-sectional views for describing a main structure of a semiconductor device of the present invention.

Embodiment Modes and Embodiments of the present invention will be explained below with reference to the drawings. However, the present invention is not limited to the following description, and it is to be easily understood by those skilled in the art that the modes and details can be changed in various ways without departing from the spirit and scope of the present invention. Therefore, the present invention should not be interpreted as being limited to the following description of Embodiment Modes and Embodiments. It is to be noted that, in the structure of the present invention described below, reference numerals denoting the same portions may be used in common in different drawings.

Embodiment Mode 1

In this embodiment mode, a structure of a semiconductor element in which a leak current of a gate voltage caused by a decrease in coverage of a gate insulating film in an end portion of a semiconductor layer can be suppressed and a manufacturing method thereof will be provided. In the description here, a thin film transistor is used as the semiconductor element.

Figure 1B:
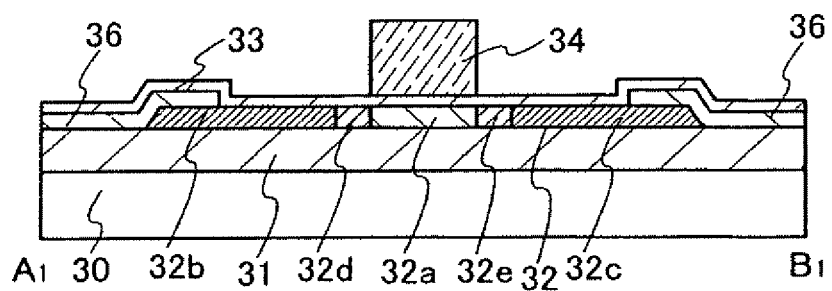
Figure 1C:
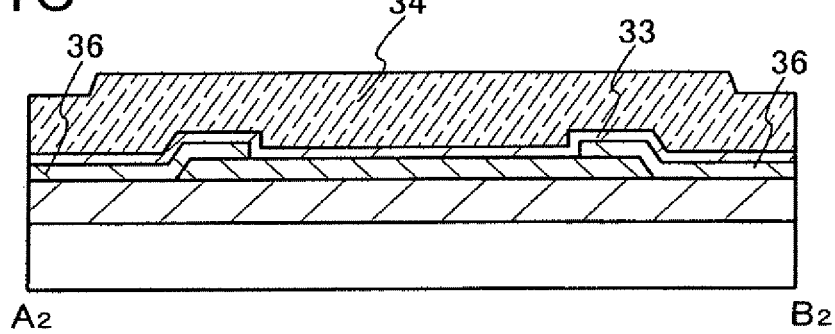

FIGS. 1A to 1C are a top view and cross-sectional views for describing a main structure of a semiconductor device of the present invention. FIG. 1A is a top view showing, in particular, a substantial part of a thin film transistor, FIG. 1B is a cross-sectional view taken along a line A1-B1 in FIG. 1A, and FIG. 1C is a cross-sectional view taken along a line A2-B2 in FIG. 1A. This thin film transistor is formed over a substrate 30 having an insulating surface. As the substrate 30 having an insulating surface, a glass substrate, a quartz substrate, a sapphire substrate, a ceramic substrate, a metal substrate which has an insulating layer formed over its surface, or the like can be used.

A semiconductor layer 32 is formed over this substrate 30 having an insulating surface. An insulating layer 31 functioning as a base film may be provided between the substrate 30 and the semiconductor layer 32. This insulating layer 31, which prevents an impurity such as an alkali metal or the like from diffusing from the substrate 30 into the semiconductor layer 32 and contaminating the semiconductor layer 32, may be provided as a blocking layer, as appropriate.

As the insulating layer 31, an insulating material such as silicon oxide, silicon nitride, or silicon containing oxygen and nitrogen (silicon oxynitride) is used. For example, in the case where the insulating layer 31 is formed as a two-layer structure, a silicon oxynitride layer that contains more nitrogen than oxygen may be formed as a first insulating layer and a silicon oxynitride layer that contains more oxygen than nitrogen may be formed as a second insulating layer. Alternatively, a silicon nitride layer may be formed as a first insulating layer, and a silicon oxide layer may be formed as a second insulating layer.

It is preferable that the semiconductor layer 32 be formed of a single-crystalline semiconductor or a polycrystalline semiconductor. As the semiconductor material, silicon is preferable. In addition, a silicon-germanium semiconductor may also be used. Furthermore, it is preferable that island-shaped semiconductor layers be formed over an insulating surface and one or a plurality of nonvolatile memory elements or thin film transistors be formed over the semiconductor layer, for the purpose of element isolation.

In this manner, by forming semiconductor layers formed over the insulating surface into island shapes that are isolated from one another, element isolation can be performed effectively even when a plurality of thin film transistors and peripheral circuits are formed over the same substrate. That is, even when a memory element array which needs to perform writing and erasing at a voltage of approximately 10 V to 20 V and a peripheral circuit which operates at a voltage of approximately 3 V to 7 V to mainly perform input and output of data and control of instructions are formed over the same substrate, mutual interference due to a difference in the voltage applied to each element can be prevented.

A p-type impurity may be injected into the semiconductor layer 32. Boron is used as the p-type impurity, for example, and may be added to the semiconductor layer 32 at a concentration of approximately $5 \times 10^{15}$ atoms/cm$^3$ to $1 \times 10^{16}$ atoms/cm$^3$. This is for controlling the threshold voltage of the transistor, and addition of the impurity into a channel formation region works efficiently. The channel formation region is formed in a region which roughly corresponds to a conductive layer 34 functioning as a gate electrode which will be described later, and is located between a pair of impurity regions 32b and 32c in the semiconductor layer 32.

The pair of impurity regions 32b and 32c are regions each functioning as a source region or drain region in a nonvolatile memory element. The pair of impurity regions 32b and 32c are formed by adding phosphorus or arsenic, which are n-type impurities, to the semiconductor layer 32 at a peak concentration of approximately $10^{21}$ atoms/cm$^3$.

In addition, low concentration impurity regions 32d and 32e may be provided in the semiconductor layer 32. By provision of the low concentration impurity regions 32d and 32e, an electric field in the drain edge can be lowered, and deterioration caused by repeated writing and erasing can be suppressed.

Over the semiconductor layer 32, an insulating layer 36 covering an end portion of the semiconductor layer, an insulating layer 33 functioning as a gate insulating film, and a conductive layer 34 functioning as a gate electrode are formed.

The insulating layer 36 covering the end portion of the semiconductor layer is provided so as to prevent the end portion of the semiconductor layer 32 and the conductive layer 34 functioning as a gate electrode from being short-circuited. Therefore, it is preferable that the insulating layer 36 be formed over the semiconductor layer 32 in a region where the end portion of the semiconductor layer 32 and the conductive layer 34 functioning as a gate electrode overlap each other.

In FIG. 1A, the dashed line indicates the end of the insulating layer 36, so that the insulating layer 36 is not formed inside the dashed line. The insulating layer 36 is formed outside the dashed line so as to cover the end portion of the semiconductor layer 32. In other words, the insulating layer 36 has an opening over the semiconductor layer 32.

Since the insulating layer 36 covering the end portion of the semiconductor layer is provided so as to prevent the end portion of the semiconductor layer 32 and the conductive layer 34 functioning as a gate electrode from being short-circuited, the insulating layer 36 may be formed in a region where the end portion of the semiconductor layer 32 and the conductive layer 34 functioning as a gate electrode overlap each other.

Figure 2A:
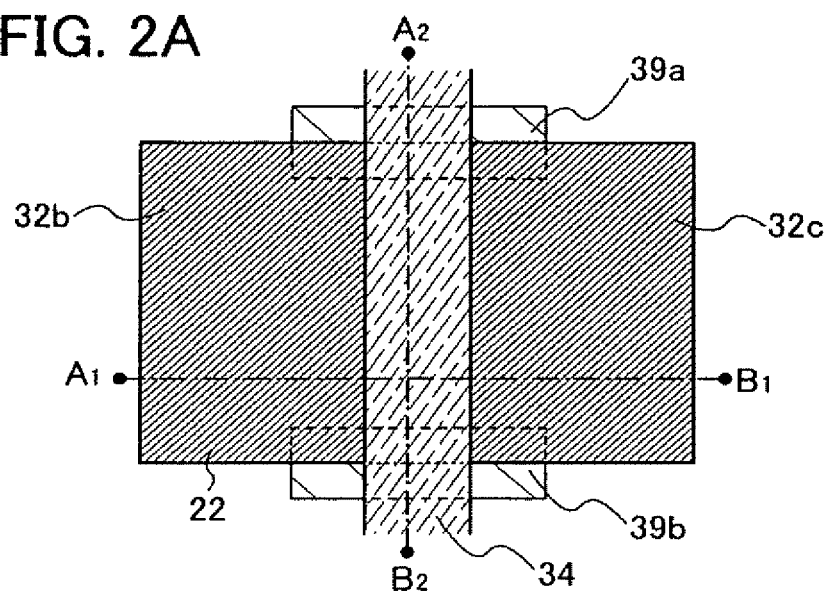
FIGS. 2A to 2C are a top view and cross-sectional views for describing a main structure of a semiconductor device of the present invention.
Figure 2B:
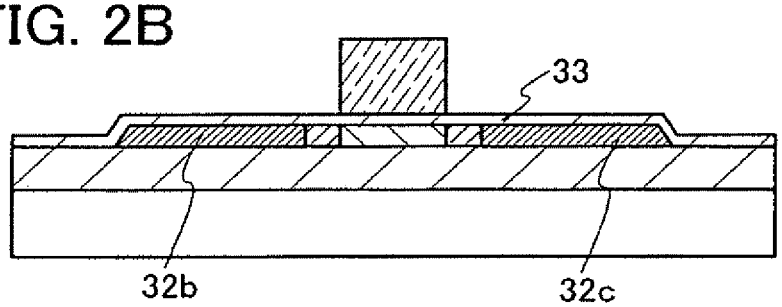
Figure 2C:
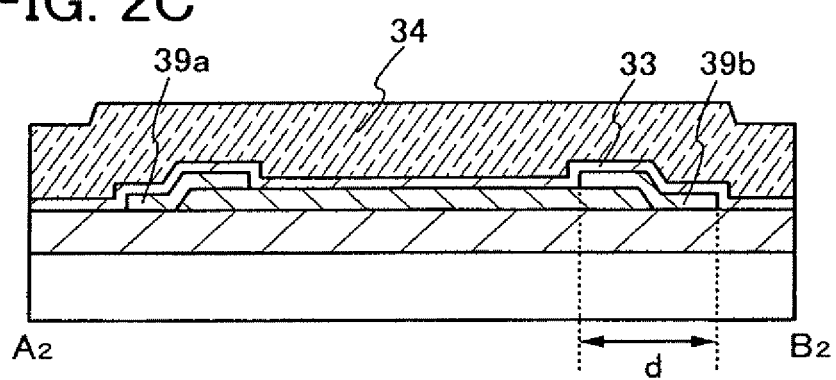

Typically, as shown in FIGS. 2A to 2C, insulating layers 39a and 39b may each be formed in a region where the end portion of the semiconductor layer 32 and the conductive layer 34 functioning as a gate electrode overlap each other. That is, the insulating layers 39a and 39b are discontinuous layers formed discontinuously over the substrate. Therefore, as shown in FIG. 2B, the insulating layers 39a and 39b are not formed in a cross section taken along a line A1-B1 in FIG. 2A; and, as shown in a cross-sectional view in FIG. 2C taken along a line A2-B2, the insulating layers 39a and 39b are each formed only in a region where the conductive layer 34 functioning as a gate electrode is formed over the end portion of the semiconductor layer 32.

The length of each of the insulating layers 39a and 39b in the channel length direction of the gate electrode is greater than or equal to 3 µm and less than or equal to 10 µm, preferably greater than or equal to 3 µm and less than or equal to 5 µm.

In this manner, by forming the insulating layer 36 or the insulating layers 39a and 39b, which cover the end portion of the semiconductor layer, the end portion of the semiconductor layer 32 and the conductive layer 34 functioning as a gate electrode can be prevented from being short-circuited. This structure is particularly effective when the film thickness of an insulating film functioning as a gate insulating film is as thin as several nanometers to several tens of nanometers and thinner than the film thickness of a semiconductor layer. In addition, when the insulating layer formed over the semiconductor layer 32 is removed entirely by etching, sometimes a depression is formed in a portion of the insulating layer 31 where the end portion of the semiconductor layer 32 and the insulating layer 31 come into contact with each other. However, by forming the insulating layer 36 or the insulating layers 39a and 39b, the depression can be filled with the insulating layer. In this manner, when an insulating layer functioning as a gate insulating layer and the like are formed, a coverage defect and the like can be reduced. As a result of these, the reliability of a semiconductor element to be formed later can be improved.

Each of the insulating layers 36, 39a, and 39b is formed of silicon oxide, aluminum nitride, silicon nitride, a stacked structure of silicon oxide and silicon nitride, a stacked structure of silicon oxide and aluminum nitride, or the like.

Next, cross-sectional shapes of the end portions of the insulating layers 36, 39a, and 39b will be described with reference to FIGS. 1A to 1C and 3A to 3C. Here, although the insulating layer 36 is used as a typical example for the description, the structure can be appropriately applied to the insulating layers 39a and 39b.

As shown in FIG. 1B, the side surface of the end portion of the insulating layer 36 can be perpendicular or approximately perpendicular to the surface of the semiconductor layer 32, preferably at an angle of greater than or equal to 85° and less than or equal to 95°. When the side surface of the end portion of the insulating layer 36 is perpendicular to the surface of the semiconductor layer 32, a margin for the mask alignment to cover the end portion of the semiconductor layer 32 can be small, and the area of the semiconductor layer can be small as well. That is, high integration is possible.

Figure 3A:
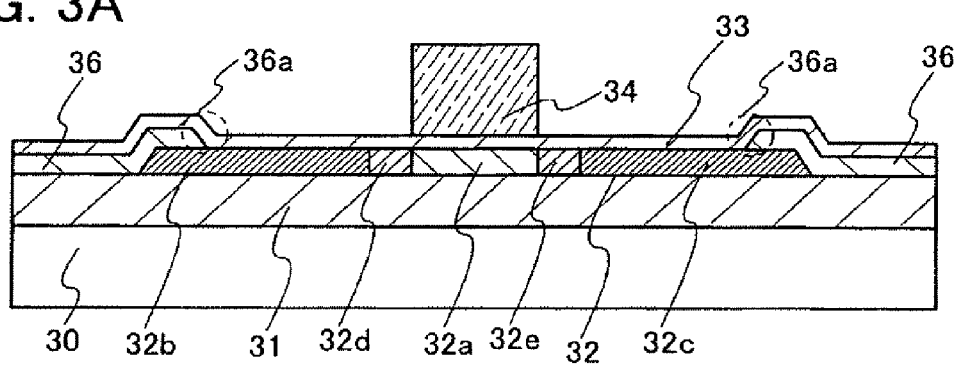
FIGS. 3A to 3C are cross-sectional views for describing a main structure of a semiconductor device of the present invention.

Alternatively, as shown in FIG. 3A, the side surface of the end portion 36a of the insulating layer 36 can be tapered or inclined, preferably at an angle of greater than or equal to 30° and less than 85°, more preferably at an angle of greater than or equal to 45° and less than or equal to 60°, with respect to the surface of the semiconductor layer 32. When a side surface of the end portion 36a of the insulating layer 36 is tapered, coverage of an insulating layer functioning as a gate insulating film, which will be described later, covering the insulating layer 36 covering the end portion of the semiconductor layer, can be improved. In other words, it is possible to suppress a leak current between the semiconductor layer and the gate electrode.

Figure 3B:
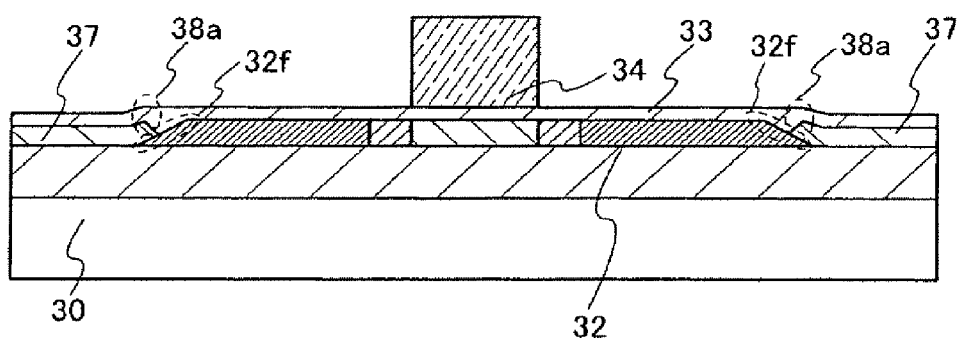

Further alternatively, as shown in FIG. 3B, when a side surface 32f of the semiconductor layer 32 is tapered or inclined, preferably at an angle of greater than or equal to 30° and less than 85°, more preferably at an angle of greater than or equal to 45° and less than or equal to 60°, a side surface 36b of the insulating layer 36 may be on a side surface 32f of the semiconductor layer 32. When the side surface 36b of the insulating layer 36 is positioned on the side surface 32f of the semiconductor layer 32, unevenness of a gate insulating film which will be described later can be reduced and coverage can be improved. In other words, a leak current between the semiconductor layer and the gate electrode can be suppressed.

Furthermore, the side surface of the end portion of the insulating layer 36 may be formed on an edge formed by the top surface and the side surface of the semiconductor layer 32. In this case, the area of the semiconductor layer being covered by the insulating layer 36 is small, and a leak current between the semiconductor layer and the gate electrode can be suppressed without formation of a parasitic thin film transistor.

Furthermore, the surface of the semiconductor layer 32 and the surface of the insulating layer 36 may be flat. In this case, coverage of the semiconductor layer 32 by an insulating layer functioning as a gate insulating film which is formed later can be improved. In addition, a leak current between the semiconductor layer and the gate electrode can be suppressed without formation of a parasitic thin film transistor.

An insulating layer 33 functioning as a gate insulating film is formed of silicon oxide, a stacked structure of silicon oxide and silicon nitride, or the like. The insulating layer 33 may be formed by depositing an insulating layer by a plasma CVD method or a low pressure CVD method. Alternatively, the insulating layer 33 can be formed preferably by solid phase oxidation or solid phase nitridation by plasma treatment. This is because an insulating layer formed by oxidizing or nitriding a semiconductor layer (typically, a silicon layer) by plasma treatment has high withstand voltage and is dense and highly reliable.

In the solid phase oxidation treatment or solid phase nitridation treatment using plasma treatment, it is preferable to use plasma which is excited by microwave (typically, 2.45 GHz) and which has an electron density of greater than or equal to $1 \times 10^{-3}$ and less than or equal to $1 \times 10$ cm$^{-3}$ and an electron temperature of greater than or equal to 0.5 eV and less than or equal to 1.5 eV. This is because a practical response rate can be obtained and a dense insulating layer can be formed in the solid phase oxidation treatment or the solid phase nitridation treatment at a temperature of 500° C. or less.

The oxidation of the surface of the semiconductor layer 32 by this plasma treatment is performed in an oxygen atmosphere (e.g., in an atmosphere containing oxygen ($O_2$) or dinitrogen monoxide ($N_2O$) and a rare gas (containing at least one of He, Ne, Ar, Kr, or Xe), or in an atmosphere containing oxygen or dinitrogen monoxide and hydrogen ($H_2$) and a rare gas). The nitridation of the surface of the semiconductor layer 32 by the plasma treatment is performed in a nitrogen atmosphere (e.g., in an atmosphere containing nitrogen ($N_2$) and a rare gas (containing at least one of He, Ne, Ar, Kr, or Xe), in an atmosphere containing nitrogen, hydrogen, and a rare gas, or in an atmosphere containing $NH_3$ and a rare gas). As the rare gas, Ar can be used, for example. Further, a gas in which Ar and Kr are mixed may also be used.

Figure 23:
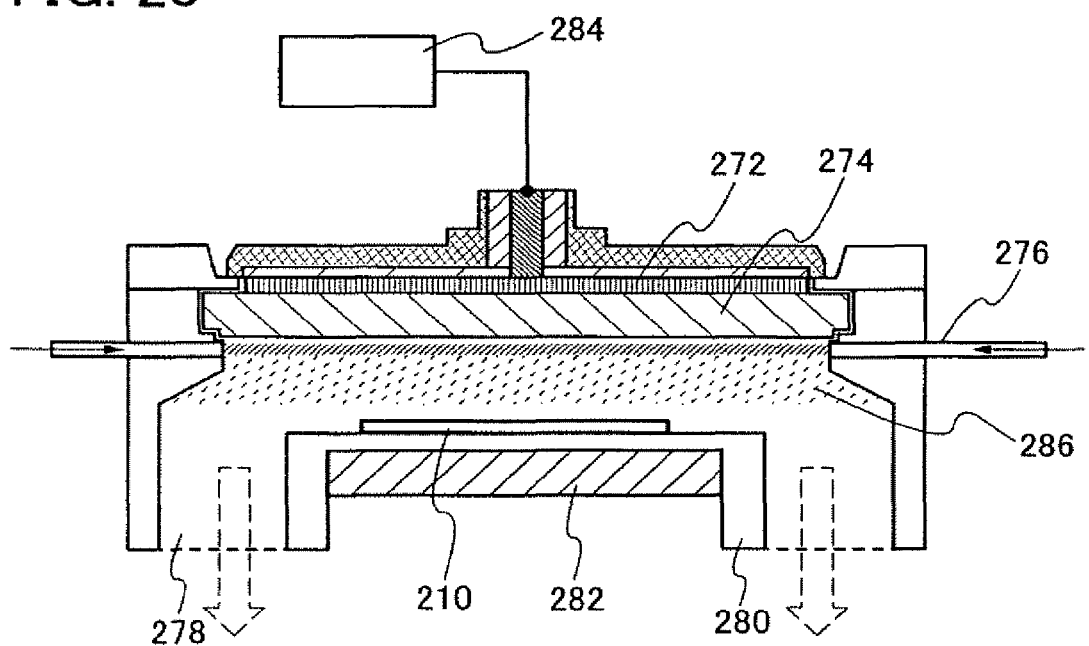
FIG. 23 is a view for describing a structure of a plasma treatment apparatus.
Figure 24A:
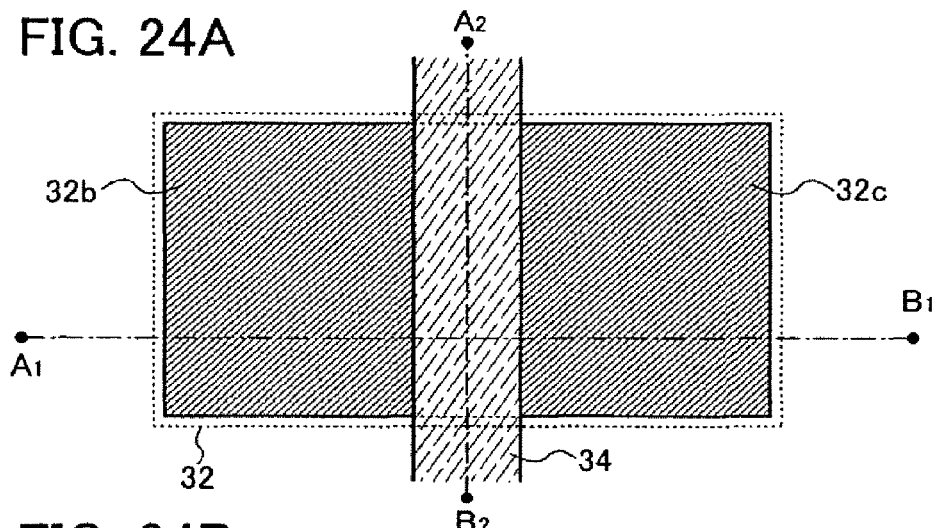
FIGS. 24A to 24D are a top view and cross-sectional views for describing a conventional example.
Figure 24B:
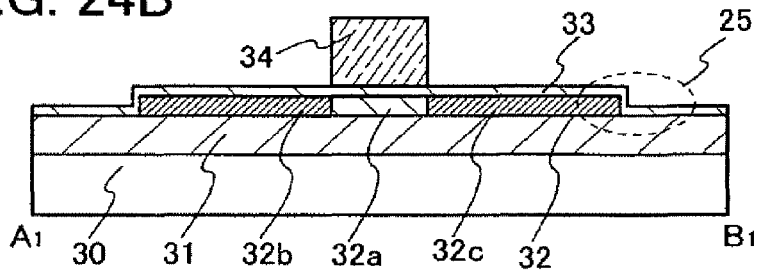
Figure 24C:
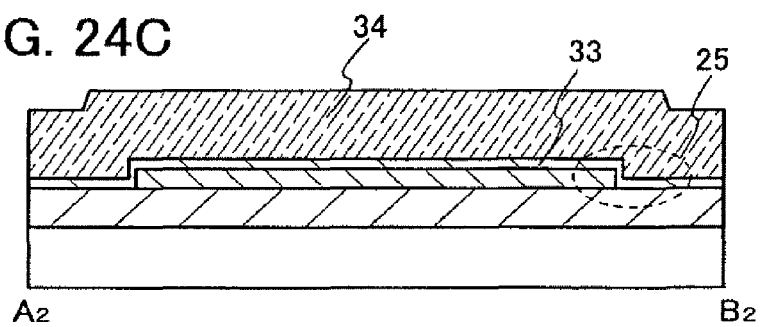
Figure 24D:
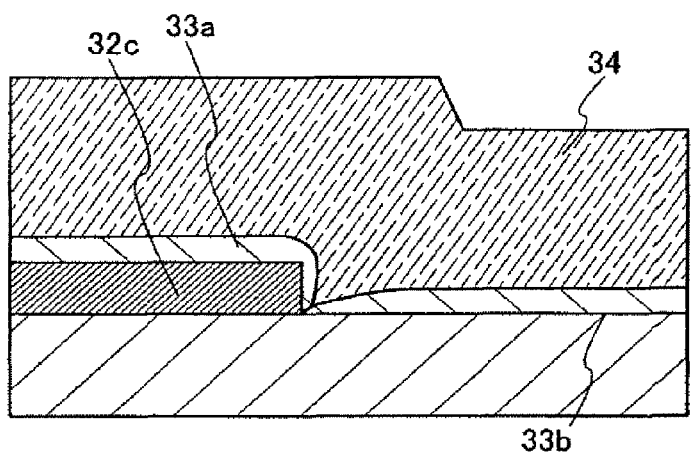

FIG. 23 shows a structural example of an apparatus for performing plasma treatment. This plasma treatment apparatus includes a supporting base 280 for arranging a substrate 210, a gas supplying portion 276 for introducing a gas, an exhaust outlet 278 connected to a vacuum pump for removing a gas, an antenna 272, a dielectric plate 274, and a microwave supplying portion 284 for supplying a microwave for generating plasma. In addition, by having a temperature controlling portion 282 be provided for the supporting base 280, the temperature of the substrate 210 can be controlled.

The plasma treatment will be described below. It is to be noted that the plasma treatment includes oxidation treatment, nitridation treatment, oxynitridation treatment, hydrogenation treatment, and surface reforming treatment on a semiconductor substrate, an insulating layer, and a conductive layer. In each treatment, a gas supplied from the gas supplying portion 276 can be selected in accordance with its purpose.

Oxidation treatment or nitridation treatment may be performed as follows. First, a treatment chamber is evacuated, and a plasma treatment gas containing oxygen or nitrogen is introduced from the gas supplying portion 276. The substrate 210 is heated to room temperature or a temperature of 100° C. to 550° C. by the temperature controlling portion 282. It is to be noted that the distance between the substrate 210 and the dielectric plate 274 is approximately 20 mm to 80 mm (preferably, 20 mm to 60 mm). Next, microwaves are supplied to the antenna 272 from the microwave supplying portion 284. Then, the microwaves are introduced into the treatment chamber from the antenna 272 through the dielectric plate 274, whereby plasma 286 is generated. By exciting plasma with microwave introduction, plasma with a low electron temperature (3 eV or less, preferably 1.5 eV or less) and a high electron density ($1 \times 10$ cm$^{-3}$ or more) can be generated. With either oxygen radicals (which may include OH radicals) or nitrogen radicals (which may include NH radicals) generated by this high-density plasma or both oxygen radicals and nitrogen radicals, the surface of the semiconductor substrate can be oxidized or nitrided. By mixing a rare gas such as argon into the plasma treatment gas, oxygen radicals or nitrogen radicals can be effectively generated by an excited species of the rare gas. This method can be used to perform oxidation and nitridation by solid-phase reaction at a low temperature of 500° C. or less by efficiently utilizing the active radicals excited by the plasma.

An example of a preferred insulating layer 33 formed by the high-density plasma treatment using the apparatus shown in FIG. 23 is formed as follows. A silicon oxide layer with a thickness of 3 nm to 6 nm is formed over the semiconductor layer 32 by plasma treatment in an oxygen atmosphere, and then the surface of the silicon oxide layer is treated by nitridation plasma in a nitrogen atmosphere so as to form a nitrogen plasma treatment layer. Specifically, first, a silicon oxide film with a thickness of 3 nm to 6 nm is formed over the semiconductor layer 32 by plasma treatment in an oxygen atmosphere. After that, plasma treatment is successively performed in a nitrogen atmosphere, whereby a nitrogen plasma treatment layer containing nitrogen at a high concentration is formed on the surface or near the surface of the silicon oxide layer. It is to be noted that "near the surface" refers to a depth of approximately 0.5 nm to 1.5 nm from the surface of the silicon oxide layer. For example, by performing plasma treatment in a nitrogen atmosphere, a structure in which nitrogen is contained at a rate of 20 to 50 atomic % at a depth of approximately 1 nm from the surface of the silicon oxide layer is obtained.

By oxidizing the surface of a silicon layer, which is a typical example of the semiconductor layer 32, by plasma treatment, a dense oxide layer without any distortion in the interface can be formed. Furthermore, by nitriding the oxide layer by plasma treatment so that oxygen in the top layer portion is replaced with nitrogen to form a nitride layer, the density can be further improved. Consequently, an insulating layer which is high in withstand voltage can be formed.

In any case, by using solid phase oxidation treatment or solid phase nitridation treatment by plasma treatment as described above, an insulating layer which is comparable to a thermal oxide film formed at 950° C. to 1050° C. can be obtained, even when a glass substrate which has a heatproof temperature of 700° C. or less is used. That is, a highly reliable insulating layer can be formed as an insulating layer functioning as a gate insulating layer of a semiconductor element, specifically a thin film transistor or a nonvolatile memory element.

It is preferable that the conductive layer 34 functioning as a gate electrode be formed of a metal selected from tantalum (Ta), tungsten (W), titanium (Ti), molybdenum (Mo), chromium (Cr), niobium (Nb), or the like, or an alloy material or a compound material containing the above element as its main component. Alternatively, polycrystalline silicon to which an impurity element such as phosphorus is added may be used. Further alternatively, the conductive layer 34 may be formed of a stacked structure including one or more metal nitride layers and the above-described metal layer. As the metal nitride, tungsten nitride, molybdenum nitride, or titanium nitride may be used. Through provision of the metal nitride layer, adhesiveness of the metal layer can be improved and peeling of the layer can be prevented.

Figure 3C:
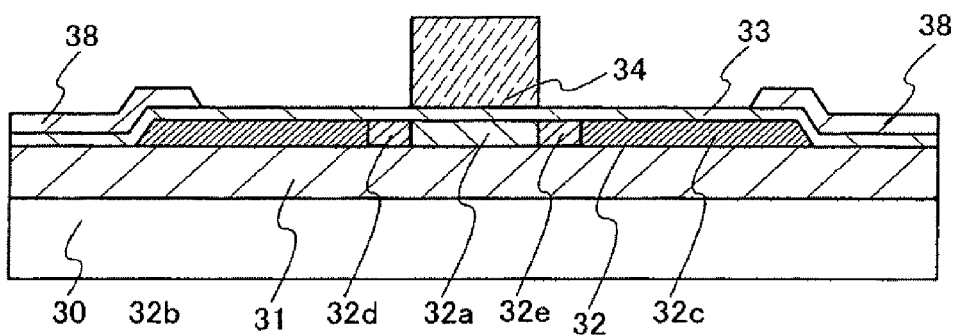

Furthermore, as shown in FIG. 3C, the insulating layer 33 functioning as a gate insulating film may be formed over the semiconductor layer 32, and an insulating layer 38 covering the end portion of the semiconductor layer 32 may be provided over the insulating layer 33 functioning as a gate insulating film.

Similarly to the insulating layer 36 shown in FIGS. 1A to 1C, the insulating layer 38 may be provided so as to completely cover the end portion of the semiconductor layer 32. Alternatively, similarly to the insulating layers 39a and 39b shown in FIGS. 2A to 2C, the insulating layer 38 may be formed in a region where the end portion of the semiconductor layer 32 and the conductive layer 34 functioning as a gate electrode overlap each other. In addition, the shape and arrangement of an end portion of the insulating layer 38 may be perpendicular to the surface of the semiconductor layer as shown in FIG. 1B, or may be tapered as shown in FIG. 3A. Alternatively, the end portion of the insulating layer 38 may be on the side surface of the semiconductor layer 32, as shown in FIG. 3B.

In addition, as the insulating layer covering the end portion of the semiconductor layer, an SOI (Si-On-Insulator) substrate can be used. As the SOI substrate, a so-called SIMOX (Separation by Implanted Oxygen) substrate, which is manufactured by implanting oxygen ions into a mirror-polished wafer and then performing high-temperature annealing so that an oxide layer is formed at a position with a certain depth from a top surface and so that a defect generated in a top surface layer is destroyed, may be used.

In the case where the semiconductor substrate is of an n-type, a p-well into which a p-type impurity is injected is formed. As the p-type impurity, boron, for example, is used and added at a concentration of approximately $5 \times 10^{15}$ atoms/cm$^{-3}$ to $1 \times 10^{16}$ atoms/cm$^{-3}$. By formation of the p-well, an n-channel transistor can be formed in this region. Further, the p-type impurity which is added to the p-well also has an effect of controlling the threshold voltage of a transistor. A channel formation region which is formed in the semiconductor substrate is feuded in a region roughly corresponding to a gate to be described later and is located between a pair of impurity regions formed in the semiconductor substrate.

Next, a manufacturing process of the thin film transistors shown in FIGS. 1A to 1C, 2A to 2C, and 3A to 3C will be described below.

Figure 4A:
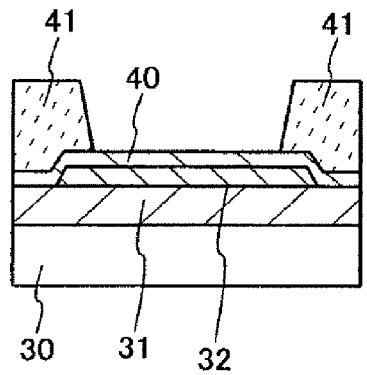
FIGS. 4A to 4F are cross-sectional views for describing a manufacturing process of a semiconductor device of the present invention.

As shown in FIG. 4A, an insulating layer 31 is formed over a substrate 30, a semiconductor layer 32 is formed over the insulating layer 31, an insulating layer 40 is formed over the semiconductor layer 32, and a mask 41 is formed over the insulating layer 40.

The insulating layer 31 is formed using an insulating material such as silicon oxide, silicon nitride, or silicon containing oxygen and nitrogen (silicon oxynitride), by a CVD method, a sputtering method, a coating method, or the like.

The semiconductor layer 32 can be formed of a single crystalline semiconductor or a polycrystalline semiconductor in the following way: a semiconductor layer which is formed over the entire surface of the substrate 30 by a sputtering method, a plasma CVD method, or a low pressure CVD method is crystallized, and then, selective etching is performed. As a method for crystallizing the semiconductor film, a laser crystallization method, a thermal crystallization method using rapid thermal annealing (RTA) or an annealing furnace, a crystallization method using a metal element that promotes crystallization, or a method combining one or more of these can be employed. The semiconductor layer 32 is formed with a thickness of greater than or equal to 10 nm and less than or equal to 150 nm, preferably greater than or equal to 30 nm and less than or equal to 100 nm, and more preferably greater than or equal to 50 nm and less than or equal to 80 nm.

The insulating layer 40 is formed using an insulating material such as silicon oxide, silicon nitride, or silicon containing oxygen and nitrogen (silicon oxynitride), by a CVD method, a sputtering method, a coating method, or the like.

The mask 41 is formed in a region covering at least an end portion of the semiconductor layer 32 that is covered by a gate electrode to be formed later. Alternatively, the mask 41 is formed in a region covering the end portion of the semiconductor layer 32. The mask 41 is formed by exposing and developing a resist through a photolithography process. Alternatively, the mask 41 may be formed by selectively discharging a composition through a droplet discharging method.

Figure 4D:
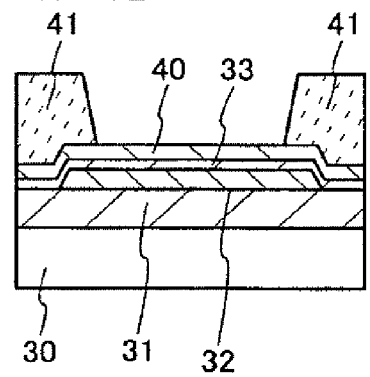
Figure 4B:
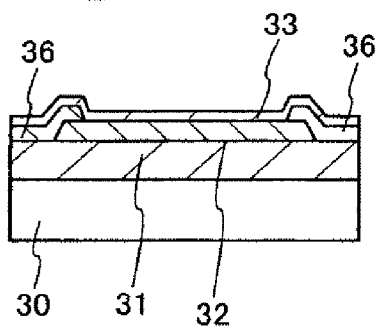

Next, as shown in FIG. 4B, the insulating layer 40 is etched using the mask 41 so as to form an insulating layer 36. At this time, part of the semiconductor layer 32 is exposed. Next, an insulating layer 33 functioning as a gate insulating film is formed over the insulating layer 36 and the exposed portion of the semiconductor layer 32.

The insulating layer 33 functioning as a gate insulating film is formed of silicon oxide, a stacked structure of silicon oxide and silicon nitride, or the like. The insulating layer 33 may be formed by stacking insulating layers by a plasma CVD method or a low pressure CVD method. Alternatively, the insulating layer 33 may be formed by solid-phase oxidation or solid-phase nitridation by plasma treatment using the apparatus shown in FIG. 23 which is described above. This is because an insulating layer formed by oxidizing or nitriding a semiconductor layer (typically, a silicon layer) by plasma treatment has high withstand voltage and is dense and highly reliable.

Figure 4E:
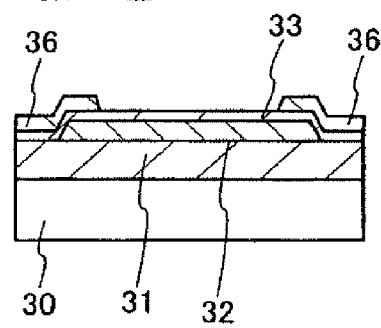
Figure 4C:
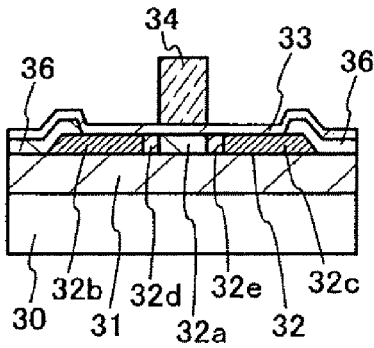

Next, as shown in FIG. 4C, a conductive layer 34 functioning as a gate electrode is formed over the insulating layer 33 functioning as a gate insulating film. Further, a channel formation region 32a that overlaps the gate electrode, high concentration impurity regions 32b and 32c, and low concentration impurity regions 32d and 32e are formed in the semiconductor layer 32.

It is preferable that the conductive layer 34 be formed of a metal selected from tantalum (Ta), tungsten (W), titanium (Ti), molybdenum (Mo), chromium (Cr), niobium (Nb), or the like, or an alloy material or a component material containing the above element as its main component, using a sputtering method, an evaporation method, an ink-jet method, a CVD method, or the like. The thickness of the conductive layer 34 is greater than or equal to 100 nm and less than or equal to 1000 nm, preferably greater than or equal to 200 nm and less than or equal to 800 nm, and more preferably greater than or equal to 300 nm and less than or equal to 500 nm.

An impurity is selectively added to the semiconductor layer 32, using the gate electrode or a mask, so as to form the channel formation region 32a that overlaps the gate electrode, the high concentration impurity regions 32b and 32c, and the low concentration impurity regions 32d and 32e.

Figure 4F:
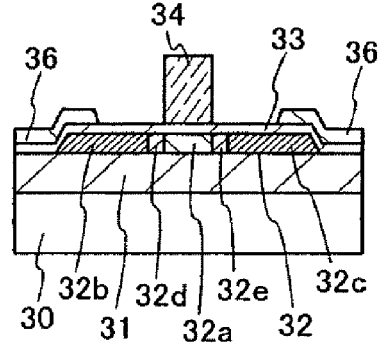

Next, a mode in which a process different from that of FIGS. 4A to 4C is used will be described with reference to FIGS. 4D to 4F.

As shown in FIG. 4D, an insulating layer 31 is formed over a substrate 30, and a semiconductor layer 32 is formed over the insulating layer 31. Next, after an insulating layer 33 functioning as a gate insulating film is formed over the semiconductor layer 32, an insulating layer 40 is formed, and then a mask 41 is formed over the insulating layer 40.

Subsequently, as shown in FIG. 4E, the insulating layer 40 is etched using the mask 41, whereby an insulating layer 36 is formed. Here, the insulating layers 33 and 40 should be appropriately selected such that only the insulating layer 40 is selectively etched whereas the insulating layer 33 is not etched. In other words, a film with a higher density and etching rate than the insulating layer 33 is formed as the insulating layer 40. Such a film can be formed by changing a flow rate of a source gas and the value of a voltage. Alternatively, after forming the insulating layer 33 and the insulating layer 40 using different materials, the insulating layer 40 may be etched using an etchant that will selectively etch only the insulating layer 40 so as to form the insulating layer 36.

After that, in a similar manner to FIG. 3C, a conductive layer 34 functioning as a gate electrode is formed, and a channel formation region 32a that overlaps the gate electrode, high concentration impurity regions 32b and 32c, and low concentration impurity regions 32d and 32e are formed in the semiconductor layer 32.

In the above-described manners, a thin film transistor in which a leak current between a semiconductor layer and a gate electrode is suppressed can be manufactured.

Figure 5A:
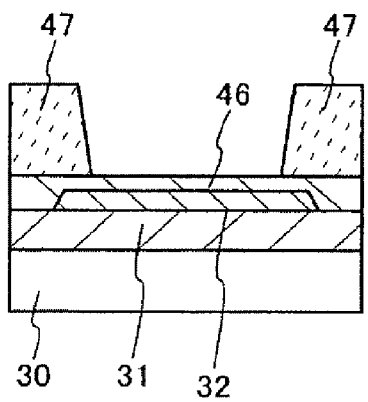
FIGS. 5A to 5F are cross-sectional views for describing a manufacturing process of a semiconductor device of the present invention.
Figure 5B:
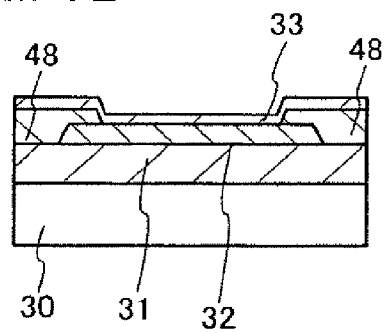
Figure 5C:
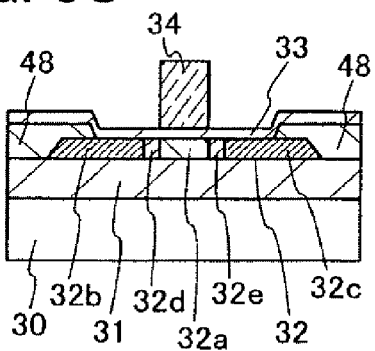

Although the insulating layer 40 is formed by a thin film formation method in FIG. 4A, an insulating layer 48 may be formed by a process similar to that of FIGS. 4B and 4C after formation of an insulating layer 46 by a coating method as shown in FIG. 5A.

The insulating layer 46 can be provided with a single-layer or stacked-layer structure formed of an organic material such as an epoxy resin, polyimide, polyamide, polyvinyl phenol, benzocyclobutene, or an acrylic resin; or a siloxane material such as a siloxane resin or the like. It is to be noted that the siloxane material corresponds to a material that contains an Si—O—Si bond. Siloxane has a skeleton structure that contains a bond of silicon (Si) and oxygen (O). As a substituent, an organic group containing at least hydrogen (e.g., an alkyl group or an aromatic hydrocarbon group) can be used. As a substituent, a fluoro group may also be used. Alternatively, as a substituent, an organic group containing at least hydrogen and a fluoro group may be used.

An insulating layer formed through such a process has little unevenness over the entire substrate and an effect of the unevenness on the insulating layer 33 is reduced. Therefore, even when the film thickness of the insulating layer 33 is thin, coverage thereof can be maintained.

Figure 5D:
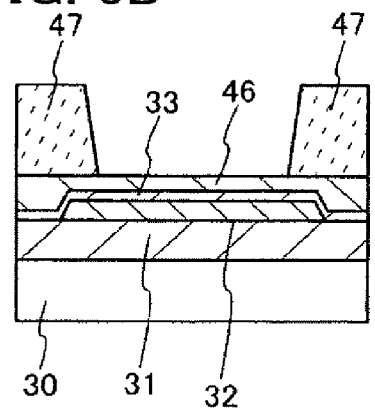
Figure 5E:
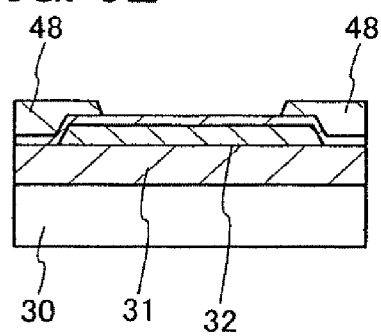
Figure 5F:
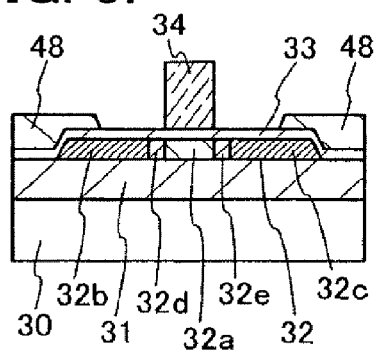

Alternatively, as shown in FIG. 5D, after an insulating layer 33 functioning as a gate insulating film is formed over the semiconductor layer 32, an insulating layer 46 may be formed, and then a mask 47 may be formed over the insulating layer 46. After that, as shown in FIG. 5E, the insulating layer 46 is etched using the mask 47 so as to form an insulating layer 48 that covers an end portion of the semiconductor layer 32 with the insulating layer 33 interposed therebetween.

A manufacturing process of a semiconductor device using a process different from the above will be described with reference to FIGS. 6A to 6F and 7A to 7I.

Figure 6A:
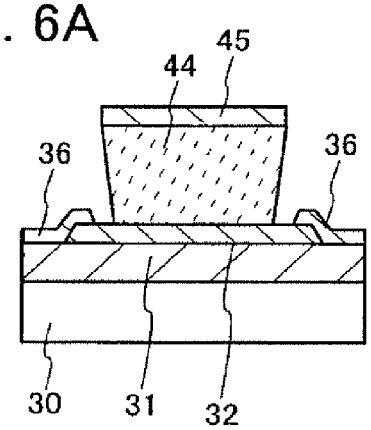
FIGS. 6A to 6F are cross-sectional views for describing a manufacturing process of a semiconductor device of the present invention.

As shown in FIG. 6A, an insulating layer 31 is formed over a substrate 30, and a semiconductor layer 32 is formed over the insulating layer 31. Then, after a mask 44 is formed over the semiconductor layer 32, an insulating layer is formed over the mask 44, the semiconductor layer 32, and the insulating layer 31. Here, the mask 44 is formed such that the cross section thereof is a trapezoid in which the upper base is longer than the lower base (hereinafter, this shape is referred to as an inverted trapezoid). By doing so, when an insulating layer is formed thereover, an insulating layer 45 can be formed over the mask and an insulating layer 36 can be formed around the mask, that is, over the exposed portion of the semiconductor layer 32 and the insulating layer 31.

Figure 6D:
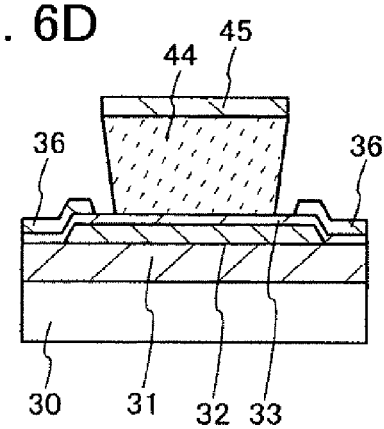
Figure 6B:
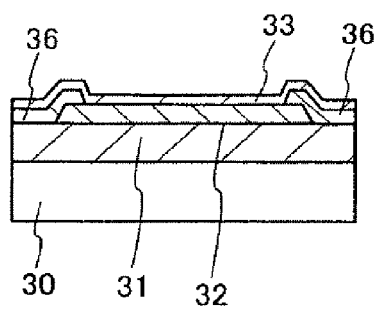

Next, as shown in FIG. 6B, the mask 44 is removed so that the insulating layer 45 formed over the mask 44 is also removed. As a result, only the insulating layer 36 covering an end portion of the semiconductor layer 32 can be left remaining.

After that, an insulating layer 33 functioning as a gate insulating film is formed over the semiconductor layer 32 and the insulating layer 36, and a conductive layer 34 functioning as a gate electrode is formed over the insulating layer 33 functioning as a gate insulating film. Further, a channel formation region 32a that overlaps the gate electrode, high concentration impurity regions 32b and 32c, and low concentration impurity regions 32d and 32e are formed in the semiconductor layer 32.

Figure 6E:
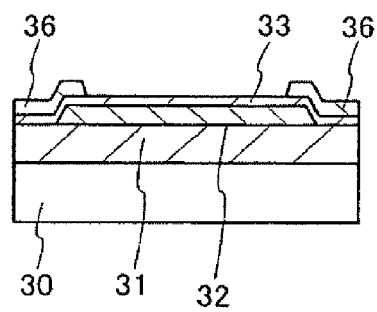
Figure 6C:
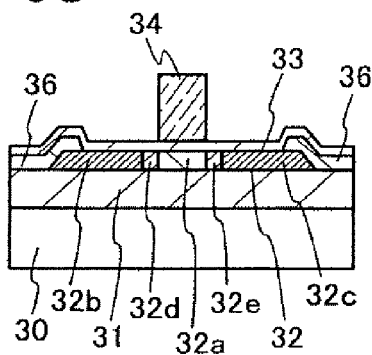
Figure 6F:
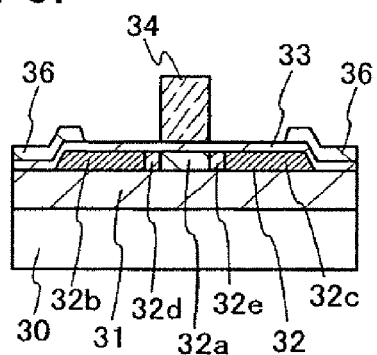

Next, a mode in which a process different from that of FIGS. 6A to 6C is used will be described with reference to FIGS. 6D to 6F.

As shown in FIG. 6D, an insulating layer 31 is formed over a substrate 30, and a semiconductor layer 32 is formed over the insulating layer 31. Then, after an insulating layer 33 functioning as a gate insulating film is formed over the semiconductor layer 32, a mask 44 with an inverted-trapezoidal shape is formed over the insulating layer 33, and then an insulating layer 36 is formed over the mask 44 with an inverted-trapezoidal shape, the semiconductor layer 32, and the insulating layer 33.

Next, as shown in FIG. 6E, the mask 44 is removed so that an insulating layer 45 formed over the mask 44 is also removed. As a result, only the insulating layer 36 covering an end portion of the semiconductor layer 32 can be left remaining.

After that, in a similar manner to FIG. 6C, a conductive layer 34 functioning as a gate electrode is formed, and a channel formation region 32a that overlaps the gate electrode, high concentration impurity regions 32b and 32c, and low concentration impurity regions 32d and 32e are formed in the semiconductor layer 32.

In the above-described manners, a thin film transistor in which a leak current between a semiconductor layer and a gate electrode is suppressed can be manufactured.

Figure 7A:
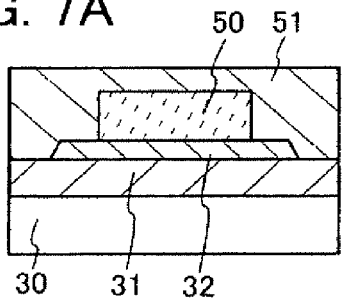
FIGS. 7A to 7I are cross-sectional views for describing a manufacturing process of a semiconductor device of the present invention.
Figure 7B:
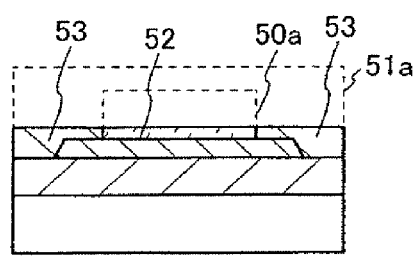

Although the insulating layers 36 and 45 are formed by a thin film formation method in FIGS. 6A to 6F, in the case where a mask 50 is formed over a semiconductor layer 32 and an insulating layer 51 is formed over the mask 50 and the semiconductor layer 32 by a coating method, as shown in FIG. 7A, the insulating layer 51 and the mask 50 are etched isotropically so as to form an etched insulating layer 53 and an etched mask 52, as shown in FIG. 7B. In FIG. 7B, a dashed line 50a indicates the mask 50 before etching and a dashed line 51a indicates the insulating layer 51 before etching.

Figure 7C:
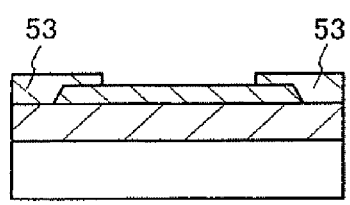
Figure 7D:
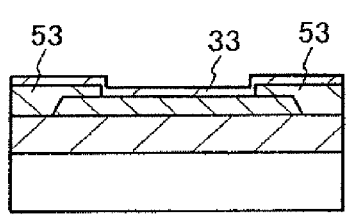
Figure 7E:
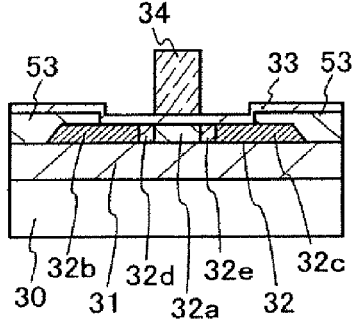

Subsequently, the etched mask 52 is removed, whereby an insulating layer 53 covering an end portion of the semiconductor layer 32 can be formed as shown in FIG. 7C. The insulating layer 53 formed through such a process has little unevenness over the entire substrate and an effect of the unevenness on an insulating layer 33 is reduced. Therefore, even when the film thickness of the insulating layer 33 is thin, coverage thereof can be maintained.

Figure 7F:
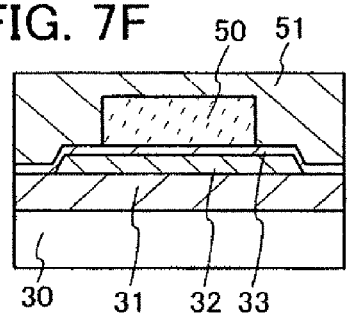

Alternatively, as shown in FIG. 7F, after an insulating layer 33 functioning as a gate insulating film is formed over a semiconductor layer 32, a mask 50 is formed over the insulating layer 33, and then an insulating layer 51 is formed over the mask 50 and the insulating layer 33 by a coating method.

Figure 7G:
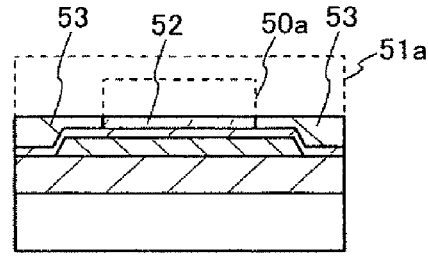

Next, as shown in FIG. 7G, the insulating layer 51 and the mask 50 are etched isotropically so as to form an etched insulating layer 53 and an etched mask 52.

Figure 7H:
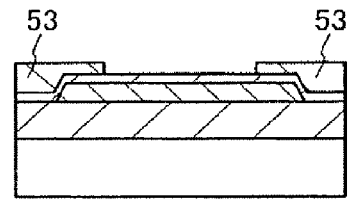
Figure 7I:
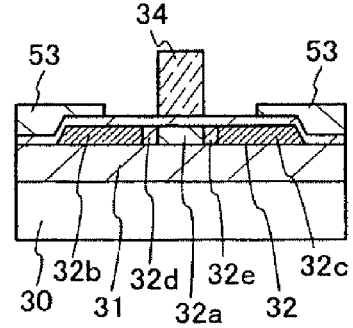

Subsequently, the etched mask 52 is removed, whereby an insulating layer 53 covering an end portion of the semiconductor layer 32 with the insulating layer 33 interposed therebetween can be formed as shown in FIG. 7H. The insulating layer 53 formed through such a process has little unevenness over the entire substrate and an effect of the unevenness on a conductive layer 34 functioning as a gate electrode to be formed later is reduced. Therefore, even when the film thickness of the insulating layer 33 is thin, coverage thereof can be maintained.

A manufacturing process of a semiconductor device using a process different from the above will be described with reference to FIGS. 8A to 8I and 9A to 9I. In FIGS. 8A to 8I and 9A to 9I, a process through which an insulating layer covering an end portion of a semiconductor layer is formed by using a mask for forming the semiconductor layer will be described. The manufacturing process described hereinafter can improve the throughput since the number of photomasks for forming masks can be reduced by 1, compared to FIGS. 4A to 4F, FIGS. 5A to 5F, FIGS. 6A to 6F, and FIGS. 7A to 7I. In addition, the number of steps of mask alignment using photomasks is reduced; therefore, decrease in yield caused by misalignment can be reduced.

With reference to FIGS. 8A to 8I, a process of forming an insulating layer covering an end portion of a semiconductor layer, using back exposure and using the semiconductor layer as a mask, will be described.

Figure 8A:
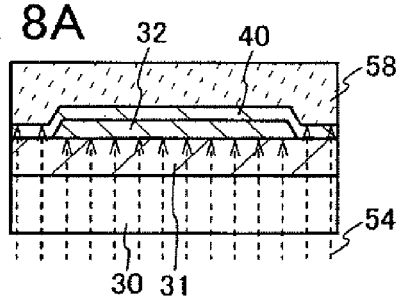
FIGS. 8A to 8I are cross-sectional views for describing a manufacturing process of a semiconductor device of the present invention.

As shown in FIG. 8A, an insulating layer 31 is formed over a substrate 30, and a semiconductor layer 32 is formed over the insulating layer 31. Then, after an insulating layer 40 is formed over the semiconductor layer 32, a resist 58 is formed.

Here, the substrate 30, the insulating layer 31, and the insulating layer 40 are formed using materials that transmit light for exposing the resist 58. In other words, a substrate having a light-transmitting property is used.

Next, the resist 58 is irradiated with light 54 from the substrate 30 side, whereby part of the resist 58 is exposed. As the light 54, light which is absorbed by the semiconductor layer 32, penetrates the substrate 30, the insulating layer 31, and the insulating layer 40, and exposes the resist 58 is used. Here, the resist 58 is exposed using the semiconductor layer as a mask; therefore, light with a wavelength of 350 nm or more which can be absorbed by the semiconductor layer, typically i-line (365 nm), g-line (436 nm), or h-line (405 nm) may be used. Furthermore, when light quantity is increased, the light goes around the rear side of the semiconductor layer 32 and the resist over the semiconductor layer 32 can also be exposed.

Figure 8F:
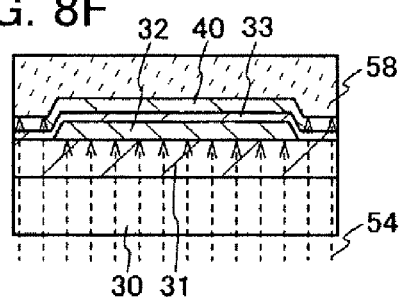
Figure 8B:
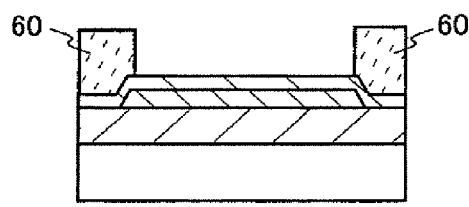

The exposed resist is developed so as to form a mask 60 shown in FIG. 8B. Then, the insulating layer 40 is etched using the mask 60, and an insulating layer 36 covering an end portion of the semiconductor layer 32 can be formed as shown in FIG. 8C.

Figure 8G:
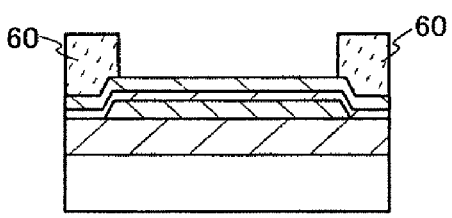
Figure 8C:
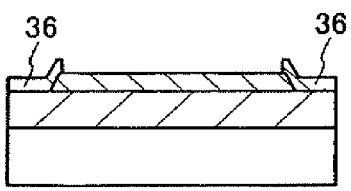
Figure 8H:
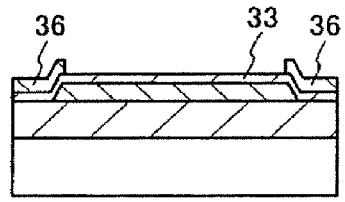
Figure 8D:
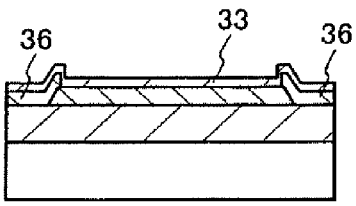

After that, as shown in FIG. 8D, an insulating layer 33 functioning as a gate insulating film is formed over the semiconductor layer 32 and the insulating layer 36. Further, a channel formation region 32a that overlaps the gate electrode, high concentration impurity regions 32b and 32e, and low concentration impurity regions 32d and 32e are formed in the semiconductor layer 32.

Next, a mode in which a process different from that of FIGS. 8A to 8E is used will be described with reference to FIGS. 8F to 8I.

As shown in FIG. 8F, an insulating layer 31 is formed over a substrate 30, and a semiconductor layer 32 is formed over the insulating layer 31. Then, an insulating layer 33 functioning as a gate insulating film is formed over the semiconductor layer 32, and an insulating layer 40 is formed over the insulating layer 33. After that, a resist 58 is formed. Next, the resist 58 is irradiated with light 54 from the substrate 30 side, and part of the resist 58 is exposed.

The exposed resist is developed so as to form a mask 60 shown in FIG. 8G. Then, only the insulating layer 40 is etched using the mask 60, whereby an insulating layer 36 covering an end portion of the semiconductor layer 32 with the insulating layer 33 interposed therebetween can be formed, as shown in FIG. 8H.

Figure 8I:
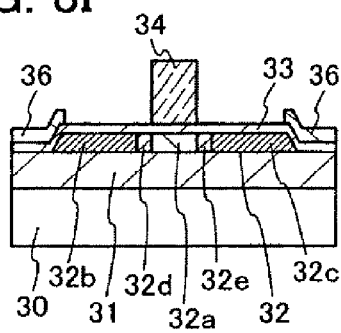
Figure 8E:
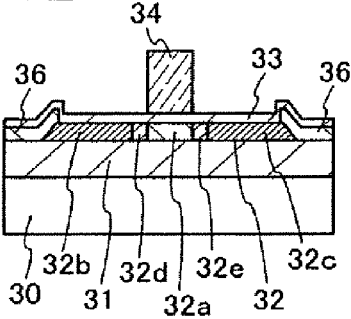

After that, in a similar manner to FIG. 8E, a conductive layer 34 functioning as a gate electrode is formed as shown in FIG. 8I, and a channel formation region 32a that overlaps the gate electrode, high concentration impurity regions 32b and 32c, and low concentration impurity regions 32d and 32e are formed in the semiconductor layer 32.

In the above-described manners, a thin film transistor in which a leak current between the semiconductor layer and the gate electrode is suppressed can be manufactured.

Next, a process of forming an insulating layer covering an end portion of a semiconductor layer, using a mask for forming the semiconductor layer, will be described with reference to FIGS. 9A to 9I.

Figure 9A:
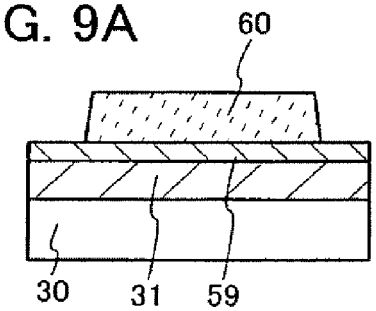
FIGS. 9A to 9I are cross-sectional views for describing a manufacturing process of a semiconductor device of the present invention.

As shown in FIG. 9A, an insulating layer 31 is formed over a substrate 30 and a semiconductor layer 59 is formed over the insulating layer 31. Then, a mask 60 is formed over the semiconductor layer 59.

Figure 9F:
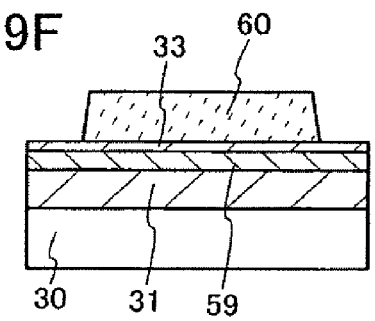
Figure 9B:
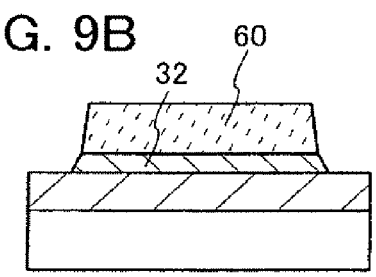

Next, as shown in FIG. 9B, the semiconductor layer 59 is etched using the mask 60 so as to form a semiconductor layer 32.

Figure 9G:
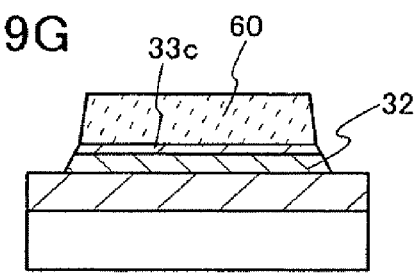
Figure 9C:
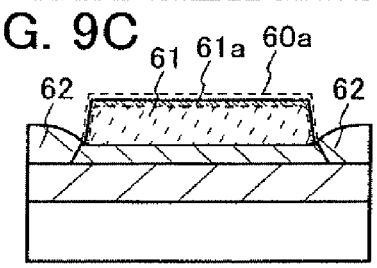

Next, as shown in FIG. 9C, the mask 60 is etched or removed by ashing so that the mask 60 is formed into a mask 61 which is a little smaller in size than the mask 60, then, liquid repellent treatment is performed on a surface of the mask 61. Here, as the liquid repellent treatment, the surface of the mask 61 is treated with fluorine plasma. Although the liquid repellent treatment is performed on the surface of the mask 61 after the mask 61 is formed here, a liquid-repellent composition may be formed over the semiconductor layer 32 by dripping of the liquid-repellent composition by using an ink-jet method, instead. A dashed line 60a indicates the mask 60 before ashing is performed.

As an example of a liquid-repellent composition, an organic resin including a fluorocarbon chain (fluorine-based resin) may be used. The fluorine-based resin may be polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE-PDD), polyvinyl fluoride (PVF; fluorinated vinyl resin), or the like.

As an example of a liquid-repellent composition, organic silane represented by a chemical formula: $Rn—Si—X_{(4-n)}$ (n=1, 2, 3) may be used. In this formula, R denotes a group which is comparatively inactive, such as a fluoro alkyl group and an alkyl group; and X denotes a hydrolysis group such as halogen, a methoxy group, an ethoxy group, or an acetoxy group, which is capable of coupling with a hydroxyl group or absorbed water over the surface of a substrate by condensation reaction.

As an example of organic silane, fluoroalkylsilane (hereinafter, also referred to as FAS) having a fluoroalkyl group as R may be used. The fluoroalkyl group R of FAS has a structure of $(CF_3)(CF_2)_x(CH_2)_y$, where x is an integer from 0 to 10 and y is an integer from 0 to 4. When a plurality of Rs or Xs are coupled with Si, all of the Rs or Xs may be the same or different. As a typical example of FAS, there are fluoroalkylsilane (FAS) such as heptadecafluorotetrahydrodecyltriethoxysilane, heptadecafluorotetrahydrodecyltrichlorosilane, tridecafluorotetrahydrooctyltrichlorosilane, and trifluoropropyltrimethoxysilane.

As another example of organic silane, alkoxysilane having an alkyl group as R may be employed. As the alkoxysilane, alkoxysilane having a carbon number of 2 to 30 is preferably used. Typically, ethyltriethoxysilane, propyltriethoxysilane, octyltriethoxysilane, decyltriethoxysilane, octadecyltriethoxysilane (ODS), eicosyltriethoxysilane, and triacontyltriethoxysilane are given. In particular, a silane compound having a long chain alkyl group is preferably used since wettability can be lowered.

Next, an insulating layer 62 is formed by a coating method or a printing method. Here, a composition containing an insulating material is applied or printed, then dried and baked, whereby the insulating layer 62 is formed. A material that is similar to that of the insulating layer 46 shown in FIGS. 5A and 5D can be appropriately used as a material of the insulating layer 62.

Next, the mask 61 is removed, so that the insulating layer 62 covering an end portion of the semiconductor layer 32 can be formed.

Figure 9H:
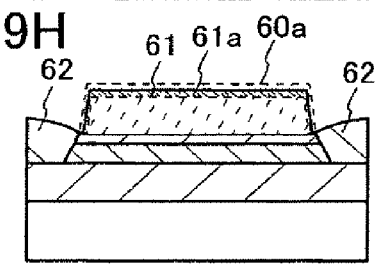
Figure 9D:
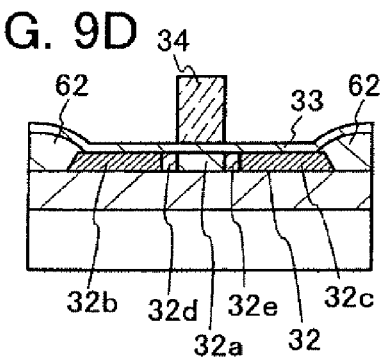
Figure 9I:
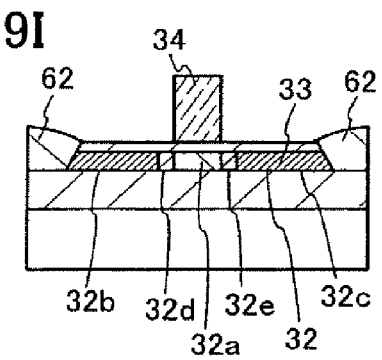

After that, as shown in FIG. 9D, an insulating layer 33 functioning as a gate insulating film is formed over the semiconductor layer 32 and the insulating layer 36, and a conductive layer 34 functioning as a gate electrode is formed over the insulating layer 33 functioning as a gate insulating film. Further, a channel formation region 32a that overlaps the gate electrode, high concentration impurity regions 32b and 32c, and low concentration impurity regions 32d and 32e are formed in the semiconductor layer 32.

Figure 9E:
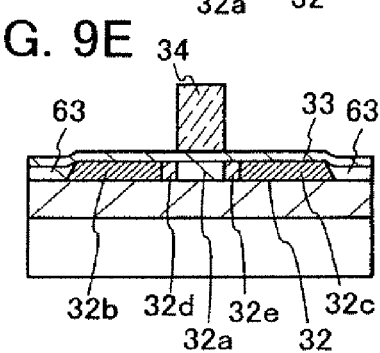

Although the insulating layer 62 is convex upward with respect to the substrate surface, an insulating layer 63 that is convex downward with respect to the substrate surface may be formed as shown in FIG. 9E. The shapes of the insulating layers 62 and 63 can be appropriately selected depending on the concentration, viscosity, or the like of the compositions forming the insulating layers 62 and 63.

Next, a mode in which a process different from that of FIGS. 9A to 9E is used will be described with reference to FIGS. 9F to 9I.

As shown in FIG. 9F, an insulating layer 31 is formed over a substrate 30, and a semiconductor layer 59 is formed over the insulating layer 31. Next, an insulating layer 33 functioning as a gate insulating film is formed over the semiconductor layer 59, and then a mask 60 is formed over the insulating layer 33.

Next, as shown in FIG. 9G, the semiconductor layer 59 and the insulating layer 33 are etched using the mask 60, so that a semiconductor layer 32 and an insulating layer 33C are formed.

Next, as shown in FIG. 9H, the mask 60 is etched or removed by ashing so that the mask 60 is formed into a mask 61 which is a little smaller in size than the mask 60, then, liquid repellent treatment is performed on a surface of the mask 61 so as to form a liquid-repellent layer 61a. Next, an insulating layer 62 covering an end portion of the semiconductor layer 32 with the insulating layer 33c interposed therebetween is formed by a coating method or a printing method. Then, the mask 61 is removed.

After that, in a similar manner to FIG. 9E, a conductive layer 34 functioning as a gate electrode is formed; then, a channel formation region 32a that overlaps the gate electrode, high concentration impurity regions 32b and 32c, and low concentration impurity regions 32d and 32e are formed in the semiconductor layer 32.

In the above-described manners, a thin film transistor in which a leak current between the semiconductor layer and the gate electrode is suppressed can be manufactured.

Next, a process of forming an insulating layer covering an end portion of a semiconductor layer without using a mask will be described with reference to FIGS. 10A to 10G and 11A to 11C.

Figure 10A:
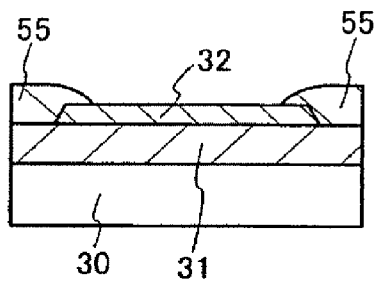
FIGS. 10A to 10G are cross-sectional views for describing a manufacturing process of a semiconductor device of the present invention.

As shown in FIG. 10A, an insulating layer 31 is formed over a substrate 30, and a semiconductor layer 32 is formed over the insulating layer 31. Subsequently, an insulating layer 55 is formed on each of both sides of the semiconductor layer 32 and over the substrate 30. Here, a composition containing a material for forming an insulating layer is selectively formed by an ink-jet method or a printing method, whereby the insulating layer 55 covering an end portion of the semiconductor layer 32 can be formed.

Figure 10B:
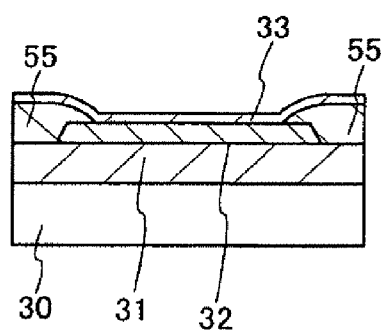

Next, as shown in FIG. 10B, an insulating layer 33 functioning as a gate insulating film is formed over the semiconductor layer 32 and the insulating layer 55.

Figure 10C:
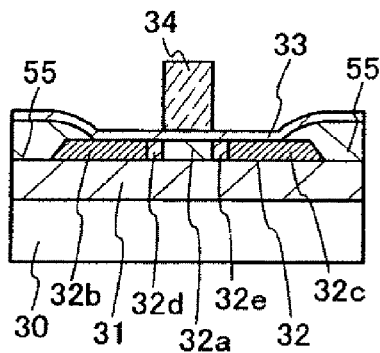

Subsequently, as shown in FIG. 10C, a conductive layer 34 functioning as a gate electrode is formed over the insulating layer 33 functioning as a gate insulating film. Further, a channel formation region 32a that overlaps the gate electrode, high concentration impurity regions 32b and 32c, and low concentration impurity regions 32d and 32e are formed in the semiconductor layer 32.

Figure 10D:
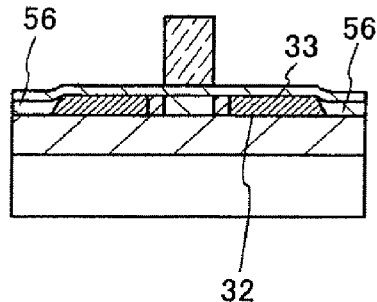

Although the insulating layer 55 is convex upward with respect to the substrate surface, an insulating layer 56 that is convex downward with respect to the surface of the substrate 30 may be formed as shown in FIG. 10D. The shapes of the insulating layers 55 and 56 can be appropriately selected depending on the concentration, viscosity, or the like of the compositions forming the insulating layers 55 and 56.

Next, a mode in which a process different from that of FIGS. 10A to 10D is used will be described with reference to FIGS. 10E to 10G.

Figure 10E:
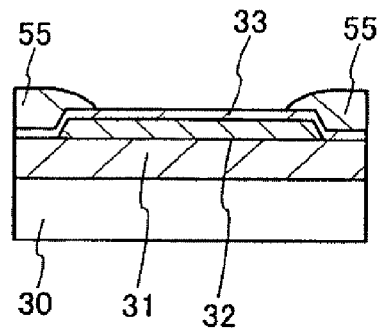
Figure 10F:
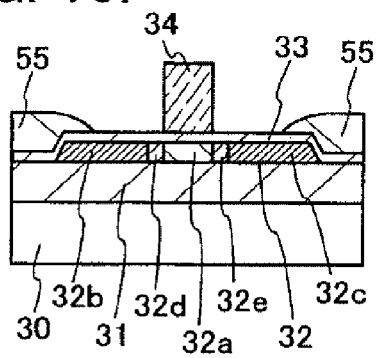

As shown in FIG. 10E, an insulating layer 31 is formed over a substrate 30, and a semiconductor layer 32 is formed over the insulating layer 31. Then, after an insulating layer 33 functioning as a gate insulating film is formed over the semiconductor layer 32, an insulating layer 55 is formed over each of both sides of the semiconductor layers 32 and on the insulating layer 33.

After that, in a similar way to FIG. 10D, a conductive layer 34 functioning as a gate electrode is formed; then, a channel formation region 32a that overlaps the gate electrode, high concentration impurity regions 32b and 32c, and low concentration impurity regions 32d and 32e are formed in the semiconductor layer 32.

Figure 10G:
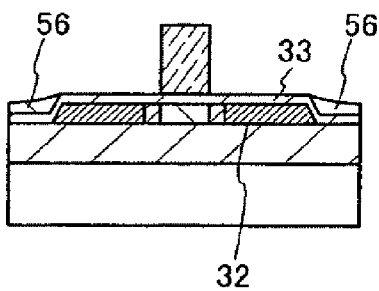

Although the insulating layer 55 is convex upward with respect to the substrate surface, an insulating layer 56 that is convex downward with respect to the surface of the substrate 30 may be formed as shown in FIG. 10G.

In the above-described manners, a thin film transistor in which a leak current between the semiconductor layer and the gate electrode is suppressed can be manufactured.

A process of forming an insulating layer covering an end portion of a semiconductor layer without using a mask, which is different from the above-described process, will be described with reference to FIGS. 11A to 11C.

Figure 11A:
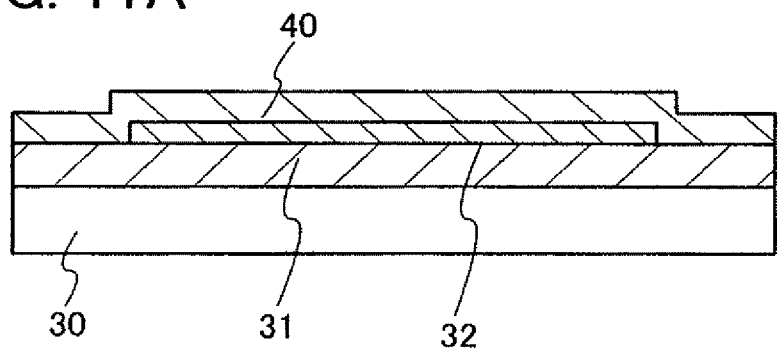
FIGS. 11A to 11C are cross-sectional views for describing a manufacturing process of a semiconductor device of the present invention.

As shown in FIG. 11A, an insulating layer 31 is formed over a substrate 30, and a semiconductor layer 32 is formed over the insulating layer 31. Here, it is preferable that a side surface of an end portion of the semiconductor layer 32 be perpendicular or at an angle of greater than or equal to 85° and less than or equal to 95° to a surface of the substrate 30. In this manner, an insulating layer 69 to be formed later can be formed with an increased yield. Then, an insulating layer 40 is formed over the semiconductor layer 32. Here, it is preferable that the film thickness of the insulating layer 40 be 1.5 to 3 times the film thickness of the semiconductor layer 32. The insulating layer 40 is formed using silicon oxide or silicon oxynitride by a plasma CVD method.

Figure 11B:
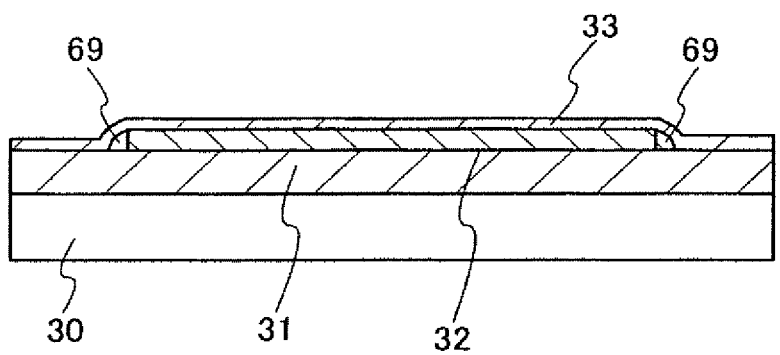

Next, the insulating layer 40 is selectively etched by anisotropic etching mainly in a direction perpendicular to the substrate, so that an insulating layer 69 which is in contact with the side surface of the semiconductor layer 32 as shown in FIG. 11B can be formed. Through this method, the insulating layer 69 covering an edge formed by the side surface of the semiconductor layer 32 and the insulating layer 31, without covering an edge formed by the side surface and top surface of the semiconductor layer 32, can be formed.

Next, as shown in FIG. 11B, an insulating layer 33 functioning as a gate insulating film is formed over the semiconductor layer 32 and the insulating layer 69.

Figure 11C:
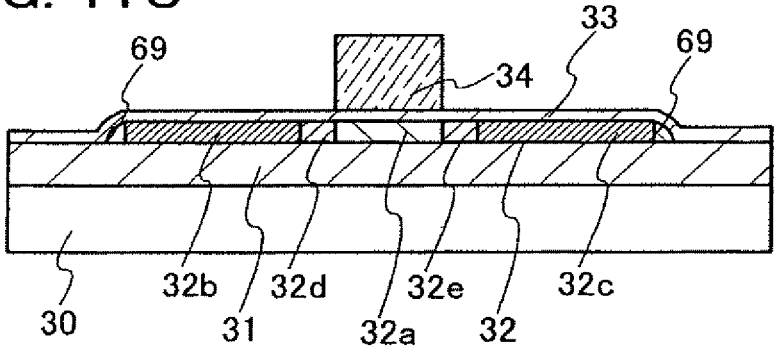

Next, as shown in FIG. 11C, a conductive layer 34 functioning as a gate electrode is formed over the insulating layer 33 functioning as a gate insulating film. Further, a channel formation region 32a that overlaps the gate electrode, high concentration impurity regions 32b and 32c, and low concentration impurity regions 32d and 32e are formed in the semiconductor layer 32.

It is to be noted that the low concentration impurity regions 32d and 32e are formed if necessary.

In the above-described manners, a thin film transistor in which a leak current between the semiconductor layer and the gate electrode is suppressed can be manufactured.

Embodiment Mode 2

In this embodiment mode, a structure of a semiconductor element in which a leak current of a gate voltage caused by a decrease in coverage of a gate insulating film in an end portion of a semiconductor layer is suppressed, and a manufacturing method thereof will be provided. In the description here, a thin film transistor is used as the semiconductor element.

Figure 12A:
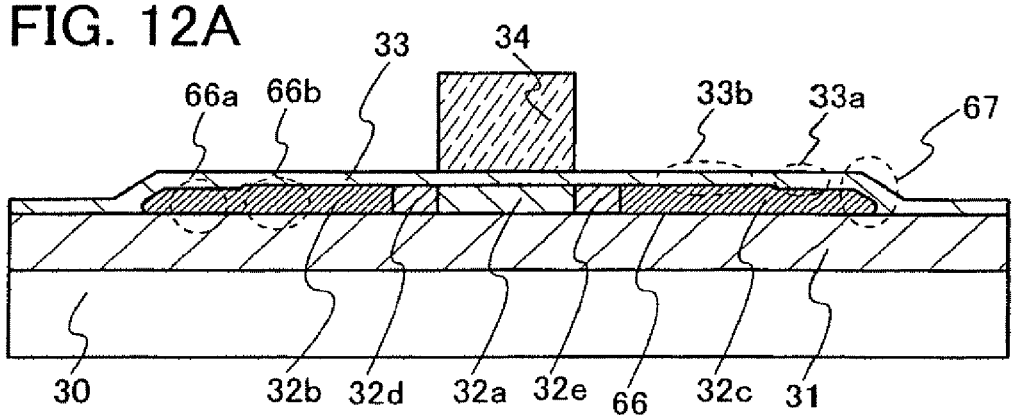
FIGS. 12A to 12C are cross-sectional views for describing a manufacturing process of a semiconductor device of the present invention.

FIG. 12A is a cross-sectional view for describing a main structure of a semiconductor device of the present invention. FIG. 12A shows a cross section of a thin film transistor, specifically; and FIGS. 12B and 12C each show an enlarged view of an end portion 67 of a semiconductor layer, specifically, in a manufacturing process of FIG. 12A.

This thin film transistor is formed over a substrate 30 having an insulating surface. Further, an insulating layer 31 is formed between the substrate 30 and the thin film transistor. The thin film transistor includes a semiconductor layer 66, an insulating layer 33 functioning as a gate insulating film, and a conductive layer 34 functioning as a gate electrode. In addition, the semiconductor layer 66 includes a channel formation region 32a, high concentration impurity regions 32b and 32c, and low concentration impurity regions 32d and 32e.

A feature of the semiconductor layer 66 described in this embodiment mode is that the semiconductor layer 66 has a region 66a having a first film thickness and a region 66b having a second film thickness that is thicker than the first film thickness, in a region other than side surfaces. In addition, a feature of the insulating layer 33 functioning as a gate insulating film is that the insulating layer 33 has a region 33a having a third film thickness and a region 33b having a fourth film thickness that is thinner than the third film thickness. It is to be noted that the region 66a having the first film thickness of the semiconductor layer 66 and the region 33a having the third film thickness of the insulating layer 33 are in contact with the side surface of the semiconductor layer 66. In this way, a thick enough thickness of the insulating layer can be ensured around the side surface of the semiconductor layer 66; therefore, generation of a leak current between the semiconductor layer 66 and the conductive layer 34 functioning as a gate electrode can be suppressed.

Next, a formation method of the semiconductor layer and the insulating layer described in this embodiment mode will be described with reference to FIGS. 12B and 12C.

Figure 12B:
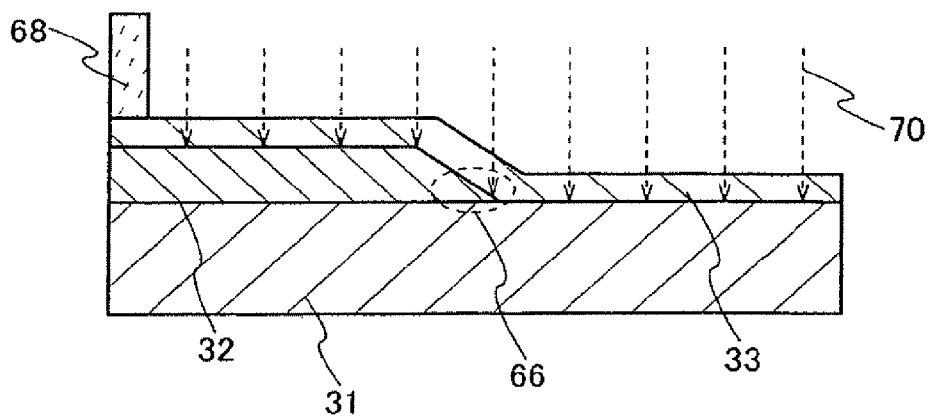

As shown in FIG. 12B, the insulating layer 31 is formed over the substrate 30, and the semiconductor layer 66 is formed over the insulating layer 31. Here, it is preferable that the side surface of the semiconductor layer 66 be inclined at an angle of greater than or equal to 30° and less than 80°, more preferably at an angle of greater than or equal to 45° and less than or equal to 60°. When shaped in this manner, the side surface of the semiconductor layer 66 can be irradiated with plasma efficiently later, and the film thickness of the insulating layer around the side surface of the semiconductor layer 66 can be made thick. Next, the insulating layer 33 is formed over the semiconductor layer 32.

Subsequently, a mask 68 is formed over the insulating layer 33. It is preferable that the mask 68 be formed so as to cover a portion to be a channel formation region of the semiconductor layer. Next, a portion of the semiconductor layer 66 is oxidized by solid-phase oxidation or nitrided by solid-phase nitridation by high density plasma treatment using an apparatus as described in Embodiment Mode 1 and shown in FIG. 23 so as to form an insulating layer. The insulating layer formed by oxidation or nitridation using such plasma treatment has high withstand voltage and is dense and highly reliable.

Figure 12C:
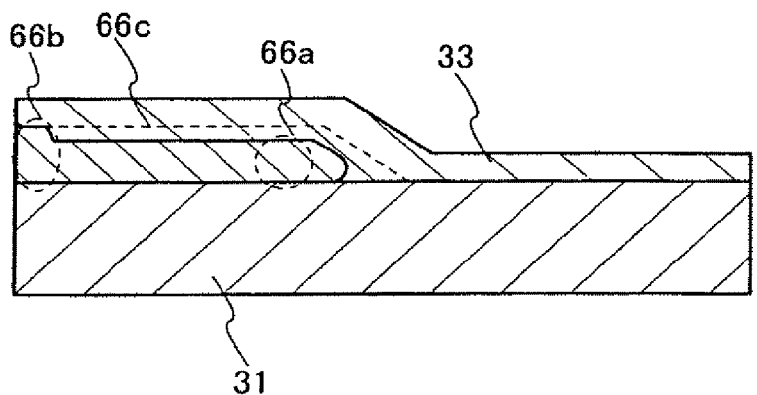

As a result, as shown in FIG. 12C, the film thickness of a portion of the semiconductor layer, particularly in the region 66a that is in contact with the side surface of the semiconductor layer, becomes thin, and the film thickness of the insulating layer covering the portion becomes thick. It is to be noted that a dashed line 66c indicates the semiconductor layer before the high density plasma treatment is performed.

Furthermore, after phosphorus or boron is added to the semiconductor layer 66 with the use of the mask 68, plasma treatment is performed as shown in FIG. 12B, whereby an oxidation rate of the semiconductor layer 66 is accelerated. Therefore, in the region being in contact with the side surface of the semiconductor layer 66, the film thickness of the semiconductor layer 66 becomes thin and the film thickness of the insulating layer 33 covering the region becomes thick.

In the above-described manner, a thick enough thickness of the insulating layer can be ensured around the side surface of the semiconductor layer 66; therefore, generation of a leak current between the semiconductor layer 66 and the conductive layer 34 functioning as a gate electrode can be suppressed.

Embodiment Mode 3

In this embodiment mode, a structure of a semiconductor element in which a leak current of a gate voltage caused by a decrease in coverage of a gate insulating film in an end portion of a semiconductor layer can be suppressed and a manufacturing method thereof will be provided. In the description here, a thin film transistor is used as the semiconductor element.

Figure 13A:
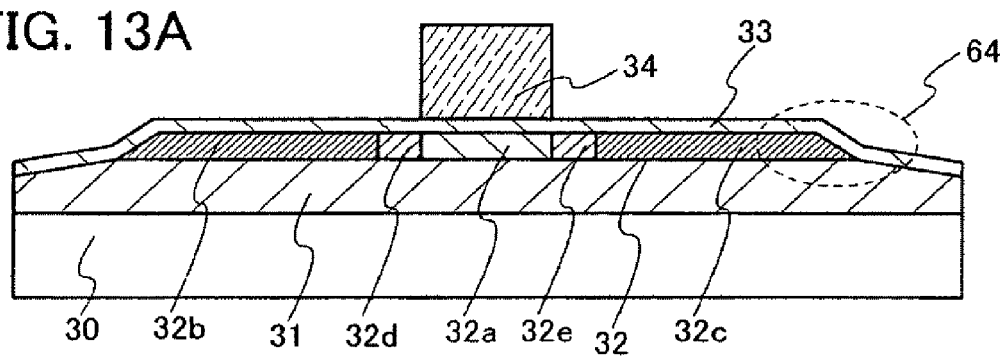
FIGS. 13A to 13C are cross-sectional views for describing a main structure of a semiconductor device of the present invention.

FIG. 13A is a cross-sectional view for describing a main structure of a semiconductor device of the present invention. FIG. 13A shows a cross section of a thin film transistor, specifically; and FIGS. 13B and 13C each show an enlarged view of an end portion 64 of a semiconductor layer in FIG. 13A. This thin film transistor is manufactured over a substrate 30 having an insulating surface. Further, an insulating layer 33 is formed between the substrate 30 and the thin film transistor. The thin film transistor includes a semiconductor layer 32, an insulating layer 33 functioning as a gate insulating film, and a conductive layer 34 functioning as a gate electrode. In addition, the semiconductor layer 32 includes a channel formation region 32a, high concentration impurity regions 32b and 32c, and low concentration impurity regions 32d and 32e.

Figure 13B:
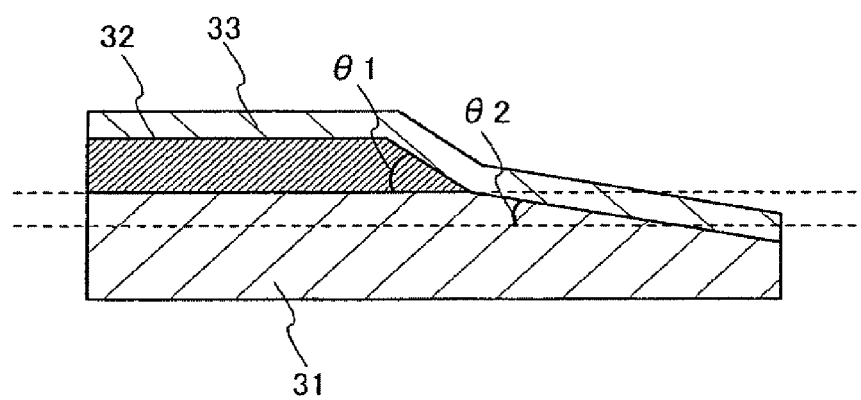

As shown in FIG. 13B, a side surface of the semiconductor layer 32 is inclined at an angle of θ1 with respect to a plane parallel to the substrate, and a surface of the insulating layer 31 functioning as a base film is inclined at an angle of θ2 with respect to the plane parallel to the substrate. θ1 is greater than or equal to 10° and less than or equal to 40°, and θ2 is greater than or equal to 5° and less than or equal to 15°. In this way, when the angle of inclination of the surface of the insulating layer 31 functioning as a base film is smaller than the angle of inclination of the side surface of the end portion of the semiconductor layer 32, an interface of the semiconductor layer 32 and the insulating layer 31 becomes smooth, and coverage of the insulating layer 33 functioning as a gate insulating film formed over the semiconductor layer 32 and the insulating layer 31 can be improved. Therefore, a leak current can be prevented from being generated between the semiconductor layer 32 and the gate electrode.

Figure 13C:
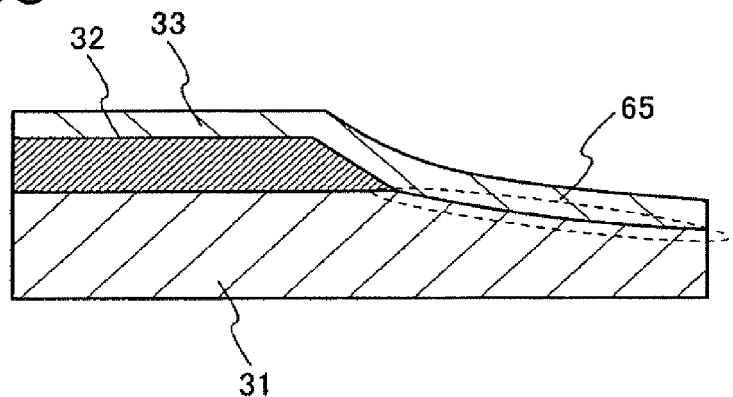

Furthermore, as shown in FIG. 13C, the surface of the insulating layer 31 functioning as a base film may be convex with respect to the substrate surface. Even with such a shape, the interface of the semiconductor layer 32 and the insulating layer 31 becomes smooth, and coverage of the insulating layer 33 functioning as a gate insulating film formed over the semiconductor layer 32 and the insulating layer 31 can be improved. Therefore, a leak current can be prevented from being generated between the semiconductor layer 32 and the gate electrode.

Embodiment Mode 4

In this embodiment mode, an example of a semiconductor element to which a structure capable of reducing a leak current between a gate electrode and a semiconductor layer as described in the above-described embodiment modes will be described. Although an example in which the structure described in Embodiment Mode 1 is applied will be described in this embodiment mode, Embodiment Modes 2 and 3 may also be appropriately applied.

Figure 14A:
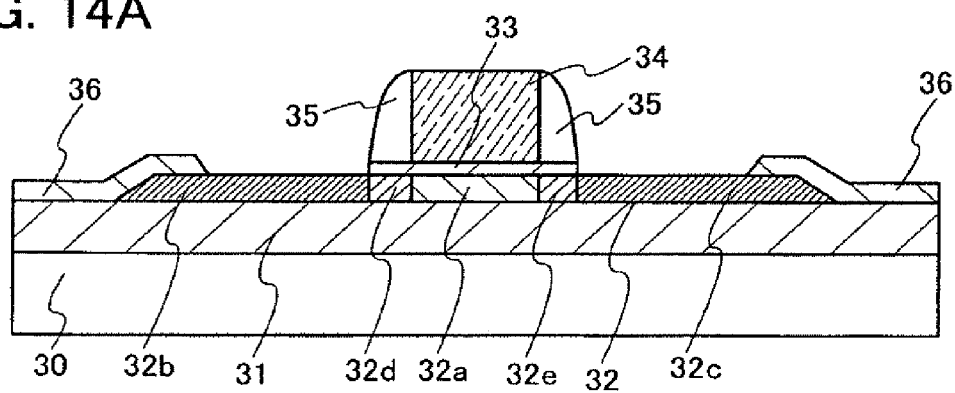
FIGS. 14A to 14C are cross-sectional views for describing a main structure of a semiconductor device of the present invention.
Figure 14B:
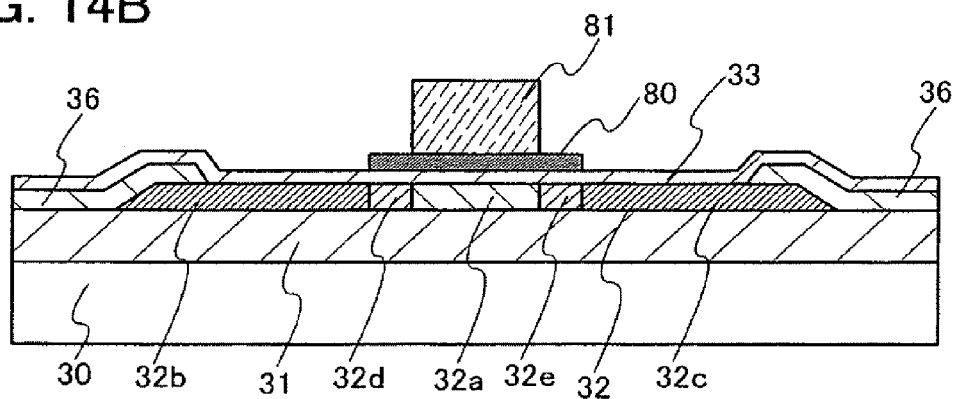
Figure 14C:
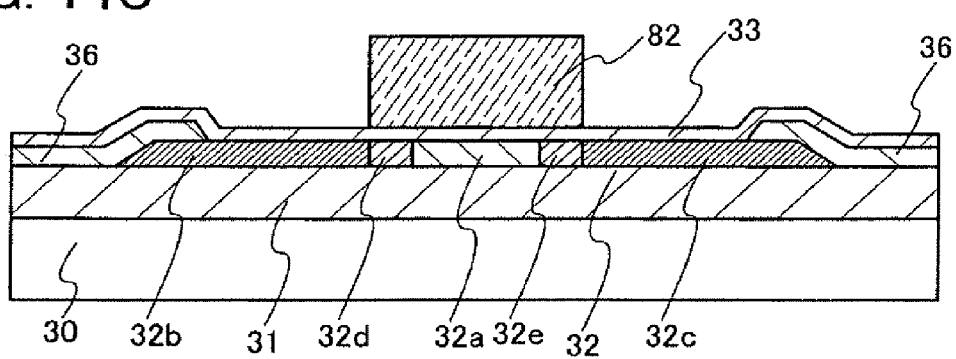

In FIGS. 14A to 14C, a structure of a thin film transistor to which the structure capable of suppressing a leak current between a gate electrode and a semiconductor layer is applied is shown.

As shown in FIG. 14A, spacers 35 may be formed on side surfaces of a conductive layer 34 functioning as a gate electrode. Furthermore, with the use of the spacer 35, a low concentration impurity region 32d or 32e can be formed on each side of the conductive layer 34 functioning as a gate electrode, in a channel length direction. The low concentration impurity regions 32d and 32e function as lightly doped drains (LDD). Through the provision of the low concentration impurity regions 32d and 32e, an electric field in the drain edge can be lowered, and deterioration caused by repeated writing and erasing can be suppressed.

The spacers 35 can be selectively formed on the side surfaces of the conductive layer 34 in the following way: an insulating layer which is 1.5 to 3 times as thick as the conductive layer 34 is formed over the insulating layer 33 and the conductive layer 34 by a CVD method, a sputtering method, or the like, and then, the insulating layer is etched by anisotropic etching.

Alternatively, as shown in FIG. 14B, a structure in which the conductive layer functioning as a gate electrode is formed of stacked conductive layers and one of the conductive layers is larger than the other conductive layer may be employed. In other words, one of the stacked conductive layers may be extended outward. Here, an example in which the area of a conductive layer 80 on a side being in contact with the insulating layer 33 functioning as a gate insulating film is larger than the area of a conductive layer 81 formed thereover is shown. It is to be noted that the conductive layer 81 may be larger than the conductive layer 80, without limited thereto. Regions of the conductive layer 80 which are formed outside of the conductive layer 81 overlap the low concentration impurity regions 32d and 32e with the insulating layer 33 interposed therebetween. When the conductive layers 80 and 81 functioning as a gate electrode are formed in this way, an impurity can be added to the semiconductor layer, passing through the regions of the conductive layer 80 which are formed outside of the conductive layer 81. In other words, through a step of adding the impurity, a channel formation region 32a, high concentration impurity regions 32b and 32c, and the low concentration impurity regions 32d and 32e can be formed in the semiconductor layer 32 at the same time. Therefore, the throughput can be improved.

Further alternatively, as shown in FIG. 14C, a structure in which a conductive layer 82 functioning as a gate electrode covers low concentration impurity regions 32d and 32e in a semiconductor layer 32 may be employed. As for a thin film transistor with such a structure, a low-concentrated impurity is added to the semiconductor layer 32 before the conductive layer 82 functioning as a gate electrode is formed, and after the low concentration impurity regions 32d and 32e are formed, the conductive layer 82 functioning as a gate electrode is formed. Next, an impurity is added to the semiconductor layer 32 at a high concentration using the conductive layer 82 as a mask. In this way, the thin film transistor can be formed.

Further alternatively, although not shown, a thin film transistor with a single drain structure in which the semiconductor layer 32 includes a channel formation region 32a and high concentration impurity regions 32b and 32c, not low concentration impurity regions, may be formed. As for such a thin film transistor, a step of forming low concentration impurity regions is not required; therefore, the throughput can be improved.

Next, a structure of a nonvolatile memory element to which a structure capable of reducing a leak current between a gate electrode and a semiconductor layer is applied will be described with reference to FIGS. 15A to 15D.

Figure 15A:
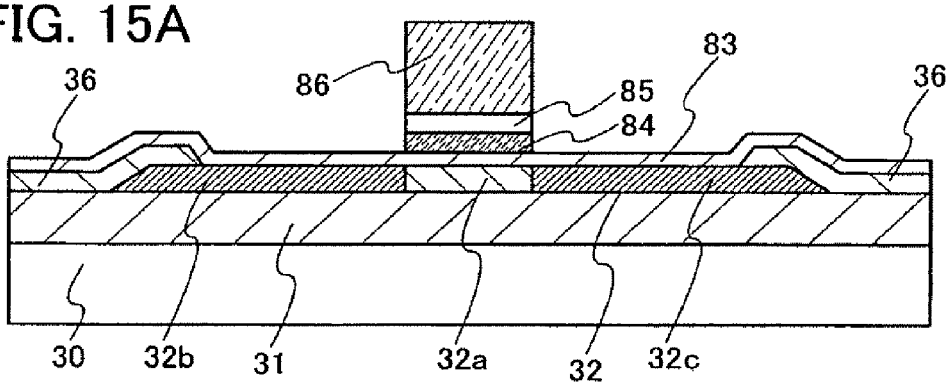
FIGS. 15A to 15D are cross-sectional views for describing a main structure of a semiconductor device of the present invention.

A nonvolatile memory element shown in FIG. 15A includes: an insulating layer 83 functioning as a tunnel oxide film formed over a semiconductor layer 32; and a charge accumulation layer 84, an insulating layer 85 functioning as a control insulating film, and a conductive layer 86 functioning as a gate electrode formed over the insulating layer 83. Further, ends of the charge accumulation layer 84 and ends of the conductive layer 86 functioning as a gate electrode are aligned. In addition, this nonvolatile memory element has a single drain structure in which the semiconductor layer 32 includes a channel formation region 32a and high concentration impurity regions 32b and 32c, not low concentration impurity regions. As for such a nonvolatile memory element, a step of forming low concentration impurity regions is not required; therefore, the throughput can be improved.

The insulating layer 83 functioning as a tunnel oxide film is used as a tunnel insulating layer for injecting charges into the charge accumulation layer 84. The insulating layer 83 can be formed using a material and a formation method similar to those of the insulating layer 33 functioning as a gate insulating film described in Embodiment Mode 1. Typically, the insulating layer 83 can be formed of silicon oxide, a stacked structure of silicon oxide and silicon nitride, or the like. Alternatively, the insulating layer may be formed by performing high density plasma treatment on a surface of the semiconductor layer 32 using the apparatus shown in FIG. 23 so as to oxidize the surface of the semiconductor layer 32. Further alternatively, the insulating layer may be formed in the following way: an insulating layer is formed using silicon oxide by a plasma CVD method, and after that, plasma treatment using the apparatus shown in FIG. 23 is performed so as to oxidize or nitride the surface. In this case, when the surface of silicon oxide is nitrided, a nitrogen plasma treatment layer with a high concentration of nitrogen is provided on the surface or near the surface of the silicon oxide layer. It is to be noted that "near the surface" refers to a depth of approximately 0.5 nm to 1.5 nm from the surface of the silicon oxide layer. For example, by performing plasma treatment in a nitrogen atmosphere, a structure in which nitrogen is contained at a rate of 20 to 50 atomic % at a depth of approximately 1 nm from the surface of the silicon oxide layer is obtained.

In the case where the charge accumulation layer described later is a floating gate formed of a conductive layer or a semiconductor layer, it is preferable that the insulating layer 83 be formed with a thickness of 3 nm to 6 nm. For example, in the case where the gate length is 600 nm, the insulating layer 83 can be formed with a thickness of 3 nm to 6 nm. Alternatively, in the case where the charge accumulation layer described later is formed of an insulating layer, it is preferable that the insulating layer 83 be formed with a thickness of 1 nm to 10 nm, more preferably 1 nm to 5 nm. For example, in the case where the gate length is 600 nm, the insulating layer 83 can be formed with a thickness of 1 nm to 3 nm.

The charge accumulation layer 84 can be a floating gate formed of a layer or particles of a semiconductor material or conductive material. As the semiconductor material, silicon, silicon germanium, or the like can be given. When silicon is used, amorphous silicon or polysilicon can be used. Further, polysilicon doped with phosphorus can also be used. As the conductive material, an element selected from tantalum (Ta), titanium (Ti), molybdenum (Mo), and tungsten (W); an alloy containing the above element as its main component; an alloy film in which the above elements are combined (typically, an Mo—W alloy film or an Mo—Ta alloy film); or a silicon film provided with conductivity can be used. Under the conductive layer formed of such a material, a nitride such as tantalum nitride (TaN), tungsten nitride (WN), titanium nitride (TiN), or molybdenum nitride (MoN); or a silicide such as tungsten silicide, titanium silicide, or molybdenum silicide may be formed. Furthermore, a stacked structure of the above-described semiconductor materials, conductive materials, or the semiconductor material and the conductive material may be employed. For example, a stacked structure of a silicon layer and a germanium layer may be used.

Alternatively, the charge accumulation layer 84 may be formed as an insulating layer having a trap that holds charges. As a typical example of such materials, a silicon compound or a germanium compound can be given. As the silicon compound, silicon nitride, silicon oxynitride, silicon oxynitride to which hydrogen is added, or the like can be given. As the germanium compound, germanium nitride, germanium nitride to which oxygen is added, germanium oxide to which nitrogen is added, germanium nitride to which oxygen and hydrogen are added, germanium oxide to which nitrogen and hydrogen are added, or the like can be given.

As the insulating layer 85 functioning as a control insulating film, a layer or a plurality of layers of silicon oxide, silicon nitride, silicon oxynitride, aluminum oxide, or the like are formed by a low pressure CVD method, a plasma CVD method, or the like. The insulating layer 85 is formed with a thickness of 1 nm to 20 nm, preferably 5 nm to 10 nm. For example, a stack formed by depositing a silicon nitride layer with a thickness of 3 nm and a silicon oxide layer with a thickness of 5 nm can be used.

For the conductive layer 86 functioning as a gate electrode, the material and formation method of the conductive layer 34 functioning as a gate electrode described in Embodiment Mode 1 can be appropriately used.

Figure 15B:
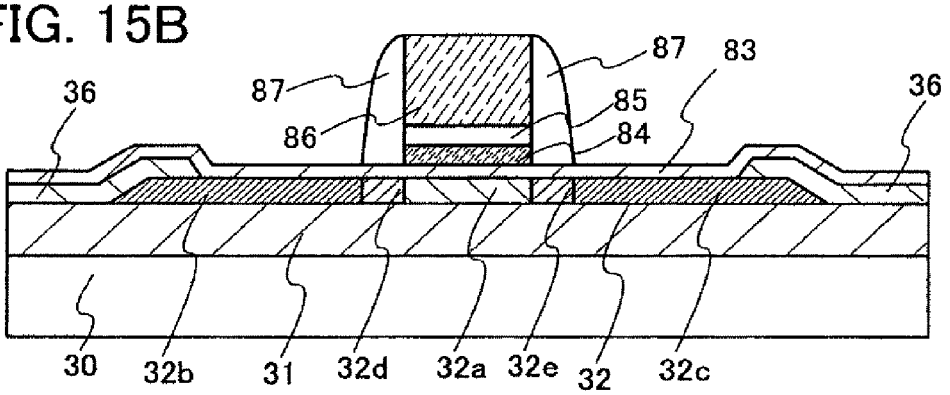

Furthermore, as shown in FIG. 15B, masks 87 may be formed on side surfaces of the charge accumulation layer 84, the insulating layer 85 functioning as a control insulating film, and the conductive layer 86 functioning as a gate electrode. It is to be noted that the masks 87 may be formed on side surfaces of the insulating layer 83 functioning as a tunnel oxide film, the charge accumulation layer 84, the insulating layer 85 functioning as a control insulating film, and the conductive layer 86 functioning as a gate electrode. In addition, the masks 87 overlap the low concentration impurity regions 32d and 32e with the insulating layer 83 interposed therebetween.

Figure 15C:
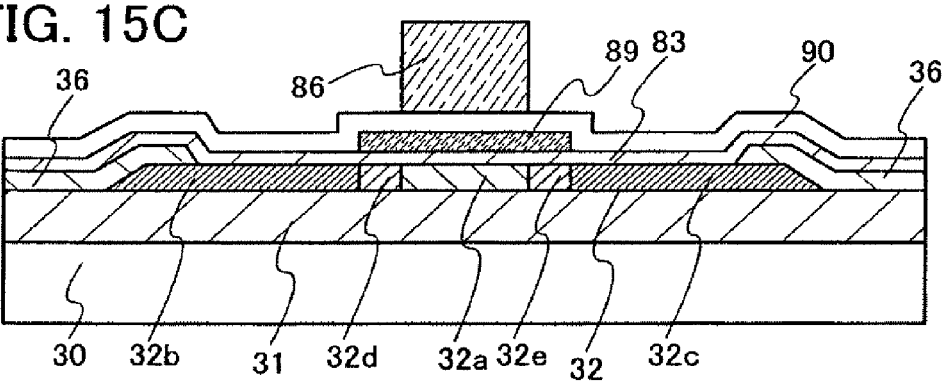

Alternatively, as shown in FIG. 15C, a structure in which the charge accumulation layer 89 is larger compared to the conductive layer 86 functioning as a gate electrode may be employed. In other words, the charge accumulation layer 89 may be extended outward. Regions of the charge accumulation layer 89 which are formed outside of the conductive layer 86 overlap the low concentration impurity regions 32d and 32e with the insulating layer 33 interposed therebetween. When the charge accumulation layer 89 and the conductive layer 86 functioning as a gate electrode are formed in this way, an impurity can be added to the semiconductor layer, passing through the regions of the charge accumulation layer 89 which are formed outside of the conductive layer 86. In other words, through a step of adding the impurity, a channel formation region 32a, high concentration impurity regions 32b and 32c, and the low concentration impurity regions 32d and 32e can be formed in the semiconductor layer 32 at the same time. Therefore, the throughput can be improved.

Figure 15D:
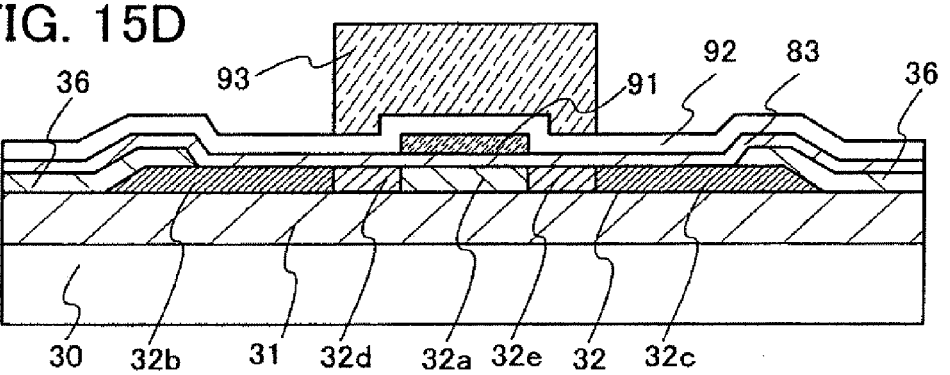

Further alternatively, as shown in FIG. 15D, a charge accumulation layer 91 may be smaller than a conductive layer 93 functioning as a gate electrode. As for a thin film transistor with such a structure, a low-concentrated impurity is added to the semiconductor layer 32 before the conductive layer 93 functioning as a gate electrode is formed, and after the low concentration impurity regions 32d and 32e are formed, the conductive layer 93 functioning as a gate electrode is formed. Next, an impurity is added to the semiconductor layer 32 at a high concentration using the conductive layer 93 as a mask. In this way, the thin film transistor is formed.

Figure 16:
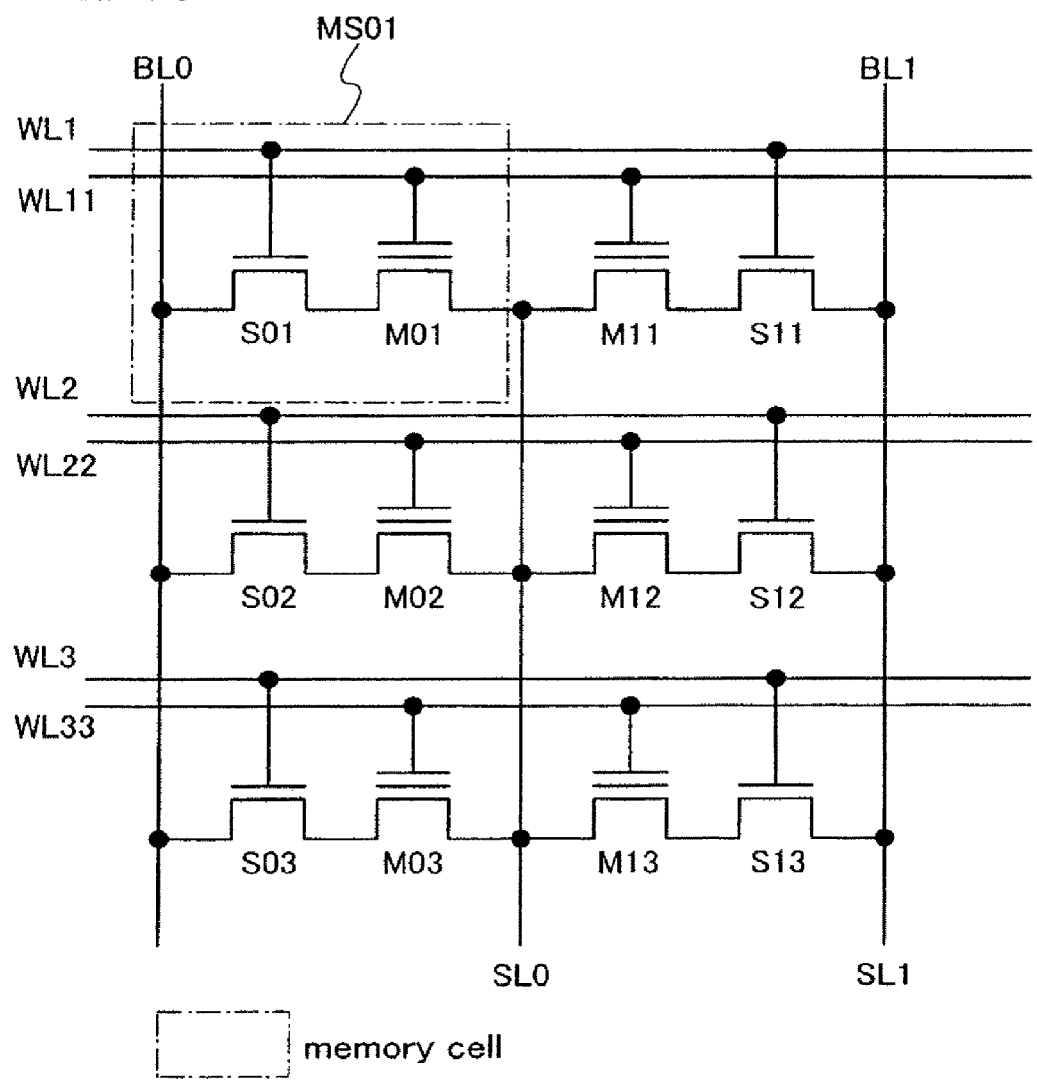
FIG. 16 is a diagram showing an example of an equivalent circuit of a nonvolatile memory cell array.

Nonvolatile semiconductor memory devices with various modes can be obtained using such nonvolatile memory elements. An example of an equivalent circuit of a nonvolatile memory cell array is shown in FIG. 16. A memory cell MS01 which stores 1-bit data includes a selecting transistor S01 and a nonvolatile memory element M01. The selecting transistor S01 is disposed in series between a bit line BL0 and the nonvolatile memory element M01, and a gate thereof is connected to a word line WL1. A gate of the nonvolatile memory element M01 is connected to a word line WL11. When data is written into the nonvolatile memory element M01, potentials of the word line WL1 and the bit line BL0 are set at H level while a potential of a bit line BL1 is set at L level, and a high voltage is applied to the word line WL11, so that charges are accumulated in a charge accumulation layer as described above. When data is to be erased, the potentials of the word line WL1 and the bit line RIM may be set at H level while a high voltage of negative polarity may be applied to the word line WL11.

In this memory cell MS01, the selecting transistor S01 and the nonvolatile memory element M01 are each formed of an island-shaped semiconductor layer separated from each other over an insulating surface; therefore, interference with the other selecting transistor or nonvolatile memory element can be prevented even if an element separation region is not provided. In addition, both the selecting transistor S01 and the nonvolatile memory element M01 in the memory cell MS01 are of an n-channel type; therefore, when both of them are formed of an island-shaped semiconductor layer separated from the other, a wiring connecting these two elements can be omitted.

Figure 17:
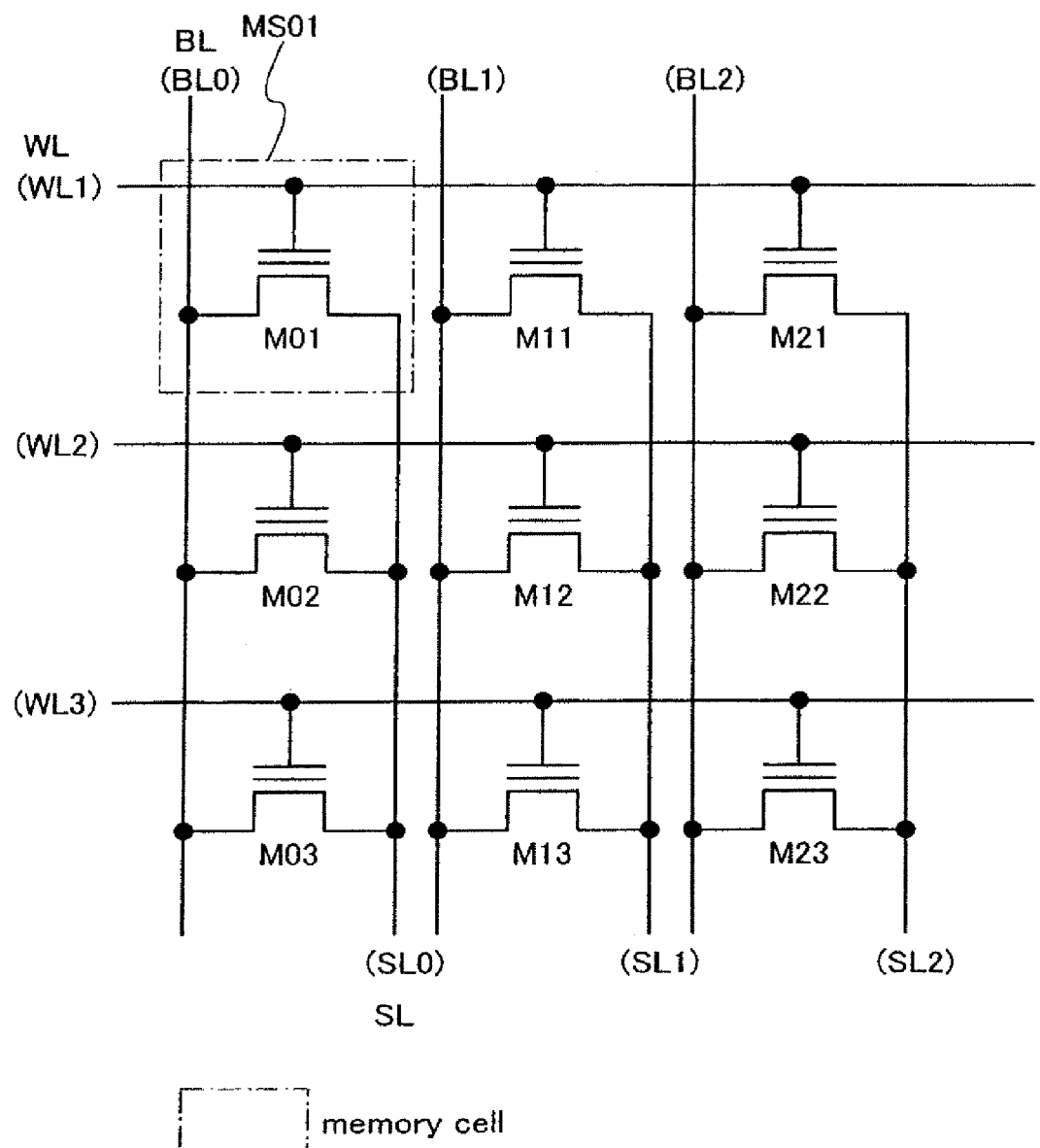
FIG. 17 is a diagram showing an example of an equivalent circuit of a NOR-type nonvolatile memory cell array.

FIG. 17 shows an equivalent circuit of a NOR type in which a nonvolatile memory element is directly connected to a bit line. In this memory cell array, word lines WL and bit lines BL are disposed so as to cross each other, and the nonvolatile memory element is disposed at each intersection. In the case of a NOR type, drains of the nonvolatile memory elements are connected to the bit lines BL. Sources of the nonvolatile memory elements are connected to the source lines SL in common.

In this case also, in the memory cell MS01, the nonvolatile memory element M01 is formed of an island-shaped semiconductor layer separated from each other over an insulating surface; therefore, interference with the other nonvolatile memory element can be prevented even if an element separation region is not provided. In addition, a plurality of nonvolatile memory elements (for example, M01 to M23 shown in FIG. 17) are treated as one block, and these nonvolatile memory elements are formed of an island-shaped semiconductor layer separated from the other; therefore, an erasing operation of one block can be performed at the same time.

Operations of the NOR type are, for example, as follows. When data is written, 0 V is set at the source lines SL, a high voltage is applied to a word line WL selected for data writing, and respective potentials corresponding to data "0" and data "1" are supplied to the bit lines BL. For example, a H-level potential and a L-level potential corresponding to data "0" and data "1" respectively are supplied to the bit lines BL. In each nonvolatile memory element supplied with the H-level potential for writing data "0", hot electrons are generated near the drain, and are injected into the floating gate. Such electron injection does not occur in the case of data "1".

In a memory cell to which data "0" is supplied, hot electrons are generated near the drain by a strong lateral direction electric field between the source and the drain, and are injected into the charge accumulation layer. A state where the threshold voltage is increased by electron injection into the charge accumulation layer is "0". In the case of data "1", hot electrons are not generated and electrons are not injected into the charge accumulation layer, whereby the state where the threshold voltage is low, namely an erasing state, is kept.

When data is to be erased, a positive voltage of approximately 10 V is applied to the source lines SL, and the bit lines BL are set in a floating state. Then, a high voltage of negative polarity is applied to the word lines WL (a high voltage of negative polarity is applied to each control gate), whereby electrons are extracted from the charge accumulation layer. In this manner, the erasing state of data "1" can be obtained.

When data is to be read, whether or not current of the nonvolatile memory element has been drawn is judged by a sense amplifier connected to the bit lines BL, by setting 0 V to the source lines SL and approximately 0.8 V to the bit lines BL, and supplying a reading voltage which is set at an intermediate value between threshold values of the data "0" and the data "1" to a selected word line WL.

Figure 18:
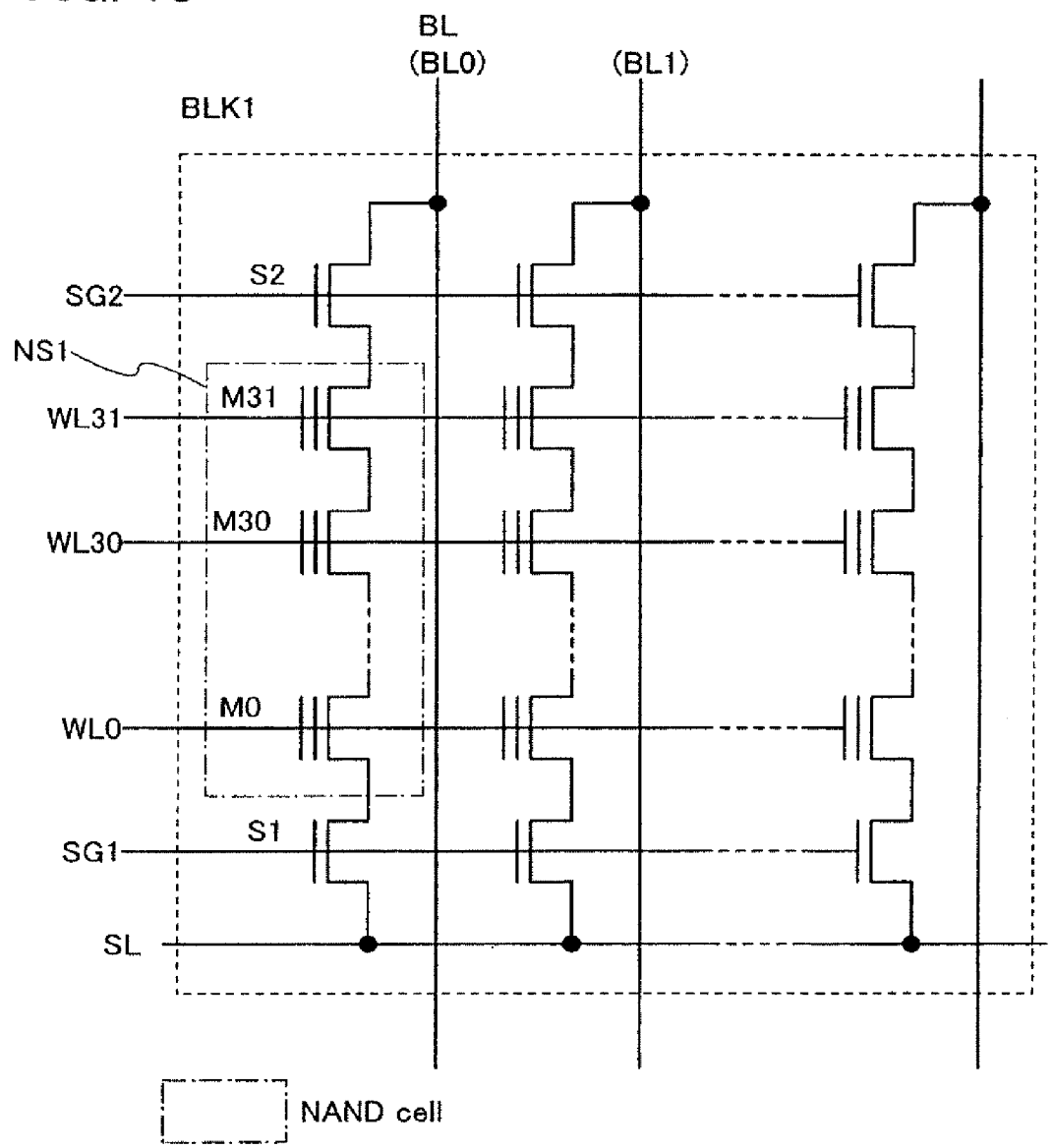
FIG. 18 is a diagram showing an example of an equivalent circuit of a NAND-type nonvolatile memory cell array.

FIG. 18 shows an equivalent circuit of a NAND type memory cell array. A NAND cell NS1 in which a plurality of nonvolatile memory elements are connected in series is connected to each bit line BL. A block BLK1 includes a plurality of NAND cells. The number of word lines in a block BLK1 shown in FIG. 18 is 32 (word lines WL0 to WL31). Nonvolatile memory elements disposed on the same row in the block BLK1 are connected to the word line corresponding to this row in common.

In this case, since the nonvolatile memory elements M0 to M31 are connected in series, these may be formed of a semiconductor layer as one group. By doing so, a wiring for connecting the nonvolatile memory elements can be omitted, which enables integration. In addition, separation from the adjacent NAND cell can be easily performed. Furthermore, the semiconductor layer for the selecting transistors S1 and S2 and the semiconductor layer for the NAND cell NS1 may be funned separately. When an erasing operation to extract charges from charge accumulation layers of the nonvolatile memory elements M0 to M31 is performed, the erasing operation of one NAND cell can be performed at the same time. In addition, nonvolatile memory elements which are commonly connected to one word line (for example, the row of M30) may be formed of one semiconductor layer.

A writing operation is carried out after the NAND cell NS1 is turned to be in the erasing state, namely the threshold value of each nonvolatile memory element in the NAND cell NS1 is turned to be in a negative voltage state. Writing is performed sequentially from a memory element M0 on the source line SL side. The writing operation will be roughly described below, using writing into the memory element M0 as an example.

In the case of writing "0", as shown in FIG. 19A, Vcc (power supply voltage), for example, is applied to a selection gate line SG2 to turn on a selecting transistor S2, and 0 V (ground voltage) is applied to a bit line BL0. 0 V is applied to a selection gate line SG1 to turn off a selecting transistor S1. Next, a high voltage Vpgm (approximately 20 V) is applied to the word line WL0 of a memory cell M0 and an intermediate voltage Vpass (approximately 10 V) is applied to the other word lines. Since the voltage of the bit line BL is 0 V, the potential of the channel formation region of the selected memory cell M0 is 0 V. Since the potential difference between the word line WL0 and the channel formation region is large, electrons are injected into the charge accumulation layer of the memory cell M0 by FN tunnel currents as described above. In this manner, the state in which the threshold voltage of the memory cell M0 is positive (the state in which "0" is written) is obtained.

In the case of writing "1", as shown in FIG. 19B, Vcc (power supply voltage), for example, is applied to the bit line BL. Since the voltage of the selection gate line SG2 is Vcc, the selecting transistor S2 is cut off in the case of Vcc-Vth (Vth is the threshold voltage of the selecting transistor S2). Consequently, the channel formation region of the memory cell M0 is made into a floating state. Next, a high voltage Vpgm (20 V) is applied to the word line WL0 while an intermediate voltage Vpass (10 V) is applied to the other word lines, so that the voltage of the channel formation region is increased from (Vcc-Vth) to, for example, approximately 8 V by capacitive coupling between each word line and each channel formation region. Since the voltage of the channel formation region is increased to such a high voltage, the potential difference between the word line WL0 and the channel formation region is small, unlike the case of writing "0". Therefore, electron injection by FN tunnel currents does not occur into the floating gate of the memory cell M0. In this manner, the state where the threshold voltage of the memory cell M0 is negative (the state in which "1" is written) is kept.

In the case of performing an erasing operation, as shown in FIG. 20A, a high voltage of negative polarity (Vers) is applied to all the word lines included in the selected block. The bit line BL and the source line SL are set in the floating state. As a result of this, electrons in the floating gate are emitted into the semiconductor layer by tunnel currents in all the memory cells in the block. Consequently, each threshold voltage of the memory cells is shifted in the negative direction.

Figure 21:
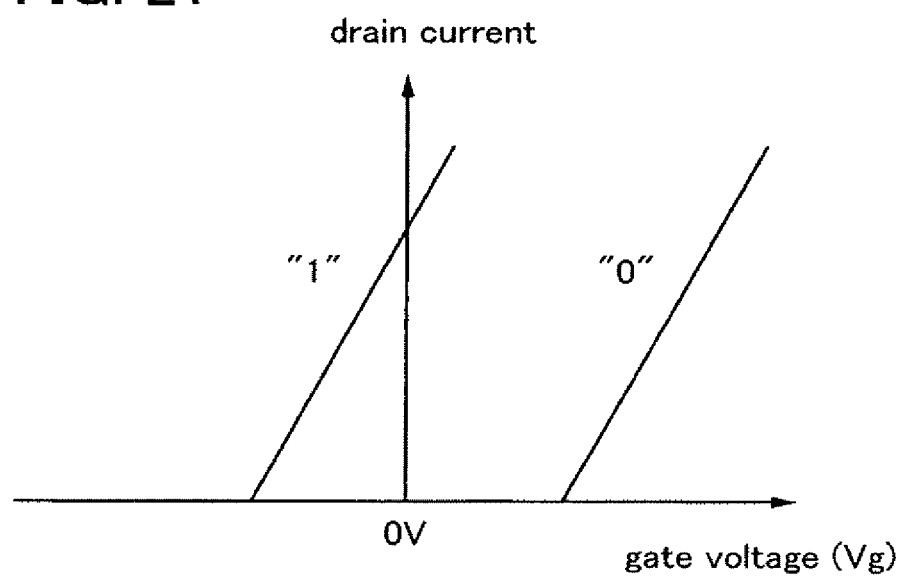
FIG. 21 is a diagram showing changes in threshold voltage of a nonvolatile memory in the case of "0" with electric charges accumulated and in the case of "1" with electric charges erased.

In a reading operation shown in FIG. 20B, a voltage Vr (e.g., 0 V) is set to the word line WL0 of the memory cell M0 selected for reading, and a reading intermediate voltage Vread which is a little higher than the power supply voltage is applied to the word lines WL1 to WL31 of unselected memory cells and the selection gate lines SG1 and SG2. That is, as shown in FIG. 21, the memory elements other than the selected memory element function as transfer transistors. In this way, whether a current flows or not through the memory cell M0 selected for reading is detected. That is, in the case where the data stored in the memory cell M0 is "0", the bit line BL does not discharge electricity since the memory cell M0 is off; whereas in the case where the data stored in the memory cell M30 is "1", the bit line BL discharges electricity since the memory cell M0 is on.

Figure 22:
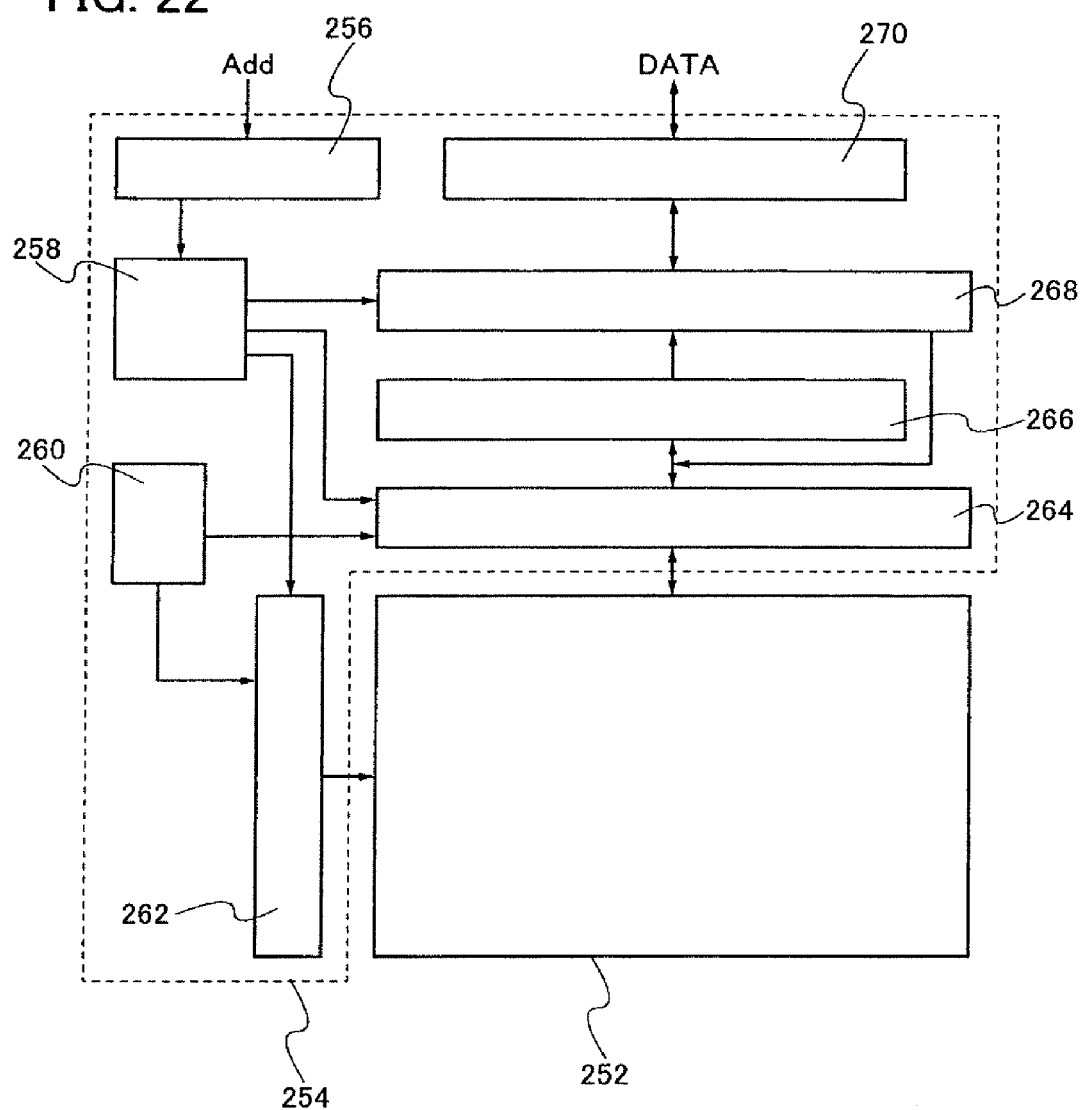
FIG. 22 is a diagram showing an example of a circuit block diagram of a nonvolatile semiconductor memory device.

FIG. 22 is one example of a circuit block diagram of a nonvolatile semiconductor memory device having the above-described memory element. In the nonvolatile semiconductor memory device, a memory cell array 252 and a peripheral circuit 254 are formed over the same substrate. The memory cell array 252 has the structure shown in FIG. 16, 17, or 18. The structure of the peripheral circuit 254 is as follows.

A row decoder 262 for selecting a word line and a column decoder 264 for selecting a bit line are provided around the memory cell array 252. An address is sent to a control circuit 258 through an address buffer 256, and an internal row address signal and an internal column address signal are transferred to the row decoder 262 and the column decoder 264, respectively.

When data is written or erased, a potential obtained by boosting a power source potential is used. For this, a boosting circuit 260 controlled in accordance with an operating mode by the control circuit 258 is provided. Outputs of the boosting circuit 260 are supplied to the word lines WL and the bit lines BL through the row decoder 262 and the column decoder 264. Data outputted from the column decoder 264 is inputted to a sense amplifier 266. Data read from the sense amplifier 266 is stored in a data buffer 268, is accessed in random manner by control of the control circuit 258, and is output through a data input/output buffer 270. Writing data is stored in the data buffer 268 once through the data input/output buffer 270, and is transferred to the column decoder 264 by control of the control circuit 258.

In this way, in the nonvolatile semiconductor memory device, in the memory cell array 252, a potential different from the power source potential needs to be used. Therefore, it is preferable that at least memory cell array 252 and the peripheral circuit 254 be electrically isolated from each other. In this case, as described in Embodiments below, when a nonvolatile memory element and a transistor of a peripheral circuit each are formed of a semiconductor layer formed over an insulating surface, isolation can be achieved easily. In this manner, a malfunction is prevented, and a nonvolatile semiconductor memory device with low power consumption can be obtained.

Hereinafter, a nonvolatile semiconductor memory device of the present invention will be described in detail by way of Embodiments. In each structure of the present invention described below, the same elements are denoted by the same reference symbols throughout the drawings, and repeated description thereof may be omitted.

Embodiment 1

This embodiment will describe one example of a nonvolatile semiconductor memory device having a nonvolatile memory element as a semiconductor device with reference to drawings. Here, in the nonvolatile semiconductor memory device, a nonvolatile memory element which constitutes a memory portion and an element such as a transistor which constitutes a logic portion, provided over the same substrate as the memory portion and performs control of the memory portion or the like, are formed at the same time.

First, a schematic diagram of the memory portion in the nonvolatile semiconductor memory device described in this embodiment is shown in FIG. 16.

In the memory portion described in this embodiment, a plurality of memory cells each including a controlling transistor S and a nonvolatile memory element M is provided. In FIG. 16, one memory cell includes a controlling transistor S01 and a nonvolatile memory element M01. Similarly, each memory cell includes a controlling transistor S02 and a nonvolatile memory element M02, a controlling transistor S03 and a nonvolatile memory element M03, a controlling transistor S11 and a nonvolatile memory element M11, a controlling transistor S12 and a nonvolatile memory element M12, or a controlling transistor S13 and a nonvolatile memory element M13.

A gate electrode of the controlling transistor S01 is connected to a word line WL1, one of a source or a drain thereof is connected to a bit line BL0, and the other of the source or the drain is connected to a source or a drain of the nonvolatile memory element M01. A gate electrode of the nonvolatile memory element M01 is connected to a word line WL11, one of the source or the drain is connected to the source or the drain of the controlling transistor S01, and the other of the source or the drain thereof is connected to a source line SL.

It is to be noted that, since a driving voltage of the controlling transistor provided in the memory portion is higher than that of a transistor provided in the logic portion, gate insulating films or the like of the transistor provided in the memory portion and the transistor provided in the logic portion are preferably formed with different thicknesses. For example, when the driving voltage is low and variations of the threshold voltage are desired to be small, a thin film transistor including a thin gate insulating film is preferably provided; whereas when the driving voltage is high and a high withstanding capability is required for the gate insulating film, a thin film transistor including a thick gate insulating film is preferably provided.

Therefore, in this embodiment, the case where a thin insulating layer is formed for the transistor in the logic portion where the driving voltage is low and variations of the threshold voltage are desired to be small whereas a thick insulating layer is formed for the transistor in the memory portion where the driving voltage is high and a high withstanding capability is required for the gate insulating film will be described with reference to drawings. It is to be noted that FIGS. 28A to 28D are top views, and FIGS. 25A to 25C, 26A to 26C, and 27A to 27C are cross-sectional views of portions between A and B, between C and D, between E and F, and between G and H in FIGS. 28A to 28D. In addition, the portions between A and B and between C and D show thin film transistors provided in the logic portion, the portion between E and F shows a nonvolatile memory element provided in the memory portion, and the portion between G and H shows a thin film transistor provided in the memory portion. Furthermore, although the case where the thin film transistor provided in the portion between A and B is of a p-channel type, the thin film transistors provided in the portions between C and D and between G and H are of an n-channel type, the nonvolatile memory element provided in the portion between E and F is of a MONOS type, and charge accumulation of the nonvolatile memory element is performed by electrons will be described in this embodiment, the nonvolatile semiconductor device of the present invention is not limited to this.

First, island-shaped semiconductor layers 104, 106, and 108 are formed over a substrate 100 with a first insulating layer 102 interposed therebetween, and a second insulating layer 111 is formed so as to cover the island-shaped semiconductor layers 104, 106, and 108. Subsequently, a mask 114 is formed over the second insulating layer 111 (see FIGS. 25A and 28A).

Here, a glass substrate is used as the substrate 100. As the first insulating layer 102, a silicon oxynitride layer containing more nitrogen than oxygen is formed with a thickness of 50 nm by a plasma CVD method, and then a silicon oxynitride layer containing more oxygen than nitrogen is formed with a thickness of 100 nm.

Next, a semiconductor layer with a thickness of greater than or equal to 10 nm and less than or equal to 150 nm, preferably greater than or equal to 30 nm and less than or equal to 100 nm, more preferably greater than or equal to 50 nm and less than or equal to 80 nm, is formed over the first insulating layer 102 by a plasma CVD method. Here, an amorphous silicon layer with a thickness of 66 nm is formed, and heated at a temperature of 500° C. for an hour, then at a temperature of 550° C. for four hours so as to remove hydrogen contained in the amorphous silicon layer. After that, the amorphous silicon is irradiated with laser light with the scan speed of 35 cm/sec so as to be crystallized, whereby a polysilicon layer is formed. Here, a continuous-wave (CW) laser (the second harmonic of $YVO_4$ (the wavelength 532 nm)) of LD excitation is used as a light source for laser light. Subsequently, after an oxide film formed on a surface of the polysilicon layer by laser light irradiation is removed, an oxide film is newly formed over the polysilicon layer with the use of hydrogen peroxide solution, and a resist is applied thereover. Then, the resist is exposed and developed through a photolithography process so as to form a mask. After that, boron (B) of $1\times10^{17}$ to $3\times10^{17}$ cm$^{-3}$ is doped into the polysilicon layer so as to control the threshold voltage of a thin film transistor to be formed later. Next, the polysilicon layer is etched with the use of the mask so as to form semiconductor layers 104, 106, and 108 formed of polysilicon. At this time, $SF_6$ and oxygen at a flow ratio of 4:15 are used as an etching gas.

Next, after the mask is removed, a silicon oxynitride layer containing more oxygen than nitrogen is formed with a thickness of 40 nm as the second insulating layer 111 by a plasma CVD method using silane and dinitrogen monoxide ($N_2O$) at a flow ratio of 1:800 as materials. Then, a resist is applied over the second insulating layer 111, and the resist is exposed and developed through a photolithography process so as to form a mask 114.

Subsequently, with the use of the mask 114, the second insulating layer 111 is etched by wet etching with an etchant which is a mixture of hydrofluoric acid, ammonium fluoride, and a surface active agent so as to form the third insulating layers 112.

It is to be noted that the third insulating layer 112 formed over the semiconductor layer 108 functions as a gate insulating film in the thin film transistor to be formed later. Furthermore, in a thin film transistor with a gate insulating film having a thin film thickness, the third insulating layers 112 covering end portions of the semiconductor layers 104, 106, and 108 can reduce a leak current generated in the semiconductor layer and a gate electrode.

Next, fourth insulating layers 116, 118, and 120 with a thickness of 1 to 10 nm, preferably 1 to 5 nm, are formed over the semiconductor layers 104, 106, and 108, respectively (see FIG. 25B).

Here, high density plasma treatment is performed on the semiconductor layers 104, 106, and 108 at a substrate temperature of 400°, under a pressure of 110 Pa, using argon, oxygen, and hydrogen, so as to oxidize the semiconductor layers 104, 106, and 108, whereby oxide layers are formed as the fourth insulating layers 116, 118, 120 over the semiconductor layers 104, 106, and 108, respectively. It is to be noted that a gas flow ratio at this time is argon:oxygen:hydrogen=180:1:1. Alternatively, as the fourth insulating layers 116, 118, and 120, silicon oxide layers or silicon nitride layers may be formed by a CVD method or a sputtering method; or oxidation treatment or nitridation treatment by high density plasma treatment may further be performed on the above-described layers formed by a CVD method or a sputtering method. Further alternatively, after oxidation treatment is performed on the semiconductor layers 104, 106, and 108 by high density plasma treatment, nitridation treatment may be performed by performing high density plasma treatment again. In this case, silicon oxide layers are formed being in contact with the semiconductor layers 104, 106, and 108, and nitrogen plasma treatment layers are formed on surfaces of or near the surfaces of the silicon oxide layers. The nitrogen plasma treatment layer has a structure in which nitrogen is contained at a rate of 20 to 50 atomic % at a depth of approximately 1 nm from the surface of the silicon oxide layer. In the nitrogen plasma treatment layer, silicon containing oxygen and nitrogen (silicon oxynitride) is formed.

In this embodiment, the fourth insulating layer 120 formed over the semiconductor layer 108 provided in the memory portion functions as a tunnel oxide film in a nonvolatile memory element to be formed later. Therefore, the thinner the thickness of the fourth insulating layer 120 is, the more easily a tunnel current flows and the higher speed operation of the memory can be achieved. In addition, as the thickness of the fourth insulating layer 120 gets thinner, charges can be accumulated in a charge accumulation layer to be formed later at a lower voltage, so that power consumption of the nonvolatile semiconductor memory device can be reduced. Therefore, the fourth insulating layers 116, 118, and 120 are preferably formed to be thin (for example, 10 nm or less).

Generally, a thermal oxidation method is known as a method for forming an insulating layer thinly over a semiconductor layer. However, in the case where a substrate having the melting point which is not high enough, such as a glass substrate, is used as the substrate 100, it is very difficult to form the fourth insulating layers 116, 118, and 120 by the thermal oxidation method. Furthermore, an insulating layer formed by a CVD method or a sputtering method has a problem in that the film quality is not sufficient since defects are included inside the layer and defects such as a pinhole are generated when the layer is formed thinly. Therefore, by forming the fourth insulating layers 116, 118, and 120 by high density plasma treatment as described in this embodiment, denser insulating layers than insulating layers formed by a CVD method or a sputtering method can be formed, in addition, in the case where an insulating layer is formed by a CVD method or a sputtering method, sometimes an end portion of a semiconductor layer is not covered sufficiently and leakage between the semiconductor layer and a conductive layer or the like to be formed later over the fourth insulating layer 120 occurs. However, here, an end portion of the semiconductor layer is covered by the third insulating layer 112 and the dense fourth insulating layers can be formed by further performing high density plasma treatment; therefore, end portions of the semiconductor layers 104, 106, and 108 can be sufficiently covered by the third insulating layer 112 and the fourth insulating layers 116, 118, and 120. As a result, high speed operation and a charge holding property of the memory can be improved.

Next, a charge accumulation layer 122 is formed so as to cover the first insulating layers 112 and the fourth insulating layers 116, 118, and 120 (see FIG. 25C). The charge accumulation layer 122 can be formed of an insulating layer having a defect that traps charges in the film, or an insulating layer containing a conductive particle or a semiconductor particle such as silicon. Here, a silicon oxynitride layer containing more nitrogen than oxygen is formed by a plasma CVD method using silane, ammonia, dinitrogen monoxide, and hydrogen. A flow ratio at this time is silane:ammonia:dinitrogen monoxide:hydrogen=1:10:2:40. The charge accumulation may be formed of a germanium compound such as germanium nitride, germanium nitride to which oxygen is added, germanium oxide to which nitrogen is added, germanium nitride to which oxygen and hydrogen are added, or germanium oxide to which nitrogen and hydrogen are added, instead of the silicon oxynitride layer. In the case where a germanium compound such as germanium nitride, germanium nitride to which oxygen is added, germanium oxide to which nitrogen is added, germanium nitride to which oxygen and hydrogen are added, or germanium oxide to which nitrogen and hydrogen are added is used for the charge accumulation layer, the charge accumulation layer can be formed by performing a plasma CVD method in an atmosphere containing a germanium element (for example, an atmosphere containing $GeH_4$ and $N_2$, $GeH_4$ and $NH_3$, $GeH_4$ and $N_2O$, or the like). Alternatively, a charge accumulation layer using germanium nitride can be formed by evaporating a sintered body obtained by heating germanium oxide in an ammonia atmosphere. Further, a germanium particle or a silicon germanium particle can be formed by performing a plasma CVD method in an atmosphere containing $GeH_4$ and $H_2$, in an atmosphere containing $GeH_4$ and $SiH_4$ and $H_2$, or the like.

Here, a silicon oxynitride layer is formed as the charge accumulation layer 122 in order to form a MONOS (Metal-Oxide-Nitride-Oxide Semiconductor) nonvolatile memory element. However, the charge accumulation layer 122 may be formed as follows: an amorphous silicon layer with a thickness of 50 nm is formed by a plasma CVD method, and then the amorphous silicon layer is irradiated with laser light so as to form a polysilicon layer. Alternatively, a tungsten layer with a thickness of 30 nm may be formed as the charge accumulation layer 122 by a sputtering method. Further alternatively, a germanium layer or a silicon germanium layer may be formed as the charge accumulation layer 122 by a plasma CVD method.

Next, the second insulating layers 116 and 118 and the charge accumulation layer 122 which are formed over the semiconductor layers 104 and 106, and the charge accumulation layer 122 which is formed over the semiconductor layer 108 are selectively removed so as to leave the second insulating layer 120 and the charge accumulation layer 122 which are formed over the semiconductor layer 108. Here, the semiconductor layer 108 formed in the memory portion is selectively covered by a resist 124, and the second insulating layers 116 and 118 and the charge accumulation layer 122 which are not covered by the resist 124 are selectively removed by etching (see FIG. 26A). It is to be noted that, in FIG. 26A, an example in which the charge accumulation layer 122 is etched to be selectively removed so that part of the charge accumulation layer 122 is left and forms a charge accumulation layer 126 is shown.

Subsequently, a fifth insulating layer 128 is formed so as to cover the semiconductor layers 104 and 106, the charge accumulation layer 126 formed over the semiconductor layer 108, and the semiconductor layer 108 (see FIG. 26B).

The fifth insulating layer 128 is formed as a single layer or stacked layer using an insulating material such as silicon oxide, silicon nitride, or silicon oxynitride by a CVD method, a sputtering method, or the like. Here, as the fifth insulating layer 128, a silicon oxynitride layer containing more oxygen than nitrogen is formed with a thickness of 1 to 20 nm by a plasma CVD method using silane and dinitrogen monoxide ($N_2O$) at a flow rate of 1:800 as materials.

The fifth insulating layer 128 formed over the semiconductor layer 108 functions as a control insulating layer in the nonvolatile memory element to be completed later, whereas the fifth insulating layer 128 formed over the semiconductor layers 104 and 106 functions as gate insulating films in transistors completed later.

Figure 28A:
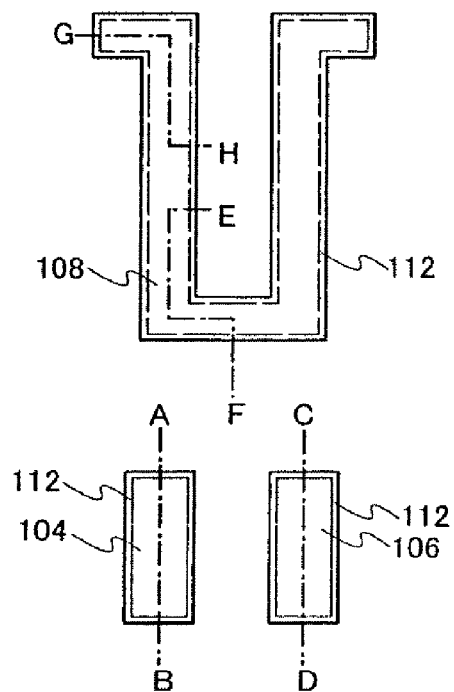
FIGS. 28A to 28D are top views for describing a manufacturing process of a semiconductor device of the present invention.
Figure 28B:
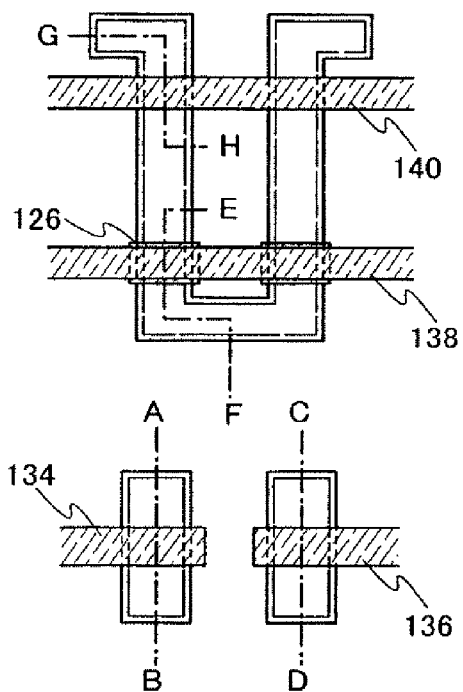
Figure 28C:
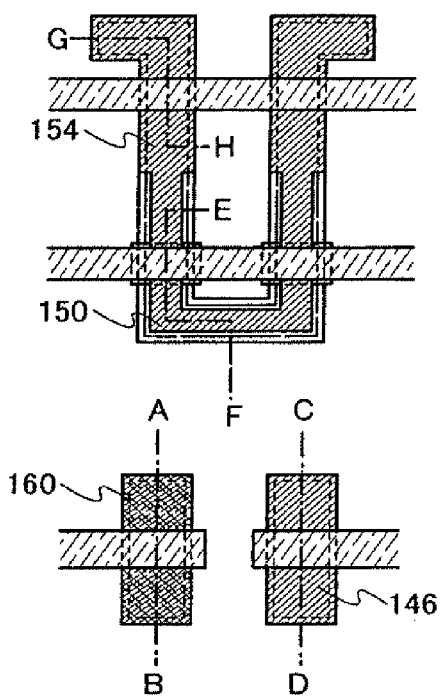
Figure 28D:
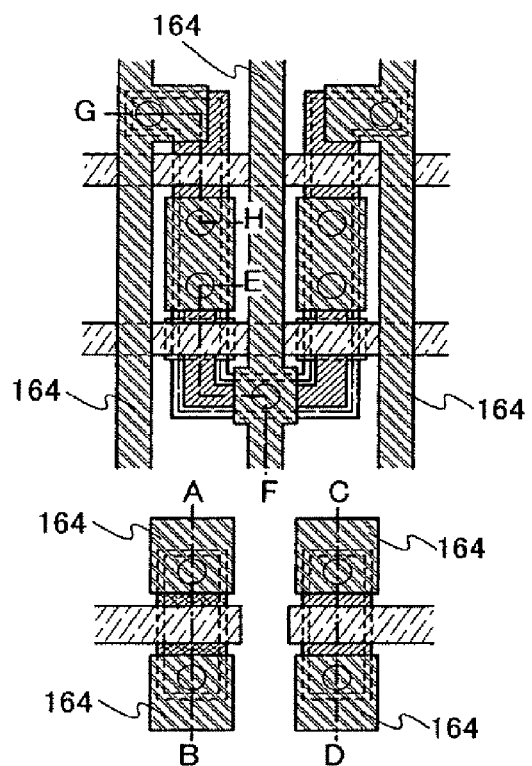

Subsequently, conductive layers 134, 136, 138, and 140 are formed with a thickness of greater than or equal to 100 nm and less than or equal to 1000 nm, preferably greater than or equal to 200 nm and less than or equal to 800 nm, and more preferably greater than or equal to 300 nm and less than or equal to 500 nm, so as to cover the fifth insulating layer 128 formed over the semiconductor layers 104, 106, and 108 (see FIGS. 26C and 28B). Here, as the conductive layers, a tantalum nitride layer with a thickness of 30 nm and a tungsten layer with a thickness of 270 nm are stacked, and then, the stacked conductive layers are selectively etched with the use of a mask, whereby the conductive layers 134, 136, 138, and 140 each formed of a 30 nm thick tantalum nitride layer and a 270 nm thick tungsten layer are formed. The conductive layer 138 formed over the semiconductor layer 108 provided in the memory portion functions as a control gate in the nonvolatile memory element completed later, and the conductive layers 134, 136, and 140 function as gate electrodes in transistors completed later.

Next, a mask 142 is selectively formed so as to cover the semiconductor layer 104 through a photolithography process, and an impurity element is introduced into the semiconductor layers 106 and 108, using the mask 142, the conductive layers 136, 138, and 140 as masks, whereby impurity regions are formed (see FIG. 27A). Here, phosphorus (P) is used as the impurity element. Here, phosphorus (P) is added to the semiconductor layers at a concentration of $10^{21}$ atoms/cm$^3$ at peak.

Figure 29A:
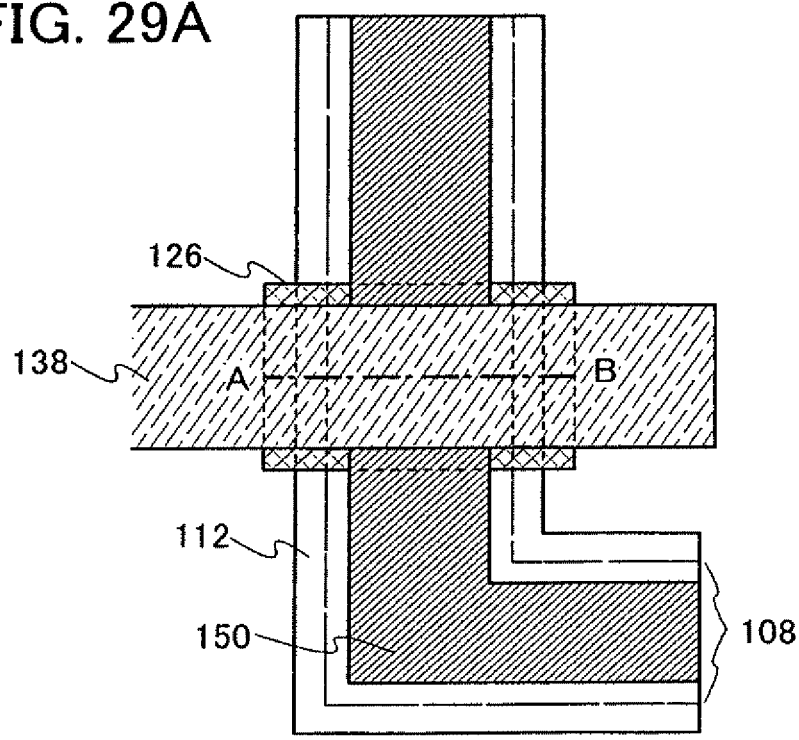
FIGS. 29A and 29B are a top view and a cross-sectional view for describing a main structure of a semiconductor device of the present invention.
Figure 29B:
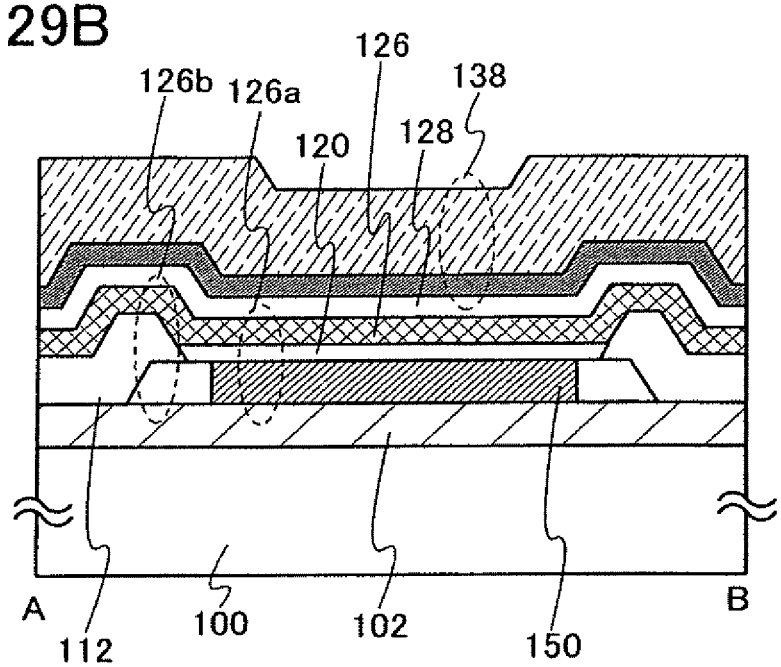

Here, enlarged views of a nonvolatile memory element is shown are FIGS. 29A and 29B. FIG. 29A is a top view of the nonvolatile memory element in the memory portion, and FIG. 29B is a cross-sectional view taken along a line A-B in FIG. 29A. As shown in HG 29B, it is preferable that an impurity be not added to regions in the semiconductor layer which are covered by the insulating layers 112. In a region 126a, an insulating layer which is formed between the charge accumulation layer 126 and the semiconductor layer and functions as a tunnel oxide film is the insulating layer 120. On the other hand, in a region 126b, an insulating layer which is formed between the charge accumulation layer 126 and the semiconductor layer and functions as a tunnel oxide film is the insulating layer 112. Accordingly, when the film thickness of the insulating layer functioning as a tunnel oxide film differs in the region 126b, injection and emission of electrons into the charge accumulation layer varies, and characteristics of the nonvolatile memory element deteriorates. Therefore, it is preferable that the impurity be not doped into the regions in the semiconductor layer in the memory portion, which are covered by the insulating layers covering the end portions of the semiconductor layer.

In FIG. 27A, by introduction of the impurity element, impurity regions 146 each forming a source region or drain region, and a channel formation region 144 are formed in the semiconductor layer 106. Further, in the semiconductor layer 108, impurity regions 150 each forming a source region or drain region, and a channel formation region 148 are formed. Further, in the semiconductor layer 108, impurity regions 154 each forming a source region or drain region, and a channel formation region 152 are formed.

Subsequently, a resist 156 is selectively formed so as to cover the semiconductor layers 106 and 108, and an impurity element is introduced into the semiconductor layer 104, using the resist 156 and the conductive layer 134 as masks, whereby impurity regions are formed (FIGS. 27B and 27C). As the impurity element, an impurity element imparting an n-type conductivity or an impurity element imparting a p-type conductivity is used. Here, an impurity element having a conductivity type which is different from that of the impurity element introduced into the semiconductor layers 106 and 108 in FIG. 27A (for example, boron (B)) is introduced. Here, boron (B)

is added to the semiconductor layer at a concentration of $10^{21}$ atoms/cm$^3$ at peak. As a result, impurity regions 160 each forming a source region or drain region, and a channel formation region 158 are formed.

Subsequently, an insulating layer 162 is formed so as to cover the third insulating layer 128 and the conductive layers 134, 136, 138, and 140, and the impurity in the semiconductor layer is activated by heating. Then, conductive layers 164 each being electrically connected to the impurity region 146, 150, 154, or 160 formed in the semiconductor layer 104, 106, or 108 are formed over the insulating layer 162 (see FIGS. 27C and 28D).

The insulating layer 162 can be provided using an insulating layer including oxygen or nitrogen such as silicon oxide, silicon nitride, or silicon oxynitride; a layer containing carbon such as DLC (diamond like carbon); or a single-layer or stacked-layer structure formed of an organic material such as epoxy, polyimide, polyamide, polyvinyl phenol, benzocyclobutene, or acrylic, or a siloxane material such as a siloxane resin. It is to be noted that the siloxane material corresponds to a material including an Si—O—Si bond. Siloxane has a skeleton structure containing a bond of silicon (Si) and oxygen (O). As a substituent, an organic group containing at least hydrogen (e.g., an alkyl group or an aromatic hydrocarbon group) can be used. As the substituent, a fluoro group may also be used. Alternatively, as the substituent, an organic group containing at least hydrogen and a fluoro group may be used.

Here, as the insulating layer 162, a silicon oxynitride layer containing more oxygen than nitrogen is formed with a thickness of 50 nm by a plasma CVD method using silane and dinitrogen monoxide; a silicon oxynitride layer containing more nitrogen than oxygen is formed with a thickness of 100 nm by a plasma CVD method using silane, ammonia, hydrogen, and dinitrogen monoxide; and a silicon oxynitride layer containing more oxygen than nitrogen is formed with a thickness of 600 nm by a plasma CVD method using silane and dinitrogen monoxide.

For activation of the impurity in the semiconductor layer, heating is performed in a nitrogen atmosphere, at a temperature of 550° C., for four hours, here.

The conductive layer 164 is formed as a single layer or stacked layer using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a component material containing the above element as its main component by a CVD method, a sputtering method, or the like. An alloy material containing aluminum as a main component corresponds to, for example, a material containing aluminum as a main component and nickel; or an alloy material containing aluminum as a main component, nickel, and one or both of carbon and silicon. The conductive layer 164 may employ, for example, a stacked structure of a barrier layer, an aluminum silicon (Al—Si) layer, and a barrier layer; or a stacked structure of a barrier layer, an aluminum silicon (Al—Si) layer, a titanium nitride (TiN) layer, and a barrier layer. It is to be noted that the barrier layer corresponds to a thin film formed of titanium, a nitride of titanium, molybdenum, or a nitride of molybdenum. Aluminum and aluminum silicon are optimal materials for forming the conductive layer 164 because their resistance values are low and they are inexpensive. Furthermore, when upper-layer and lower-layer barrier layers are provided, generation of a hillock in aluminum and aluminum silicon can be prevented. Furthermore, in the case where the barrier layer is formed of titanium which is a highly reducible element, even when a thin natural oxide film is formed over a crystalline semiconductor layer, the natural oxide film can be reduced and a favorable contact with the crystalline semiconductor layer can be obtained.

Here, the insulating layer is selectively etched by dry etching using CHF$_3$ and He so as to form openings, and parts of the impurity regions 146, 150, 154, and 160 in the semiconductor layers are exposed. Subsequently, a titanium layer with a thickness of 60 nm, a titanium nitride layer with a thickness of 40 nm, an aluminum layer with a thickness of 300 nm, and a layer with a thickness of 100 nm are stacked by a sputtering method. After that, etching is performed with the use of a mask formed through a photolithography process, whereby the conductive layers 164 are formed.

Although an example in which the insulating layer functioning as a control insulating film of the nonvolatile memory element formed in the memory portion and the gate insulating film of the thin film transistor formed in the logic portion are formed at the same time (FIG. 26B) is described in this embodiment, the present invention is not limited to this. For example, insulating layers may be formed as shown in FIGS. 30A to 30C. Specific description thereof is as follows.

First, after the state of FIG. 25C is formed similarly to the above, a third insulating layer 128 is formed over the charge accumulation layer 122 (see FIG. 30A). Subsequently, a resist 124 is selectively formed so as to cover the semiconductor layer 108, and then, the charge accumulation layer 122 and the third insulating layer 128 formed over the semiconductor layers 104, 106, and 108 are selectively removed, whereby a charge accumulation layer 126 and an insulating layer 127 are formed (FIG. 30B). After that, insulating layers 168 and 170 each functioning as a gate insulating film are formed over the surfaces of the exposed semiconductor layers 104 and 106, respectively (FIG. 30C). The insulating layers 168 and 170 may be provided using a high density plasma treatment as described in formation of the second insulating layers 116, 118, and 120, or may be formed by a CVD method or a sputtering method.

As shown in FIGS. 30A to 30 C, the gate insulating film of the thin film transistor formed in the logic portion and the control insulating film of the nonvolatile memory element formed in the memory portion can be formed with different thicknesses and materials.

Furthermore, in the process described in this embodiment, insulating layers 172 (also referred to as sidewalls) may be provided so as to be in contact with side surfaces of the conductive layers 134, 136, 138, and 140 each functioning as a gate electrode (see FIGS. 31A and 31B). By introduction of an impurity element into the semiconductor layers 104, 106, and 108 using the insulating layers 172, low concentration impurity regions 180, 174, 176, and 178 each functioning as an LDD region can be formed in the semiconductor layers 104, 106, and 108.

It is to be noted that the insulating layers 172 may be formed so as to be in contact with the semiconductor layer 104 directly (see FIG. 31A), or a structure in which other insulating layer or charge accumulation layer is formed under the insulating layers 172 may be employed (see FIG. 31B).

In addition, although a structure in which the charge accumulation layer 126 is selectively formed in a portion where the semiconductor layer 108 provided in the memory portion and the conductive layer 138 intersect with each other is described in this embodiment, the present invention is not limited to this. For example, a structure in which the charge accumulation layer 126 is provided over the entire surface of the semiconductor layer 108 may be employed. When the channel length and the channel width of the nonvolatile memory element are set to be L and W, respectively, the charge accumulation layer 126 may be provided so as to be larger than both the channel length L and the channel width W, may be provided so as to be larger than either one of the channel length L or the channel width W, or may be provided so as to be smaller than both the channel length L and the channel width W (a state where the charge accumulation layer 126 is always provided over the semiconductor layer 108).

This embodiment can be implemented in combination with the embodiment modes or the other embodiments described in this specification.

Embodiment 2

Figure 32:
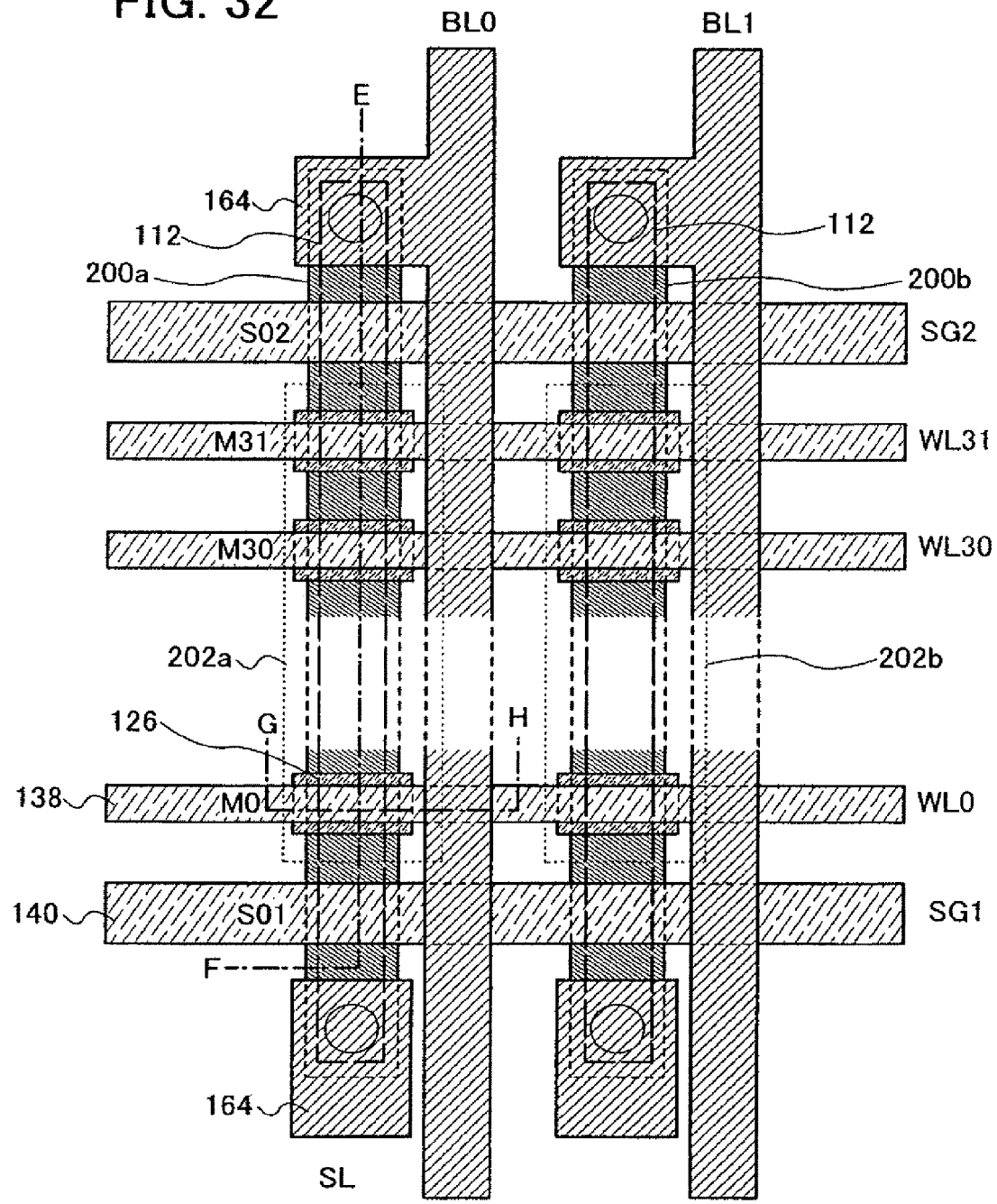
FIG. 32 is a view showing an example of a top view of a semiconductor device of the present invention.

In this embodiment, a case where a plurality of nonvolatile memory elements are provided over one island-shaped semiconductor layer in the structure described in the above-described Embodiment 1 will be described with reference to drawings. It is to be noted that the same elements as those in the above embodiment are indicated by the same reference numerals and the description thereof will be omitted. FIG. 32 is a top view, and FIGS. 33A and 33B show cross-sectional views taken along a line E-F and a line G-H in FIG. 32, respectively.

Figure 33A:
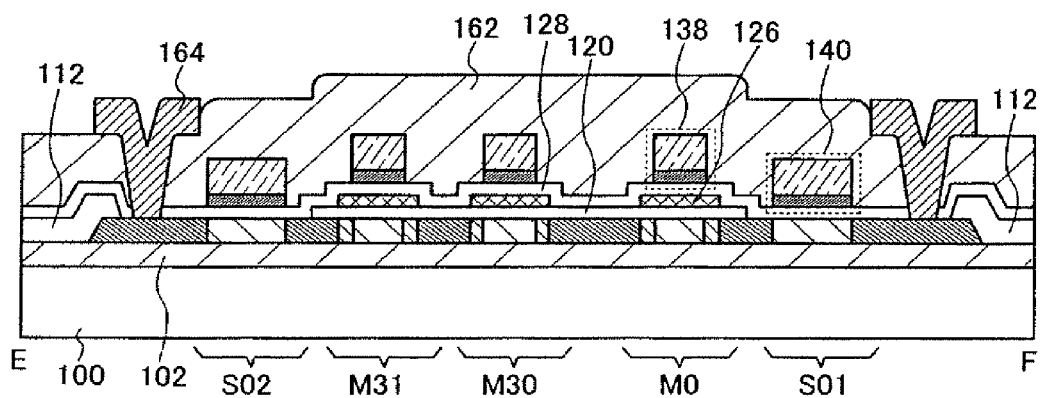
FIGS. 33A and 33B are cross-sectional views for describing an example of a semiconductor device of the present invention.
Figure 33B:
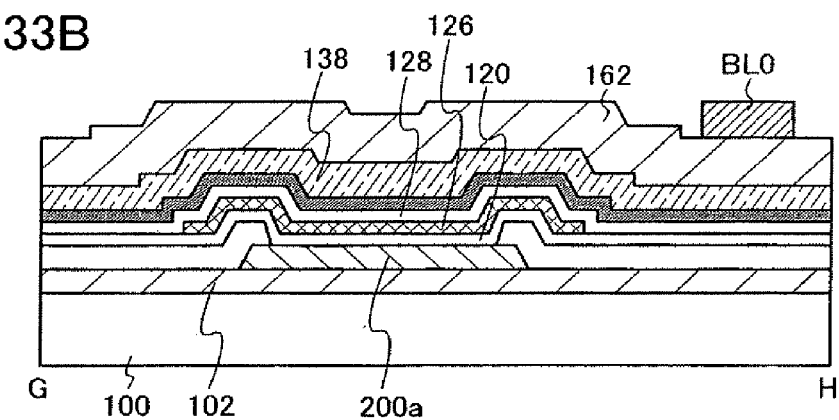

In a nonvolatile semiconductor memory device described in this embodiment, island-shaped semiconductor layers 200a and 200b electrically connected to bit lines BL0 and BL1 respectively are provided, and a plurality of nonvolatile memory elements are provided in each of the island-shaped semiconductor layers 200a and 200b (see FIGS. 32, 33A, and 33B). Specifically, in the semiconductor layer 200a, a NAND cell 202a which includes a plurality of nonvolatile memory elements M0, M30, and M31 is provided between selecting transistors S01 and S02. In addition, also in the semiconductor layer 200b, a NAND cell 202b which includes a plurality of nonvolatile memory elements is provided between selecting transistors. Furthermore, the semiconductor layer 200a and the semiconductor layer 200b are provided so as to be separated from each other, so that the NAND cell 202a and the NAND cell 202b which are adjacent to each other can be insulated from each other.

In addition, when a plurality of nonvolatile memory elements are provided in one island-shaped semiconductor layer, higher integration of the nonvolatile memory elements becomes possible, and a high-capacity nonvolatile semiconductor memory device can be formed.

This embodiment can be implemented in combination with the embodiment modes or the other embodiments described in this specification.

Embodiment 3

In this embodiment, application examples of a semiconductor device capable of data input and data output without contact will be described below with reference to drawings. A semiconductor device capable of data input and data output without contact is referred to as an RFID tag, an ID tag, an IC tag, an IC chip, an RF tag, a wireless tag, an electronic tag, or a wireless chip.

Figure 34:
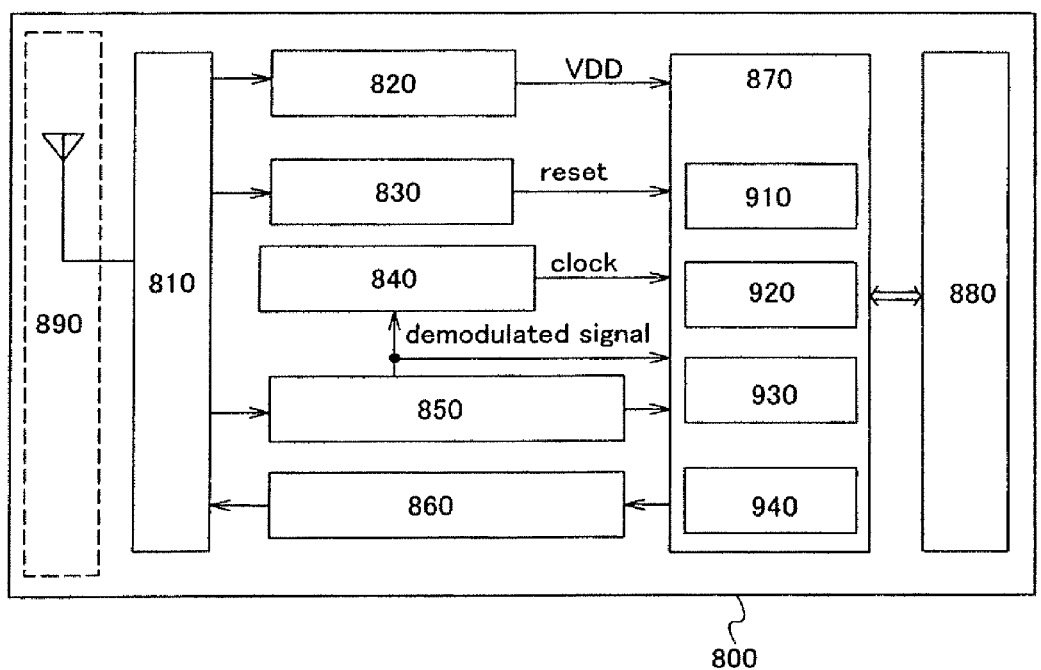
FIG. 34 is a diagram for describing an example of a semiconductor device of the present invention.

As shown in FIG. 34, a semiconductor device 800 has a function of communicating data without contact, and includes a high frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890. The high frequency circuit 810 is a circuit which receives a signal from the antenna 890. The high frequency circuit 810 outputs a signal received from the data modulation circuit 860 to the antenna 890. The power supply circuit 820 is a circuit which generates a power supply potential from a received signal. The reset circuit 830 is a circuit which generates a reset signal. The clock generation circuit 840 is a circuit which generates various clock signals based on the received signal input from the antenna 890. The data demodulation circuit 850 is a circuit which demodulates a received signal and outputs to the control circuit 870. The data modulation circuit 860 is a circuit which modulates a signal received from the control circuit 870. As the control circuit 870, a code extraction circuit 910, a code determination circuit 920, a CRC determination circuit 930, and an output unit circuit 940 are provided, for example. It is to be noted that the code extraction circuit 910 is a circuit which separately extracts a plurality of codes included in an instruction transmitted to the control circuit 870, the code determination circuit 920 is a circuit which compares an extracted code with a code corresponding to a reference so as to determine the content of an instruction, and the CRC determination circuit 930 is a circuit which detects the presence or absence of a transmission error or the like based on a determined code.

Next, an example of operation of the above-described semiconductor device will be described. First, a radio signal is received by the antenna 890. The radio signal is transmitted to the power supply circuit 820 via the high frequency circuit 810, and a high power supply potential (hereinafter referred to as VDD) is generated. The VDD is supplied to each circuit included in the semiconductor device 800. In addition, a signal transmitted to the data demodulation circuit 850 via the high frequency circuit 810 is demodulated (hereinafter referred to as a demodulated signal). Further, a signal transmitted through the reset circuit 830 via the high frequency circuit 810 and a demodulated signal transmitted through the clock generation circuit 840 are transmitted to the control circuit 870. The signals transmitted to the control circuit 870 is analyzed by the code extraction circuit 910, the code determination circuit 920, the CRC determination circuit 930, and the like. Then, in accordance with an analyzed signal, information of the semiconductor device stored in the memory circuit 880 is output. The output information of the semiconductor device is encoded through the output unit circuit 940. Furthermore, the encoded information of the semiconductor device 800 is transmitted by the antenna 890 as a radio signal through the data modulation circuit 860. It is to be noted that a low power supply potential (hereinafter, VSS) is common in the plurality of circuits included in the semiconductor device 800, and VSS can be set to GND. In addition, the high frequency circuit 810, the power supply circuit 820, the reset circuit 830, the clock generation circuit 840, the data demodulation circuit 850, the data modulation circuit 860, the control circuit 870 for controlling other circuits, the memory circuit 880, or the like can be formed using the above-described semiconductor element, typically the thin film transistor. Furthermore, the above-described nonvolatile semiconductor memory device can be applied to the memory circuit 880. Since the driving voltage can be lowered in the semiconductor device of the present invention, data communication without contact can be performed at a longer distance.

Thus, data of the semiconductor device can be read by transmitting a signal from a reader/writer to the semiconductor device 800 and receiving a signal transmitted from the semiconductor device 800 by the reader/writer.

In addition, the semiconductor device 800 may supply a power supply voltage to each circuit by an electromagnetic wave without a power source (battery) mounted, or the semiconductor device 800 may be provided with a power source (battery) mounted so as to supply a power supply voltage to each circuit by an electromagnetic wave or the power source (battery).

Next, an example of the structure of the above-described semiconductor device will be described with reference to drawings. A top view of the semiconductor device of this embodiment is shown in FIG. 35A, and a cross-sectional view taken along a line X-Y in FIG. 35A is shown in FIG. 35B.

Figure 35A:
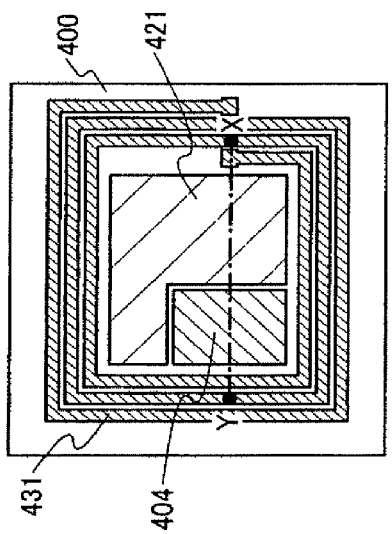
FIGS. 35A and 35B are a top view and a cross-sectional view for describing an example of a semiconductor device of the present invention.

As shown in FIG. 35A, the semiconductor device is provided with a memory circuit 404, an integrated circuit portion 421, and an antenna 431 over a substrate 400. It is to be noted that the memory circuit 404 shown in FIGS. 35A and 35B corresponds to the memory circuit 880 shown in FIG. 34; the integrated circuit portion 421 corresponds to the high frequency circuit 810, the power supply circuit 820, the reset circuit 830, the clock generation circuit 840, the data demodulation circuit 850, the data modulation circuit 860, and the control circuit 870 shown in FIG. 34; and the antenna 431 corresponds to the antenna 890 shown in FIG. 34. Furthermore, part of the memory circuit 404 and the integrated circuit portion 421 can be formed using the thin film transistor described in the above embodiment mode. In addition, part of the memory circuit 404 can be formed using the above nonvolatile memory device.

Figure 35B:
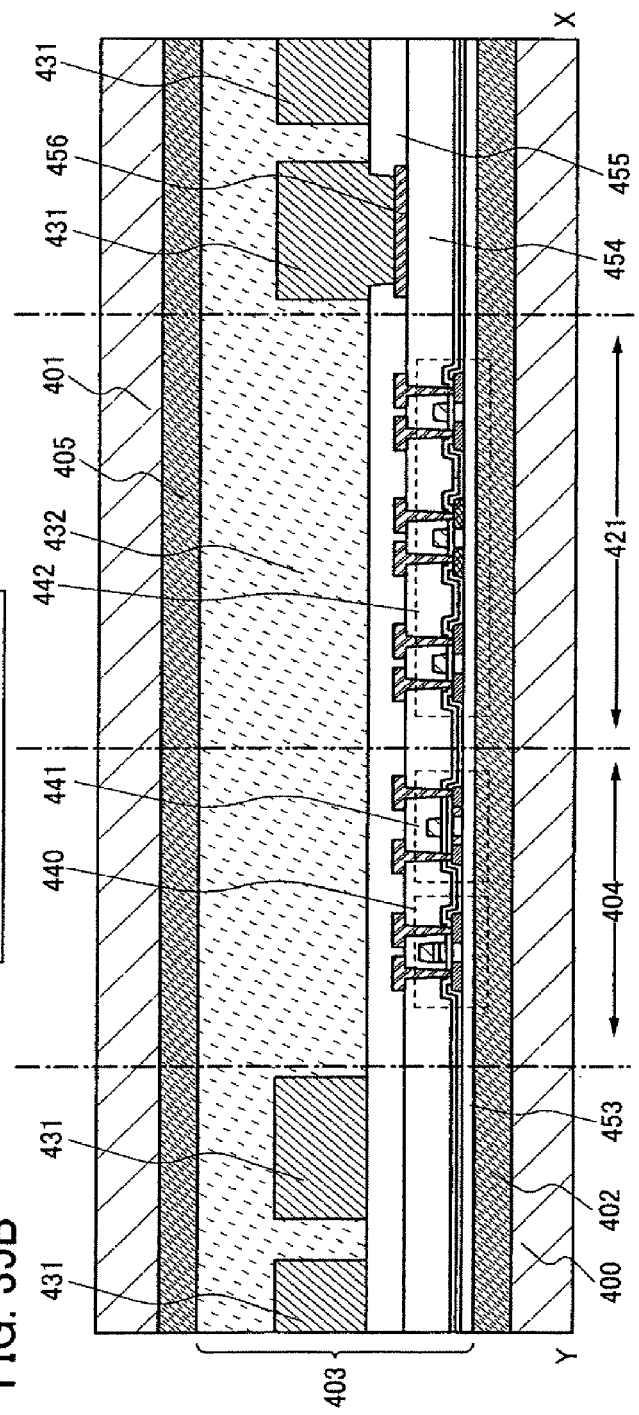

As shown in FIG. 35B, in the semiconductor device, an element formation layer 403 is interposed between the substrate 400 and a substrate 401. The element formation layer 403 is attached to the substrates 400 and 401 by adhesives 402 and 405, respectively. Further, an insulating layer 453, a nonvolatile memory element 440, transistors 441 and 442 are formed in the element formation layer 403. An insulating layer 454 is formed over the nonvolatile memory element 440 and the transistors 441 and 442, and a wiring is formed in the insulating layer 454. The antenna 431 is formed over the insulating layer 454 and the wiring, and an insulating layer 432 is formed over the antenna 431 and an insulating layer 455. The antenna 431 is connected to a wiring 456 formed over the insulating layer 454 in an opening formed in the insulating layer 455. The wiring 456 is connected to the high frequency circuit which is part of the integrated circuit. Although a case where the memory circuit 404 includes the nonvolatile memory element 440 and the transistor 441 and the integrated circuit portion 421 includes the transistor 442 is described here, a resistance element, a capacitor, a rectifier, or the like is also included.

In this embodiment, the insulating layer 455 is formed using a polyimide layer; a stack of a titanium film, an aluminum film, and a titanium film is used for the conductive layer; and a silver alloy layer formed by a printing method is used for the antenna 431. The insulating layer 432 is formed so as to reduce unevenness of the antenna 431, and it is preferable that the insulating layer 432 be formed through coating of a composition by a coating method, drying, and then baking. Here, an epoxy resin layer is used to form the insulating layer 432. PEN films are used for the substrates 400 and 401, and thermoplastic resins are used for the adhesives 402 and 405.

It is to be noted that the antenna may be provided so as to overlap the memory circuit, or may be provided in the periphery of the memory circuit so as not to overlap the memory circuit. In the case where the antenna overlaps the memory circuit, they may overlap each other entirely or partially. When the antenna portion and the memory circuit overlap each other, malfunction of the semiconductor device caused by noise or the like of a signal when the antenna communicates data, fluctuation in the electromotive force generated by electromagnetic induction, or the like can be reduced; whereby the reliability is improved. In addition, the size of the semiconductor device can be reduced.

Furthermore, as a signal transmission method in the above-described semiconductor device capable of data input and data output without contact, an electromagnetic coupling type, an electromagnetic induction type, or a micro-wave type can be used. The transmission method may be appropriately selected by a practitioner considering the use application, and the optimal antenna may be provided in accordance with the transmission method.

For example, in the case of employing the electromagnetic coupling type or the electromagnetic induction type (for example, 13.56 MHz) as the signal transmission method in the semiconductor device, a conductive layer functioning as the antenna is formed to be circular (for example, a loop antenna) or spiral (for example, a spiral antenna) since electromagnetic induction with change of magnetic field density is utilized.

In the case of applying the micro-wave type (for example, UHF zone (860 to 960 MHz), 2.45 GHz, or the like) as the signal transmission method in the semiconductor device, the shape of the conductive layer functioning as the antenna, such as the length, may be appropriately determined considering wavelength of electromagnetic wave which is employed for transmission of the signals. For example, the conductive layer functioning as the antenna can be formed to be a linear shape (for example, a dipole antenna), a flat shape (for example, a patch antenna), a ribbon-shape, or the like. In addition, the shape of the conductive layer functioning as the antenna is not limited to the linear shape; it may be provided to be a wave shape, a snake-shape, or a shape which combines them considering the wavelength of the electromagnetic wave.

The conductive layer functioning as the antenna is formed of a conductive material by using a CVD method, a sputtering method, a printing method such as a screen printing method or a gravure printing method, a droplet discharging method, a dispenser method, a plating method, or the like. The conductive material is formed with a single-layer structure or stacked-layer structure using an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a component material containing the above element as its main component.

For example, in the case of forming the conductive layer functioning as the antenna by using the screen printing method, it can be provided by selectively printing a conductive paste where a conductive particle having a particle size of several nm to several ten μm is dissolved or dispersed in an organic resin, and then drying and baking the paste. As the conductive particle, metal particles of one or more of silver (Ag), gold (Au), copper (Cu), nickel (Ni), platinum (Pt), palladium (Pd), tantalum (Ta), molybdenum (Mo), titanium (Ti), and the like, a fine particle of silver halide, or a dispersing nano particle can be employed. In addition, as the organic resin included in the conductive paste, one or a plurality of organic resins which are selected from organic resins functioning as a binder, a solvent, a dispersing agent, and a coating member of the metal particles can be used. Typically, an organic resin such as an epoxy resin or silicon resin can be given. In addition to the above-described materials, ceramic, ferrite, or the like may be applied to the antenna.

In addition, when the electromagnetic coupling type or the electromagnetic induction type is applied and a semiconductor device having the antenna is provided so as to be in contact with metal, a magnetic material having magnetic permeability is preferably provided between the semiconductor device and the metal. In the case where a semiconductor device having the antenna is provided so as to be in contact with metal, eddy-current flows to the metal along with change of the magnetic filed, and the communication range is decreased since the change of the magnetic field is weakened by demagnetizing field which is generated by the eddy-current. Therefore, by providing the material having the magnetic permeability between the semiconductor device and the metal, the eddy-current of the metal can be suppressed, and decrease of the communication range can be suppressed. It is to be noted that ferrite having high magnetic permeability and low high-frequency loss or a metal thin film can be employed as the magnetic material.

Although the semiconductor device in which the semiconductor element such as the transistor and the conductive layer functioning as the antenna are directly formed in the element formation layer is described in this embodiment, the present invention is not limited to this. For example, the semiconductor element and the conductive layer functioning as an antenna may be provided over different substrates and then the substrates may be attached to each other so that the semiconductor element and the conductive layer are electrically connected to each other.

By using the present invention, a highly reliable semiconductor device in which a leak current between the semiconductor layer and the gate electrode is suppressed can be manufactured.

Figure 36A:
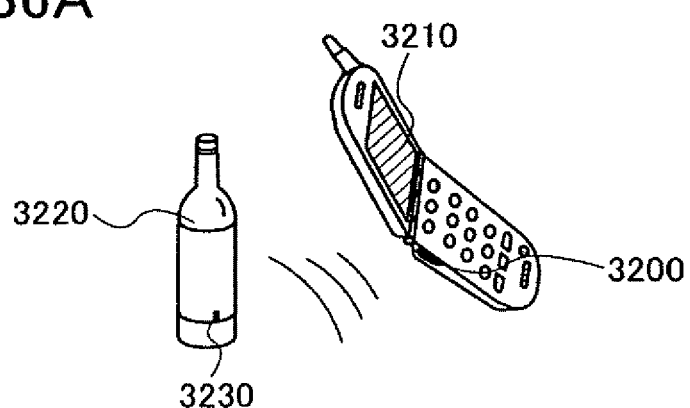
FIGS. 36A and 36B are views each showing an example of a usage pattern of a semiconductor device of the present invention.
Figure 36B:
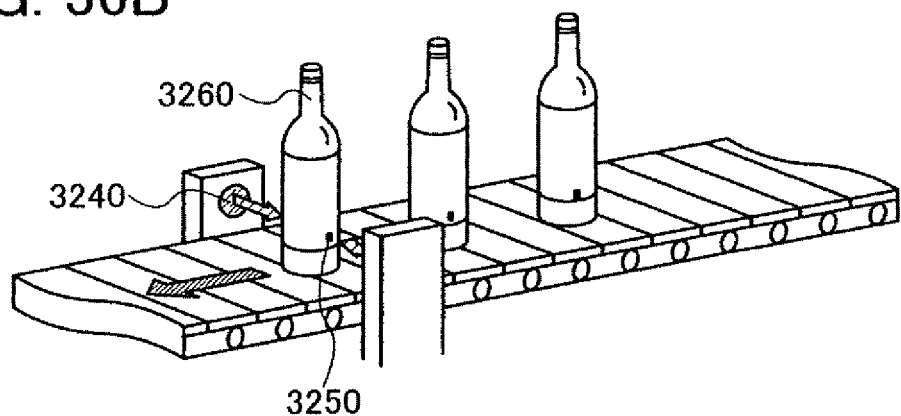

Next, an example of usage of a semiconductor device capable of data input and data output without contact will be described. A side surface of a portable terminal including a display portion 3210 is provided with a communicator (for example, a reader/writer) 3200, and a side surface of an article 3220 is provided with a semiconductor device 3230 (FIG. 36A). When the communicator (for example, the reader/writer) 3200 is held over the semiconductor device 3230 included in the article 3220, information on the article such as a raw material, the place of origin, an inspection result in each production process, the history of distribution, or an explanation of the article is displayed on the display portion 3210. Further, when a product 3260 is transported by a conveyor belt, the product 3260 can be inspected using a communicator (for example, a reader/writer) 3240 and a semiconductor device 3250 provided over the product 3260 (FIG. 36B). Thus, by utilizing the semiconductor device for a system, information can be acquired easily, and improvements in functionality and added value of the system can be achieved.

Furthermore, the nonvolatile semiconductor memory device of the present invention can be used in electronic devices with memories in all fields. As electronic devices to which the nonvolatile semiconductor memory device of the present invention is applied, video cameras, digital cameras, goggle type displays (head-mounted displays), navigation systems, sound reproducing devices (such as car audios or audio components), computers, game machines, mobile information terminals (such as mobile computers, mobile phones, mobile game machines, or electronic books), image reproducing devices equipped with a recording medium (specifically, a device for reproducing a recording medium such as DVD (digital versatile disk), which is equipped with a display for displaying the reproduced image), or the like are given, for example. Specific examples of the electronic devices are shown in FIGS. 37A to 37E.

Figure 37A:
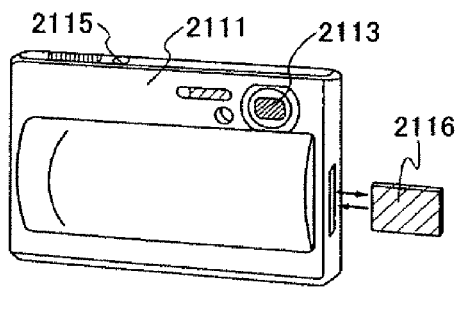
FIGS. 37A to 37E are views each showing an example of a usage pattern of a semiconductor device of the present invention.
Figure 37B:
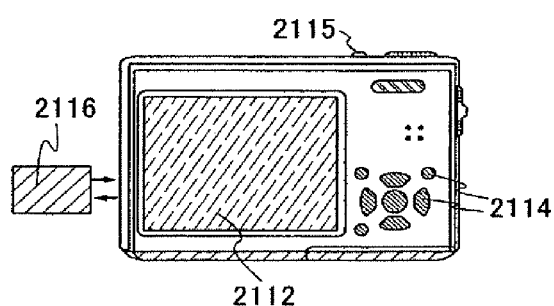

FIGS. 37A and 3713 each show a digital camera. FIG. 37B shows the back of the digital camera shown in FIG. 37A. This digital camera includes a chassis 2111, a display portion 2112, a lens 2113, operation keys 2114, a shutter 2115, and the like. In addition, the digital camera includes a removable nonvolatile memory 2116, and the memory 2116 stores data taken by the digital camera. A nonvolatile semiconductor memory device which is formed by using the present invention can be applied to the memory 2116.

Figure 37C:
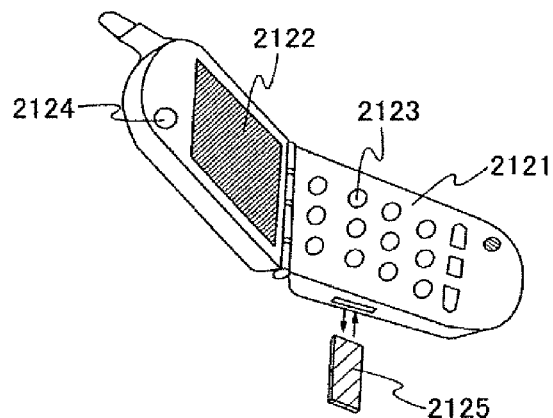

FIG. 37C shows a mobile phone, which is a representative example of a portable terminal. This mobile phone includes a chassis 2121, a display portion 2122, an operation key 2123, and the like. In addition, the mobile phone includes a removable nonvolatile memory 2125, and data such as telephone numbers of the mobile phone, images, music data, and the like can be stored in the memory 2125 and reproduced. A nonvolatile semiconductor memory device which is formed by using the present invention can be applied to the memory 2125.

Figure 37D:
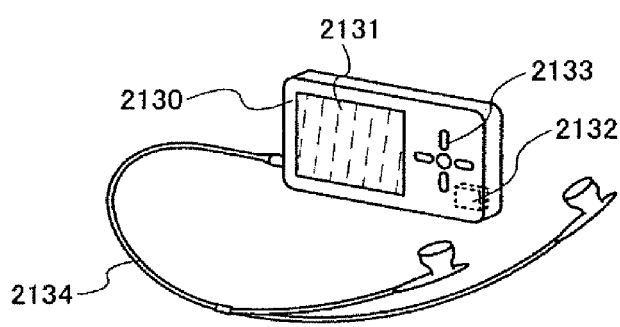

FIG. 37D shows a digital player, which is a representative example of an audio device. The digital player shown in FIG. 37D includes a main body 2130, a display portion 2131, a memory portion 2132, an operating portion 2133, an earphone 2134, and the like. A headphone or a wireless earphone may be used instead of the earphone 2134. For the memory portion 2132, a nonvolatile semiconductor memory device which is formed by using the present invention can be used. For example, by using a NAND nonvolatile memory with a storage capacity of 20 to 200 gigabytes (GB) and operating the operating portion 2133, images and sound (music) can be recorded and reproduced. It is to be noted that power consumption can be reduced by displaying white characters on a black background in the display portion 2131. This is particularly effective for a mobile audio device. The nonvolatile semiconductor memory device provided in the memory portion 2132 may be removable.

Figure 37E:
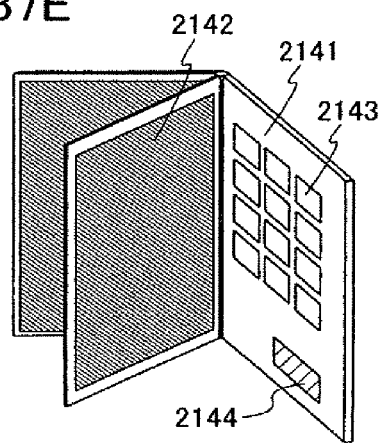

FIG. 37E shows an electronic book (also referred to as electronic paper). This electronic book includes a main body 2141, a display portion 2142, an operation key 2143, and a memory portion 2144. A modem may be incorporated in the main body 2141, or a structure in which information can be transmitted and received wirelessly may be employed. For the memory portion 2144, a nonvolatile semiconductor memory device which is formed by using the present invention can be used. For example, by using a NAND nonvolatile memory with a storage capacity of 20 to 200 gigabytes (GB) and operating the operating key 2143, images and sound (music) can be recorded and reproduced. The nonvolatile semiconductor memory device provided in the memory portion 2144 may be removable.

As described above, an application range of the nonvolatile semiconductor memory device of the present invention is extremely wide, and it can be used for electronic devices in every field as long as the electronic device includes a memory.

Embodiment 4

In this embodiment, results of simulating, by calculations, the optimal thickness of the second insulating layer 36 in the semiconductor element in which a leak current can be suppressed as described in Embodiment Mode 1 will be described. In this embodiment, a thin film transistor was used as a semiconductor element.

First, the results of simulating the optimal thickness of the second insulating layer 36 in the thin film transistor will be presented. For the calculations, on a discretization mesh ("Devise-3D" formed by Mesh), device equation ((1) continuity equation of carriers, (2) Poisson equation) was solved by using an iteration method. For the calculations, "Dessis-3D" produced by Nihon Synopsys Co., Ltd was used.

Figure 38A:
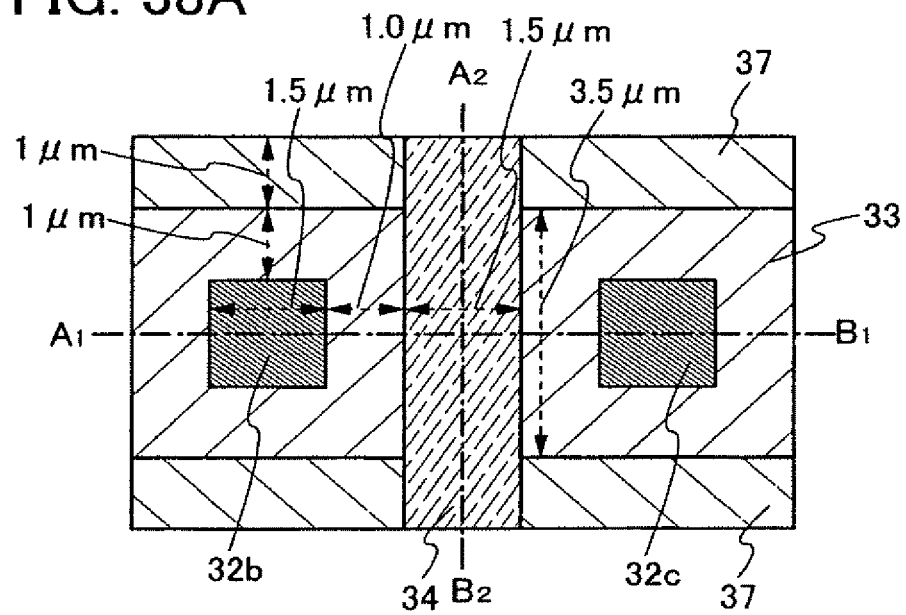
FIGS. 38A to 38C are views showing a structure of a thin film transistor used for calculations.
Figure 38B:
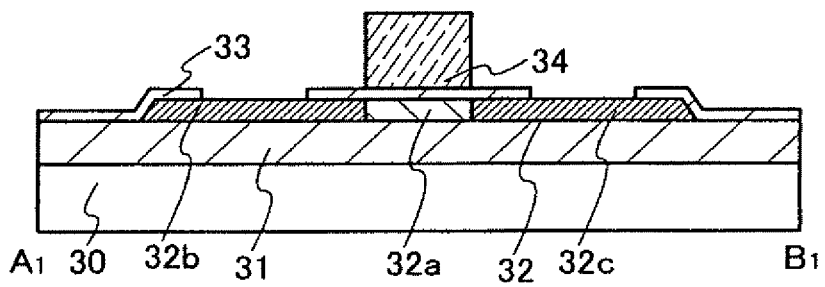
Figure 38C:
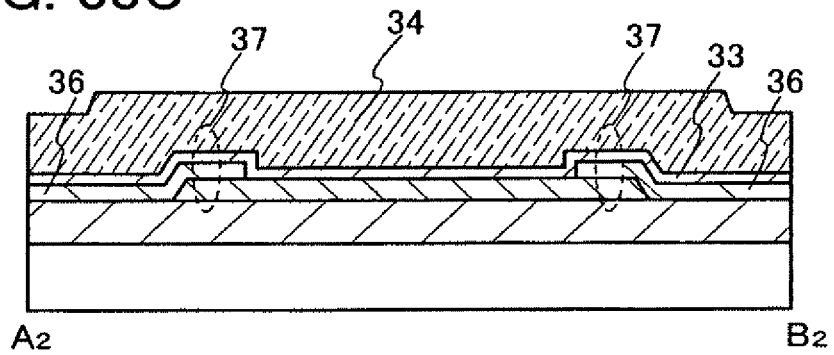

The structure of the p-channel thin film transistor which was used for the calculations is shown in FIGS. 38A to 38C. FIG. 38A is a top view of the thin film transistor. The channel width and the channel length of the thin film transistor were 3.5 μm and 1.5 μm, respectively. The width of a region (hereinafter, referred to as a FOx region 37) where a semiconductor layer, an insulating layer 33 (hereinafter, referred to as a first insulating layer 33) functioning as a gate insulating film, and an insulating layer 36 (hereinafter, referred to as a second insulating layer 36) covering an end portion of the semiconductor layer overlap one another was 1 μm; distance between a conductive layer 34 functioning as a gate electrode and an opening was 1 μm; and distance between the opening and the FOx region 37 was 1 μm. Furthermore, in the openings, that is, impurity regions 32b and 32c each functioning as a source region or drain region, were doped with boron. The activation rate of boron was 10%, the sheet resistance was 500Ω, and the concentration of boron was $4.87 \times 10^{19}/cm^3$.

FIG. 38B is a cross-sectional view taken along a line A1-B1 in FIG. 38A, and FIG. 38C is a cross-sectional view taken along a line A2-B2 in FIG. 38A. The thickness of the semiconductor layer was 66 nm, the thickness of the first insulating layer 33 was 20 nm, and the thickness of the conductive layer 34 functioning as a gate electrode was 400 nm. Under this condition, current-voltage characteristics of the thin film transistor when the thickness of the second insulating layer 36 was set to be 0 nm, 20 nm, 40 nm, 60 nm, 70 nm, 80 nm, and 100 nm were simulated by calculations. The results thereof are shown in FIG. 39. In FIG. 39, x marks indicate current-voltage characteristics when the film thickness of the second insulating layer 36 was 0 nm, black triangle marks indicate current-voltage characteristics when the film thickness of the second insulating layer 36 was 20 nm, black lozenge marks indicate current-voltage characteristics when the film thickness of the second insulating layer 36 was 40 nm, black circle marks indicate current-voltage characteristics when the film thickness of the second insulating layer 36 was 60 nm, black square marks indicate current-voltage characteristics when the film thickness of the second insulating layer 36 was 70 nm, white circle marks indicate current-voltage characteristics when the film thickness of the second insulating layer 36 was 80 nm, and white square marks indicate current-voltage characteristics when the film thickness of the second insulating layer 36 was 100 nm.

According to FIG. 39, it was found that a kink is generated when the film thickness of the second insulating layer 36 is increased.

Here, the cause of generation of the kink in the current-voltage characteristics will be explained below. The region (the FOx region 37) where the semiconductor layer, the first insulating layer 33, and the second insulating layer 36 overlap one another becomes a parasitic MOS transistor constituted by the semiconductor layer 32, the first insulating layer 33, the second insulating layer 36, and the conductive layer 34 functioning as a gate electrode. In the parasitic MOS transistor, the film thickness of a first insulating layer functioning as a gate insulating film (here, sum of the thicknesses of the first insulating layer 33 and the second insulating layer 36) becomes thick. In addition, the channel length of the parasitic MOS transistor is short. Accordingly, a current flows in the parasitic MOS transistor with a low threshold (Vth) due to a short channel effect. When the current-voltage characteristics are combined with the current-voltage characteristics of the regular thin film transistor (the thin film transistor of which the insulating layer functioning as a gate insulating film is only the first insulating layer 33), the kink is formed.

Next, the film thickness of the second insulating layer 36 with which the kink starts to be generated in the current-voltage characteristics of the thin film transistor was simulated by calculation. Here, inclinations (Δ log(Id)/Δ log Vg) of the curves showing the current-voltage characteristics in a range 49 where the voltage is from −1.6 to −0.8 V are shown in FIG. 40. It can be said that the curves shown in FIG. 39, of which signs of the values obtained by first-order differentiation of the inclinations (that is, the values obtained by second-order differentiation of the curves showing the current-voltage characteristics) are changed (here, changed from a positive value to a negative value), have kinks.

Here, as shown in FIG. 40, when the thickness of the second insulating layer 36 was 80 nm and when the thickness of the second insulating layer 36 was 100 nm, the values obtained by second-order differentiation of the curves showing the current-voltage characteristics were changed from positive values to negative values. Accordingly, it was found that a kink is not generated in the current-voltage characteristics when the thickness of the second insulating layer 36 is 70 nm or less.

Figure 41A:
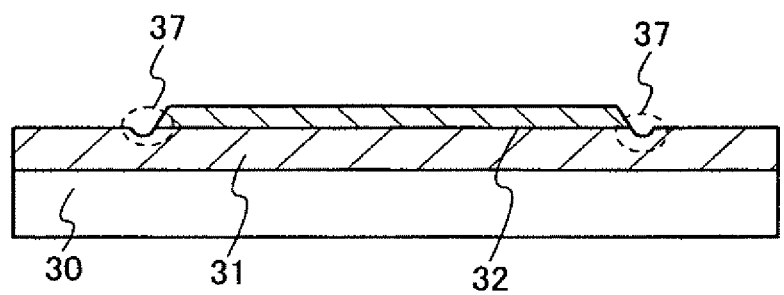
FIGS. 41A and 41B are cross-sectional views for describing an example of a semiconductor device of the present invention.
Figure 41B:
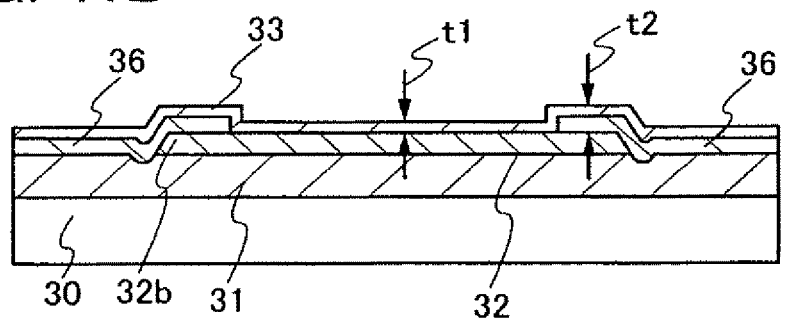

Furthermore, there is a step of removing an oxide layer formed over a surface of the semiconductor layer 32, before the first insulating layer 33 is formed over the semiconductor layer 32. The oxide layer formed over the surface of the semiconductor layer 32 is a natural oxide film that is formed when the semiconductor layer 32 comes into contact with oxygen in the air and is oxidized. When the oxide layer is removed, an insulating layer 31 that is formed as a base film for the semiconductor layer 32 is also removed and a depression 37 is formed, as shown in FIG. 41A. After that, when the first insulating layer 33 is formed, unevenness of the semiconductor layer 32 and the depression 37 is not fully covered and the first insulating layer 33 is partially cut off, which is a problem. As a gate electrode is formed over the first insulating layer 33 like this, a leak current is generated between the semiconductor layer 32 and the gate electrode layer.

Because of this, the thickness of the second insulating layer 36 needs to be thick enough to cover the depression of the insulating layer 31. Since the depression is approximately 5 nm deep, it is preferable that the thickness of the second insulating layer 36 be 5 nm or more.

Because of the above reasons, it is preferable that the film thickness of the second insulating layer 36 be greater than or equal to 5 nm and less than or equal to 70 nm with which a leak current of the thin film transistor can be suppressed and the current-voltage characteristics can be maintained. It is to be noted that the film thickness of the first insulating layer 33 at this time is 20 nm.

Furthermore, insulating layers with different thicknesses are formed over the semiconductor layer 32; and the thickness of a region with a thin film thickness (that is, a region where the first insulating layer 33 is formed) is set to be t1, and the thickness of a region with a thick film thickness (that is, a region where the first insulating layer 33 and the second insulating layer 36 are formed) is set to be t2. At this time, in accordance with the results of calculations of thicknesses of the first insulating layer 33 and the second insulating layer 36 when a kink is not generated in the current-voltage characteristics, it is preferable that the thickness t2 of the region with a thick film thickness be greater than or equal to 1.2 and less than or equal to 4.5 times of t1.

Furthermore, in accordance with the results of the above calculations, it is preferable that the thickness of the insulating layer with a thin film thickness (that is, the first insulating layer 33) over the semiconductor layer 32 be greater than or equal to 3 nm and less than or equal to 30 nm, and the thickness of the insulating layer with a thick film thickness (that is, a stack of the first insulating layer 33 and the second insulating layer 36) over the semiconductor layer 32 be greater than or equal to 3.6 nm and less than or equal to 135 nm, more preferably greater than or equal to 5 nm and less than or equal to 135 nm. When the thickness of the first insulating layer 33 is less than 3 nm, variation in thickness is generated and a leak current is generated in the semiconductor layer 32 and the gate electrode. On the other hand, when the thickness of the first insulating layer 33 is greater than 30 nm, it is difficult to manufacture a thin film transistor capable of high speed operation. The channel length of the thin film transistor at this time is 0.1 to 3 µm, preferably 0.1 to 1.5 µm. In addition, the S value of the thin film transistor is 50 to 120 mV/dec, preferably 60 to 100 mV/dec. With a structure like this, a thin film transistor capable of high speed operation in which a leak current is suppressed can be manufactured.

Embodiment 5

Next, measurement results of current-voltage characteristics of an n-channel thin film transistor and p-channel thin film transistor each having the second insulating layer 36 with a thickness of 50 nm or 150 nm will be described below.

First, a manufacturing process of a thin film transistor will be explained with reference to FIGS. 4A to 4F. An insulating layer 31 functioning as a base film was formed over a substrate 30, and a semiconductor layer 32 was formed over the insulating layer 31. As the substrate, AN 100 with a thickness of 0.7 mm (manufactured by ASAHI GLASS CO., LTD) was used. As the insulating layer 31, a silicon nitride oxide layer with a thickness of 50 nm was formed by a plasma CVD method, and then a silicon oxynitride layer with a thickness of 100 nm was formed. As the semiconductor layer 32, a crystalline silicon layer was formed in the following way: an amorphous silicon layer with a thickness of 66 nm was formed by a plasma CVD method, the amorphous silicon layer was heated in a furnace at a temperature of 500° C. for an hour so that hydrogen therein was removed, and then the amorphous silicon layer was irradiated with laser light. As for the condition under which the laser light irradiation was performed, second harmonic of a pulsed Nd:YVO$_4$ laser was used as a laser oscillator. Subsequently, the crystalline silicon layer was selectively etched with the use of a resist mask formed through a photolithography process, whereby the semiconductor layer 32 was formed.

Next, a silicon oxynitride layer with a thickness of 50 nm or 150 nm was formed as an insulating layer 40 over the semiconductor layer 32 by a plasma CVD method, and after that, the silicon oxynitride layer was selectively etched with the use of a resist mask formed through a photolithography process, whereby a second insulating layer 36 was formed.

Next, a first insulating layer 33 was formed over the semiconductor layer 32 and the second insulating layer 36. Here, a silicon oxynitride layer with a thickness of 20 nm was formed as the first insulating layer 33 by a plasma CVD method.

Next, a conductive layer 34 functioning as a gate electrode was formed. Here, the conductive layer 34 functioning as a gate electrode was formed in the following way: a tantalum nitride layer with a thickness of 30 nm was formed by a sputtering method, a tungsten layer with a thickness of 170 nm or 370 nm was formed, and the tantalum nitride layer and the tungsten layer were selectively etched with the use of a resist mask formed through a photolithography process. It is to be noted that the gate electrode to be included in the n-channel thin film transistor later is a stack of the tantalum nitride layer with a thickness of 30 nm and the tungsten layer with a thickness of 370 nm, and the gate electrode to be included in the p-channel thin film transistor later is a stack of the tantalum nitride layer with a thickness of 30 nm and the tungsten layer with a thickness of 170 nm.

Next, an impurity was added to the semiconductor layer 32 using the conductive layer 34 functioning as a gate electrode as a mask, whereby a source region and a drain region were formed. Here, phosphorus was doped into the semiconductor layer to be included in the n-channel thin film transistor later by an ion doping method. As for the condition of the ion doping method at this time, the accelerating voltage was 20 kV, and the dose amount was $3.4 \times 10^{15}/cm^2$. In addition, boron was doped into the semiconductor layer to be included in the p-channel thin film transistor later by an ion doping method. As for the condition of the ion doping method at this time, the accelerating voltage was 15 kV, and the dose amount was $3.4 \times 10^{15}/cm^2$.

Next, an interlayer insulating layer was formed over the first insulating layer 33 and the conductive layer 34 functioning as a gate electrode. As the interlayer insulating layer, a silicon nitride oxide layer with a thickness of 100 nm was formed by a plasma CVD method, and then a silicon oxynitride layer with a thickness of 600 nm was formed. After that, the semiconductor layer 32 was hydrogenated by heating.

Next, the interlayer insulating layer and the first insulating layer 33 were etched so as to form openings, and the source region and the drain region in the semiconductor layer 32 each were partially exposed. Subsequently, a titanium layer with a thickness of 100 nm, an aluminum layer with a thickness of 300 nm, and a titanium layer with a thickness of 100 nm were stacked by a sputtering method. After that, selective etching was performed by with the use of a mask that was formed through a photolithography process, whereby a wiring in which the titanium layer, the aluminum layer, and the titanium layer were stacked was formed. Through the above-described process, the n-channel thin film transistor and the p-channel thin film transistor each having the second insulating layer 36 with a thickness of 50 nm, and the n-channel thin film transistor and the p-channel thin film transistor each having the second insulating layer 36 with a thickness of 150 nm were formed.

Figure 42A:
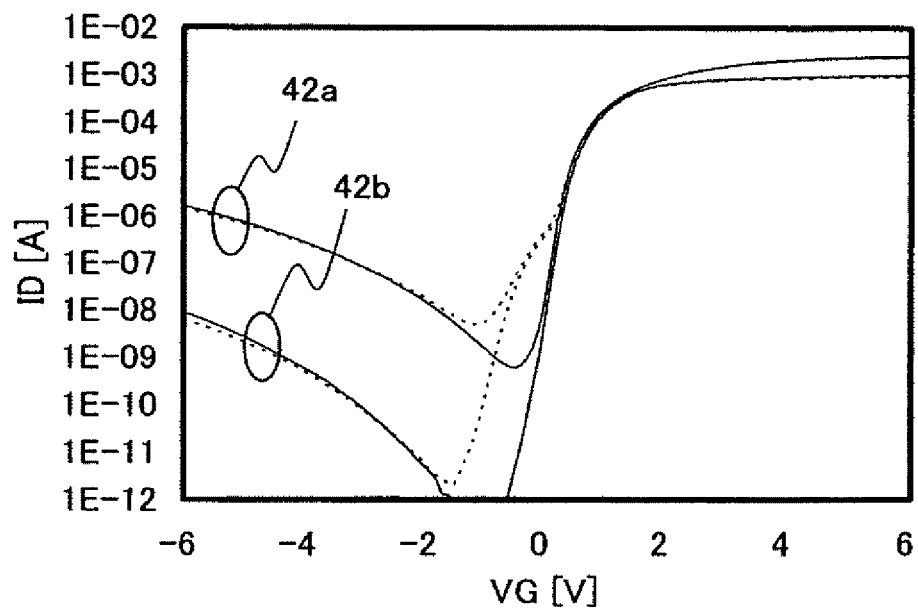
FIGS. 42A and 42B are graphs showing current-voltage characteristics of thin film transistors of semiconductor devices of the present invention.

Current-voltage characteristics of the n-channel thin film transistors are shown in FIG. 42A. A solid line shows measurement results of the thin film transistor having the second insulating layer 36 with a thickness of 50 nm, and a dashed line shows measurement results of the thin film transistor having the second insulating layer 36 with a thickness of 150 nm. Furthermore, the solid line and the dashed line 42a show measurement results of a case where Vd (drain voltage) was 1V, and the solid line and the dashed line 42b show measurement results of a case where Vd was 3V.

As shown in FIG. 42A, when the thickness of the second insulating layer 36 is 50 nm, there is no kink in the curves showing the current-voltage characteristics of the thin film transistor; whereas when the thickness of the second insulating layer 36 is 150 nm, a kink is observed in the curves showing the current-voltage characteristics of the thin film transistor.

Figure 42B:
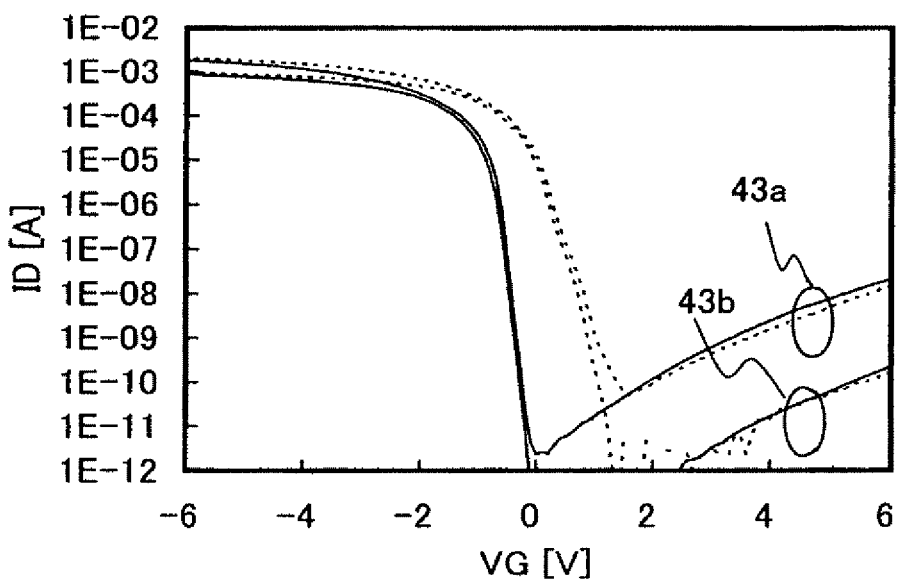

Current-voltage characteristics of the p-channel thin film transistors are shown in FIG. 42B. A solid line shows measurement results of the thin film transistor having the second insulating layer 36 with a thickness of 50 nm, and a dashed line shows measurement results of the thin film transistor having the second insulating layer 36 with a thickness of 150 nm. Furthermore, the solid line and the dashed line 43a show measurement results of a case where Vd (drain voltage) was −1V, and the solid line and the dashed line 43b show measurement results of a case where Vd was −3V.

As shown in FIG. 42B, when the thickness of the second insulating layer 36 is 50 nm, there is no kink in the curves showing the current-voltage characteristics of the thin film transistor; whereas when the thickness of the second insulating layer 36 is 150 nm, a kink is slightly observed in the curves showing the current-voltage characteristics of the thin film transistor.

Accordingly, when the thickness of an insulating layer covering an end portion of a semiconductor layer (a second insulating layer) is made in a range obtained by the calculations in Embodiment 4, a thin film transistor having current-voltage characteristics without a kink can be manufactured.

This application is based on Japanese Patent Application serial no. 2006-126670 filed in Japan Patent Office on 28, Apr., 2006 and Japanese Patent Application serial no. 2006-254205 filed in Japan Patent Office on 20, Sep., 2006, the entire contents of which are hereby incorporated by reference.

What is claimed is:

1. A manufacturing method of a semiconductor device, comprising:
    forming a semiconductor layer on an insulating surface;
    forming a mask over the semiconductor layer;
    forming a first insulating layer over the semiconductor layer and the mask;
    partially removing the mask and the first insulating layer;
    removing a remaining part of the mask to form a second insulating layer which covers an end portion of the semiconductor layer after partially removing the mask and the first insulating layer;
    forming a third insulating layer functioning as a gate insulating film over the second insulating layer and an exposed portion of the semiconductor layer; and
    forming a conductive layer functioning as a gate electrode over the third insulating layer.

2. A manufacturing method of a semiconductor device, comprising:
    forming a semiconductor layer on an insulating surface;
    forming a first insulating layer functioning as a gate insulating film over the semiconductor layer;
    forming a mask over the first insulating layer;
    forming a second insulating layer over the first insulating layer and the mask;
    partially removing the mask and the first insulating layer; and
    removing a remaining part of the mask to form a third insulating layer which covers an end portion of the semiconductor layer.

3. A manufacturing method of a semiconductor device, comprising:
    forming a semiconductor layer over a substrate having a light-transmitting property;
    forming a first insulating layer over the semiconductor layer;
    applying a resist over the first insulating layer;
    emitting light to the resist through the substrate having the light-transmitting property using the semiconductor layer as a mask to expose the resist after applying the resist over the first insulating layer;
    developing the exposed resist to form a mask over the first insulating layer;
    etching the first insulating layer with the use of the mask to form a second insulating layer which covers an end portion of the semiconductor layer;
    forming a third insulating layer functioning as a gate insulating film over the second insulating layer and an exposed portion of the semiconductor layer; and
    forming a conductive layer functioning as a gate electrode over the third insulating layer.

4. A method for manufacturing a semiconductor device, comprising:
    forming a semiconductor layer over a substrate having a light-transmitting property;
    forming a first insulating layer functioning as a gate insulating film over the semiconductor layer;
    forming a second insulating layer over the first insulating layer;
    applying a resist over the second insulating layer;
    emitting light to the resist through the substrate having a light-transmitting property using the semiconductor layer as a mask to expose the resist after applying the resist;
    developing the exposed resist to form a mask over the second insulating layer;
    etching the second insulating layer with the use of the mask to form a third insulating layer which covers an end portion of the semiconductor layer; and
    forming a conductive layer functioning as a gate electrode over the first insulating layer.

5. A manufacturing method of a semiconductor device, comprising:
    forming a first semiconductor layer on an insulating surface;
    forming a mask over the first semiconductor layer;
    etching the first semiconductor layer with the use of the mask to form a second semiconductor layer;
    performing liquid repellent treatment on a surface of the mask;
    forming a first insulating layer which partially covers the second semiconductor layer after performing the liquid repellent treatment;
    removing the mask;
    forming a second insulating layer functioning as a gate insulating film which covers the first insulating layer and the semiconductor layer after removing the mask; and
    forming a conductive layer functioning as a gate electrode over the second insulating layer.

6. A manufacturing method of a semiconductor device, comprising:
    forming a first semiconductor layer on an insulating surface;
    forming a first insulating layer functioning as a gate insulating film over the first semiconductor layer;
    forming a mask over the first insulating layer;
    etching the first insulating layer and the first semiconductor layer with the use of the mask to form a second insulating layer and a second semiconductor layer;
    performing liquid repellent treatment on the surface of the mask;
    forming a third insulating layer which partially covers the second semiconductor layer after performing the liquid repellent treatment;
    removing the mask; and
    forming a conductive layer functioning as a gate electrode over the second insulating layer after removing the mask.

* * * * *